US007436697B2

(12) United States Patent
Murakami et al.

(10) Patent No.: US 7,436,697 B2
(45) Date of Patent: Oct. 14, 2008

(54) MEMORY CELL, MEMORY USING THE MEMORY CELL, MEMORY CELL MANUFACTURING METHOD, AND MEMORY RECORDING/READING METHOD

(75) Inventors: Motoyoshi Murakami, Hirakata (JP); Yasuhiro Gotoh, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 154 days.

(21) Appl. No.: 10/551,500

(22) PCT Filed: Mar. 31, 2004

(86) PCT No.: PCT/JP2004/004650

§ 371 (c)(1),
(2), (4) Date: Jul. 24, 2006

(87) PCT Pub. No.: WO2004/088754

PCT Pub. Date: Oct. 14, 2004

(65) Prior Publication Data

US 2006/0256609 A1 Nov. 16, 2006

(30) Foreign Application Priority Data

Mar. 31, 2003 (JP) ............................. 2003-096246
Jun. 30, 2003 (JP) ............................. 2003-188057

(51) Int. Cl.
*G11C 11/00* (2006.01)
(52) U.S. Cl. ...................................... 365/158; 365/209
(58) Field of Classification Search .................. 365/158, 365/209

See application file for complete search history.

(56) References Cited

U.S. PATENT DOCUMENTS 5,094,925 A * 3/1992 Ise et al. ................... 428/820.4

(Continued)

FOREIGN PATENT DOCUMENTS

CN 1023264 12/1993

(Continued)

OTHER PUBLICATIONS

European Search Report from the corresponding EP 04 72 4761, mailed May 7, 2007.

*Primary Examiner*—Connie C Yoha
(74) *Attorney, Agent, or Firm*—Hamre, Schumann, Mueller & Larson, P.C.

(57) ABSTRACT

A memory cell having a configuration completely different from that of a memory cell of a conventional memory and having various excellent characteristics, and also a method for manufacturing the same, are provided. A memory having various excellent characteristics is provided as well by use of the memory cell. Furthermore, a method for recording/reading information in/from the memory is provided. The memory cell includes a memory medium for holding information, a controlling part for recording information in the memory medium, and a detecting element for reading information from the memory medium, where the detecting element is provided independently of the memory medium. More specifically, for example, the memory medium is a magnetic device, the controlling part includes a first magnetic field generating part for applying a magnetic field to the magnetic device so as to change a magnetization state of the magnetic device, and the detecting element is arranged in the vicinity of the magnetic device and has a magnetoelectric converting part whose electric characteristics vary in accordance with the magnetization state of the magnetic device.

33 Claims, 30 Drawing Sheets

U.S. PATENT DOCUMENTS

| | | |
|---|---|---|
| 5,224,080 A | 6/1993 | Ohtsuki |
| 5,295,097 A | 3/1994 | Lienau |
| 6,125,083 A | 9/2000 | Nishimura et al. |
| 6,153,443 A | 11/2000 | Durlam et al. |
| 6,392,832 B1 * | 5/2002 | Oshiki et al. .................. 360/59 |
| 6,903,645 B2 * | 6/2005 | Mizoguchi et al. .......... 336/200 |
| 7,088,612 B2 * | 8/2006 | Braun et al. ................. 365/173 |
| 7,110,312 B2 * | 9/2006 | Stephenson et al. ......... 365/209 |
| 7,200,032 B2 * | 4/2007 | Braun et al. ................. 365/158 |
| 7,239,570 B2 * | 7/2007 | Kumar et al. ............ 365/225.5 |

FOREIGN PATENT DOCUMENTS

| | | |
|---|---|---|
| CN | 1066561 | 5/2001 |
| DE | 101 40 606 | 8/2001 |
| JP | 57-68092 | 1/1982 |
| JP | 2001-332081 | 11/2001 |
| JP | 2002-533916 | 10/2002 |
| WO | 02/05286 | 1/2002 |

* cited by examiner

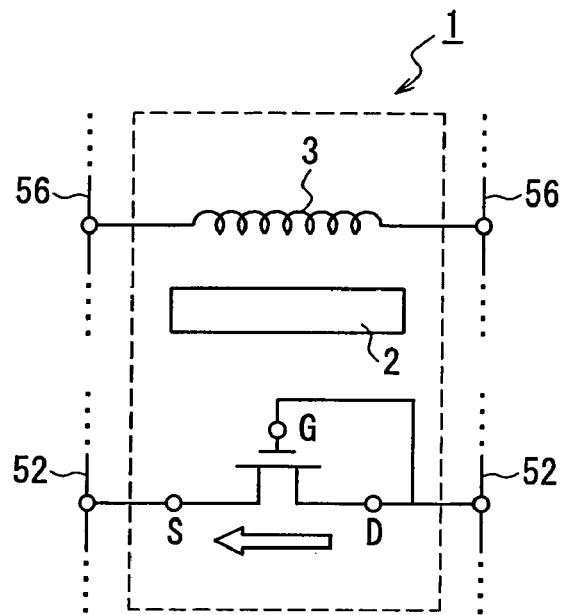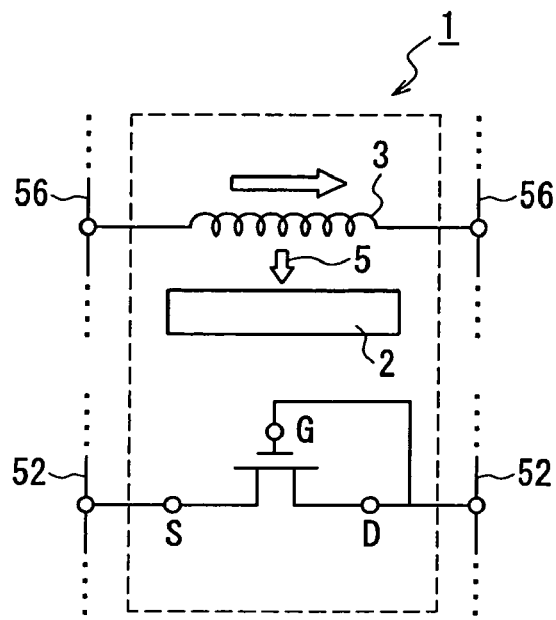
FIG. 34A  FIG. 34B
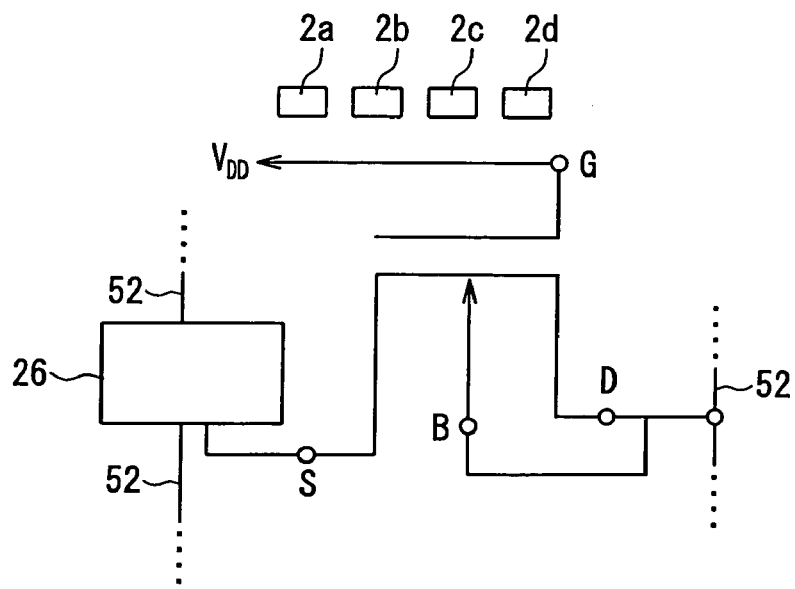
FIG. 35

MEMORY CELL, MEMORY USING THE MEMORY CELL, MEMORY CELL MANUFACTURING METHOD, AND MEMORY RECORDING/READING METHOD

TECHNICAL FIELD

The present invention relates to a memory cell and a memory using the same, and a method for manufacturing the memory cell. The present invention relates also a memory recording/reading method.

BACKGROUND ART

Conventionally, semiconductor memories have been used widely for a random access memory (RAM) represented by DRAM, SRAM and the like. High integration due to improvements in fine-processing techniques and cost reduction due to improvements in the volume-production techniques have been pursued, and thus semiconductor memories have been used widely for memories in various products and devices. Though such a semiconductor memory like a DRAM has excellent volume-productivity, it may have problems in some characteristics such as the repeatability in recording and heat resistance. For example, since an ordinary DRAM is supposed to be used at a temperature not higher than 100° C., when the environmental temperature exceeds the range and becomes even higher, the characteristics as a memory can deteriorate.

Among the semiconductor memories, semiconductor memories represented by Flash Memory (trade name) have been used widely for various devices because of a trend of integration and high capacity due to the improvements in the fine process techniques and the trend of cost reduction due to the improvements in the volume-production techniques. The Flash Memory is roughly classified into a NAND type and a NOR type. However, an ordinary Flash Memory has a problem in the speed of recording and reading information. In addition, the Flash Memory has the following problems that, for example, it requires a batched cancellation before information recording, it consumes a large amount of power, and it is affected easily by external environments such as radioactive rays and stress.

Recently, a magnetic memory (MRAM) as a RAM using a Magneto-Resistive Element (MR element) has been developed. The MRAM has an excellent repetitive recording characteristic, and it also has some excellent characteristics, for example, it can read and record at high speed in comparison with Flash Memory or the like, and thus it has been developed keenly for the next-generation memory. Such a MRAM is disclosed, for example, in JP2002-533916A. However, since the MRAM changes its characteristics greatly depending on the thickness of its thin film composing the MR elements, the film thickness must be controlled on the order of nanometers in the manufacturing process. The MR elements are classified in accordance with the type of the nonmagnetic layers included into a GMR element (Giant Magneto-Resistive Element) and a TMR element (Tunneling Magneto-Resistive Element). For example, in the TMR element, an $Al_2O_3$ layer that is generally used for a nonmagnetic layer has a thickness in a range of sub-nanometers to several nanometers. It is difficult to control the variation in the film thickness on the sub-nanometer order in a manufacturing process. Therefore, for example, in a case of forming plural MR elements on a substrate such as a silicon (Si) wafer, it is difficult to control characteristics among elements within a predetermined range, and this imposes problems in the volume productivity and integration by fine processing.

Another example of RAM being in use at present or under development is a ferromagnetic memory that uses a dielectric polarization phenomenon of a ferromagnetic material. However, the ferromagnetic memory has some problems. For example, the characteristics deteriorate in manufacturing due to contamination with a slight amount of hydrogen or the like, it is not suitable for fine processing, applicable temperature ranges are limited, and it is easily affected by stress or the like. A phase-change memory that uses a phase transition phenomenon of materials is under development as well. However, since such a memory uses a phenomenon of phase transition between amorphous and crystal, it has some problems, for example, its non-volatile property deteriorates under a high-temperature environment, and stress and distortion that may occur as a result of a volume change at the time of phase change are difficult to suppress.

DISCLOSURE OF INVENTION

An object of the present invention is to provide a memory cell that is completely different in the configuration from a memory cell of a conventional memory and that is excellent in various characteristics, and also a method for manufacturing the same. The present invention aims also to use the memory cell to provide a memory that is excellent in various characteristics. The present invention aims also to provide a method of recording/reading information in/from the memory.

A memory cell of the present invention includes a memory medium for holding information, a controlling part for recording information in the memory medium, and a detecting part for reading information from the memory medium, wherein the detecting element is provided independently of the memory medium.

It is possible for the memory cell of the present invention that, the memory medium is a magnetic device, the controlling part includes a first magnetic field generating part for applying a magnetic field to the magnetic device so as to change a magnetization state of the magnetic device, and the detecting part is arranged in the vicinity of the magnetic device and includes a magnetoelectric converting part whose electric characteristics vary in accordance with the magnetization state of the magnetic device.

It is possible for the memory cell of the present invention that the magnetoelectric converting part includes a magnetoelectric converting element whose electric characteristics vary in accordance with the state of the magnetic field to be detected, and that the magnetoelectric converting element is arranged in the vicinity of the magnetic device so as to detect a magnetic flux generated from the magnetic device.

Next, a method for manufacturing a memory cell of the present invention is a method for manufacturing a memory cell that includes a memory medium for holding information, a controlling part for recording information in the memory medium, and a detecting element for reading information from the memory medium where the detecting element is provided independently of the memory medium. According to the method, the memory medium is a magnetic device, and the controlling part includes a magnetic field generating part for applying a magnetic field to the magnetic device so as to change the magnetization state of the magnetic device, the detecting element is arranged in the vicinity of the magnetic device and includes a magnetoelectric converting part whose electric characteristics vary in accordance with the magnetization state of the magnetic device. The magnetoelectric converting part includes a magnetoelectric converting element whose electric characteristics vary in accordance with a state of a magnetic field to be detected, and the magnetoelectric converting element is arranged in the vicinity of the magnetic device so as to detect a magnetic flux generated from the magnetic device. And the method includes:

(i) a step of forming, on a surface of a semiconductor substrate, a magnetoelectric converting element whose electric characteristics vary in accordance with a state of a magnetic field to be detected, (ii) a step of forming a magnetic device so that the magnetoelectric converting element is interposed between the magnetic device and the semiconductor substrate, and (iii) a step of forming, in the vicinity of the magnetic device, a magnetic field generating part for changing the magnetization state of the magnetic device. In the step (ii), the magnetic device is formed in the vicinity of the magnetoelectric converting element so that the magnetoelectric converting element detects a magnetic flux generated from the magnetic device.

Next, a memory of the present invention includes the memory cell of the present invention as described above, an information-recording conductive line for recording information in the memory cell, and an information-reading conductive line for reading the information.

Next, a method for recording/reading information in/from the memory according to the present invention is a method of recording/reading information in/from the above-described memory of the present invention, wherein recording/reading of information is carried out by changing a current applied to at least one conductive line selected from the group consisting of an information-recording conductive line and an information-reading conductive line.

More specifically, for example, it can include: a step of changing a current applied to the information-recording conductive line so as to change the magnetic field generated at the first magnetic field generating part, and by using the change of the magnetic field generated at the first magnetic field generating part (by the thus changed magnetic field), changing the magnetization state of the magnetic device in the memory cell that composes the memory of the present invention so as to record information in the memory; and a step of changing a current applied to the information-reading conductive line so as to detect the electric characteristics of the magnetoelectric converting part, thereby reading information recorded in the memory, on the basis of the detected electric characteristics.

BRIEF DESCRIPTION OF DRAWINGS

FIGS. 34A and 34B are schematic views showing an example of basic operations in a memory of the present invention.

FIG. 35 is a schematic view showing another example of basic operations in a memory of the present invention.

DESCRIPTION OF THE INVENTION

Figure 1:
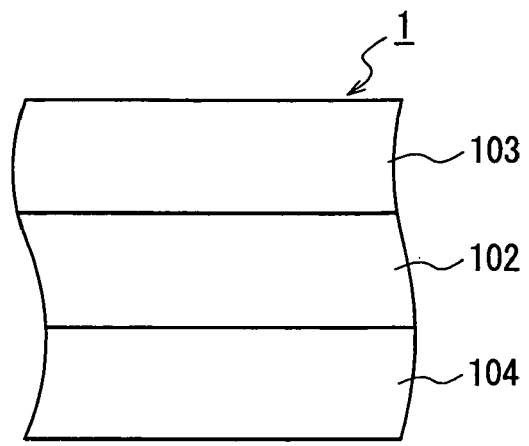
FIG. 1 is a schematic view showing an example of a memory cell of the present invention.

Embodiments of the present invention are described below with reference to the figures. In the following description, identical components may be assigned with identical reference numerals and a duplicate description thereof may be omitted.

A first description is about a memory cell of the present invention.

FIG. 1 shows an example of a memory cell of the present invention. A memory cell 1 shown in FIG. 1 includes a memory medium 102 for holding information, a controlling part 103 for recording information in the memory medium 102, and a detecting element 104 for reading information from the memory medium 102. The detecting element 104 is provided independently of the memory medium.

In a semiconductor memory (for example, DRAM, SRAM and the like) as a conventional and representative memory, a region for recording information is formed in a circuit that performs recording and reading of information. In other words, a region for recording information is assembled in a circuit that performs recording and reading of information. That is, a memory medium and a detecting element are integrated in one circuit. In a DRAM for example, information is recorded by storing electric charges in a capacitor formed in an integrated circuit, and information is read out by extracting electric charges from the capacitor. In a SRAM, recording/reading of information is carried out by means of a bistable circuit in an integrated circuit. In a MRAM using a magneto-resistive effect, a multilayer structure that provides the magneto-resistive effect functions as a recording medium and also a reading part.

On the other hand, in the memory cell 1 of the present invention, information that has been stored in the memory medium 102 is read out by the detecting element 104 provided independently of the memory medium 102. Here, "independently" implies that "the memory medium 102 and the detecting part 104 are not direct-connected electrically to each other (i.e., electrically independent)". Therefore, for example, information recorded in the memory medium can be read out without electrically operating the memory medium. Therefore, the memory cell 1 can have stable characteristics in recording and reading.

Furthermore, various effects can be selected through the selection of materials of the memory medium 102 or the configuration of the memory medium 102, or by selecting the configuration of the detecting element 104. Specific examples of the effects will be described suitably in the specification.

The memory medium 102 is not limited particularly as long as its physical or chemical characteristics vary in accordance with information recorded in the memory medium 102 itself. For example, it can be a non-volatile solid memory. More specifically for example, it can be a memory medium 102 including a capacitor or a phase transition material, or a memory medium 102 of a below-mentioned magnetic device (a memory medium 102 including a magnetic material). For example, in a case where the memory medium 102 is a magnetic device, the magnetic device will be required to vary its magnetization state (e.g., a magnetization direction) in accordance with the recorded information. In this case, information in a form of magnetic energy is transmitted from the memory medium 102 to the detecting element 104. Means for transmitting information from the memory medium 102 to the detecting element 104 is not limited particularly. Other than the above-mentioned magnetic energy, information can be transmitted, for example, in a form of thermal energy or dynamic energy (e.g., internal stress).

The detecting element 104 is not limited particularly as long as its electric characteristics vary in accordance with the physical or chemical characteristics of the memory medium 102, for example. Here, the variation in electric characteristics denotes, for example, variation of electric output. Electric characteristics can be specified as electric resistance, thermo-electromotive force, electrical conductivity and the like. In a specific example, as mentioned below, a transistor is included, and the transistor varies its electric characteristics in accordance with information recorded in the memory medium.

The controlling part 103 is not limited particularly in its structure or the like as long as it can change the physical or chemical characteristics of the memory medium 102 in accordance with the information to be recorded. For example, in a case where the memory medium 102 is a magnetic device, the controlling part 103 will be required to have a structure for applying a magnetic field to the memory medium 102. Alternatively, the controlling part 103 can have a structure for applying heat or pressure to the memory medium 102, for example.

Specific examples of the memory cell of the present invention will be described below.

Figure 2:
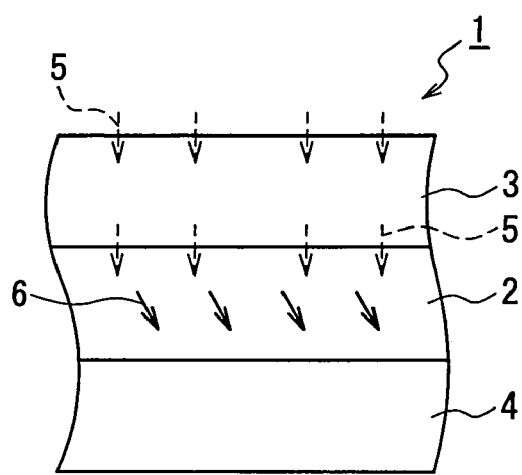
FIG. 2 is a schematic view showing an example of a memory cell of the present invention.

FIG. 2 shows an example of a memory cell of the present invention. A memory cell 1 as shown in FIG. 2 includes a magnetic device 2, a magnetic field generating part 3 for applying a magnetic field to the magnetic device 2 so as to change the magnetization state of the magnetic device 2, and a magnetoelectric converting part 4 arranged in the vicinity of the magnetic device 2 and having electric characteristics that vary in accordance with a magnetization state of the magnetic device 2. In other words, in the memory cell 1 as shown in FIG. 2, the memory medium 102 is the magnetic device 2. The controlling part 103 includes the magnetic field generating part 3 that applies a magnetic field to the magnetic device 2 so as to change the magnetization state of the magnetic device 2. The detecting part 104 is arranged in the vicinity of the magnetic device 2 and includes the magnetoelectric converting part 4 whose electric characteristics vary in accordance with the magnetization state of the magnetic device 2.

In the memory cell 1, the magnetization state (e.g., a magnetization direction 6 or magnetization intensity) of the magnetic device 2 can be changed by the magnetic field 5 generated at the magnetic field generating part 3. For example, an electric signal is inputted in the magnetic field generating part 3 and a magnetic field 5 corresponding to the inputted electric signal is applied to the magnetic device 2 so that the magnetic device 2 will have a magnetization state corresponding to the electric signal. As a result, information can be recorded and held in a form of magnetization state of the magnetic device 2. Furthermore, with the magnetoelectric converting part 4, electric signals varying in accordance with the magnetization state of the magnetic device 2 can be outputted. That is, according to the configuration as shown in FIG. 1, the memory cell 1 can include the magnetic device 2 as a memory medium, the magnetic field generating part 3 as a writing part for recording information in the memory medium and the magnetoelectric converting part 4 as a reading part for reproducing information recorded in the memory medium. In FIG. 2, hatching is omitted for convenience. In some of the remaining drawings, hatching may be omitted similarly.

As mentioned above, in the memory cell 1 as shown in FIG. 2, information is stored in a form of magnetization state of the magnetic device 2 as a memory medium (storage medium), unlike a semiconductor memory as a conventionally representative RAM. Therefore, the memory cell can have stable characteristics even in a case where recording and reading are carried out repeatedly. The speed that the magnetization state of the magnetic device 2 changes can be set in an order of tens of nanoseconds to about 10 psec, depending on the materials, configuration and shape of the magnetic device 2, and the structure and configuration of the magnetic field generating part 3. As a result, the memory cell can have excellent recording speed (writing speed). At the time of recording information, a batched erase, batched initialization or the like of the magnetization state of the magnetic device 2 are not necessarily required.

The memory cell of the present invention, which can provide such a recording speed, can be advantageous remarkably with respect to Flash Memory, for example. In Flash Memory, information is recorded by accumulating a part of dispersed channel hot electrons in a floating gate. For this reason, a large amount of channel hot electrons are required for recording information, and thus a comparatively long recording time and/or high current value (high power) are required. For example, in a case of a typical Flash Memory of a NAND type, a recording time of about 200 μsec is required for recording information of 512 B (bytes). An even longer time is required for a batched erase before recording information (e.g., time of about several milliseconds is required for erasing 16 kB). Similarly, at the time of reading information, for example, a reading time of about 25 μsec is required at a time of random access. On the other hand, for the memory cell of the present invention, the above-mentioned recording speed can be realized. In a case where quick recording is not required in the memory cell of the present invention, the recording can be slower than the range of the above-mentioned recording speed, by controlling the materials, the configuration and the shape of the magnetic device 2 and the structure and the configuration of the magnetic field generating part 3. Arbitrary modification can be performed correspondingly to the characteristics required for the memory cell.

By selecting the magnetic material used for the magnetic device 2, the memory cell can have selected characteristics. That is, the memory cell can be excellent in environmental resistance such as heat resistance, a non-volatile property of recorded information, output characteristics, and in productivity. For example, by setting the coercive force of the magnetic device 2 to be larger to some degree, the thus obtained memory cell will be excellent in an information non-volatile property. The reason is that the change in the magnetization state of the magnetic device 2 can be suppressed by the time a new magnetic field stronger than the coercive force of the magnetic device 2 is applied additionally.

The configuration of the memory cell 1 as shown in FIG. 2 is also different from the configuration of a memory cell for a MRAM. Similarly to the case of the memory cell 1, information is stored in a form of a magnetization state of the magnetic device in the MRAM. However, while the MRAM requires a multilayer structure including a non-magnetic layer and a pair of magnetic layers interposing the non-magnetic layer (in MRAM, information is stored in a form of a relative angle of magnetization directions in the pair of magnetic layers), the memory cell 1 of the present invention does not always require such a multilayer structure. In a simplest example, the magnetic device 2 can be a magnetic device of a single-layer structure composed of a single magnetic material. Unlike the MRAM, it does not always require controlling of a film thickness in a sub-nanometer order to a nanometer order for forming a multilayer structure. Therefore, fine processing is available for a case of forming a plurality of elements on a substrate such as a silicon (Si) wafer, and the thus obtained memory cell 1 can have stable inter-element characteristics and excellent productivity. In the specification, a magnetic layer denotes a layer including a magnetic material, and a magnetic device includes at least one magnetic layer.

In the MRAM, the multilayer structure functions as a storage medium and also as a reading part. That is, the recording medium and the reading part are direct-connected electrically to each other. On the contrary, in the memory cell 1 of the present invention, the storage medium (magnetic device 2) and the reading part (magnetoelectric converting part 4) are electrically isolated from each other. Therefore, the memory cell 1 can have a stable writing characteristic and a stable reading characteristic. The magnetization direction in the MRAM is in general parallel to the film face of the magnetic device. However, as described below, the memory cell 1 of the present invention does not require that the magnetization direction of the magnetic device be parallel to the main face of the magnetic device, but preferably, the magnetization is in a direction having an angle with respect to the main face of the magnetic device.

In the example of the memory cell 1 as shown in FIG. 2, the magnetic field generating part 3 and the magnetic device 2 are in contact with each other and the magnetic device 2 and the magnetoelectric converting part 4 are in contact with each other. However, the respective components are not necessarily contacted with each other. For example, the magnetic device 2, the magnetic field generating part 3, and the magnetoelectric converting part 4 can be arranged respectively via an insulator, spacing such as holes and a gas, or the like.

The respective components of the memory cell 1 as shown in FIG. 2 are described below.

The magnetoelectric converting part 4 will not be limited particularly in the structure, configuration, size or the like as long as the electric characteristics vary in accordance with the magnetization state of the magnetic device 2. For example, the magnetoelectric converting part 4 can include a magnetoelectric converting element whose electric characteristics vary in accordance with the state of the magnetic field to be detected, and the magnetoelectric converting element can be arranged in the vicinity of the magnetic device 2 so as to detect a magnetic flux generated from the magnetic device 2. The types of the electric characteristics are not limited particularly. For example, the magnetoelectric converting element can change its electric resistance in accordance with the state of the magnetic field to be detected. Alternatively, the magnetoelectric converting element can change its Hall voltage in accordance with the state of the magnetic field to be detected.

In a case where the magnetoelectric converting element is an element that can be formed on a surface of a semiconductor substrate, i.e., where it is a semiconductor element for example, the memory cell 1 of the present invention can be manufactured by using an ordinary process for processing a semiconductor. Therefore, a memory cell that is excellent in volume-productivity and can be produced at a low cost can be provided. In a case where the magnetoelectric converting part 4 includes the above-mentioned magnetoelectric converting element, the magnetoelectric converting part 4 can include one or plural magnetoelectric converting element(s). Alternatively, it can include a circuit for detecting changes in the electric characteristics of the magnetoelectric converting element.

A distance between the magnetoelectric converting part 4 and the magnetic device 2 is not limited particularly as long as the magnetic flux generated from the magnetic device 2 in accordance with the magnetization state of the magnetic device 2 can be detected by the magnetoelectric converting part 4. It can be set arbitrarily in accordance with the magnetic property of the magnetic device 2, the characteristics of the magnetoelectric converting part 4 or the like. For example, it is in a range of 1 nm to 100 μm, more preferably, a range of 4 nm to 500 nm. It is preferable that the distance between the magnetoelectric converting part 4 and the magnetic device 2 is smaller as long as there are no problems such as contamination in the magnetic device 2. At present, the lower limit for a fine processing of a Si-based semiconductor (e.g., Si, SiGe, SiGeC, and SiC) is considered as about 4 nm.

When the magnetoelectric converting part 4 includes the above-mentioned magnetoelectric converting element, similarly a distance between the magnetoelectric converting element and the magnetic device 2 can be in a range of 1 nm to 100 μm, more preferably, a range of 4 nm to 500 nm.

Figure 3:
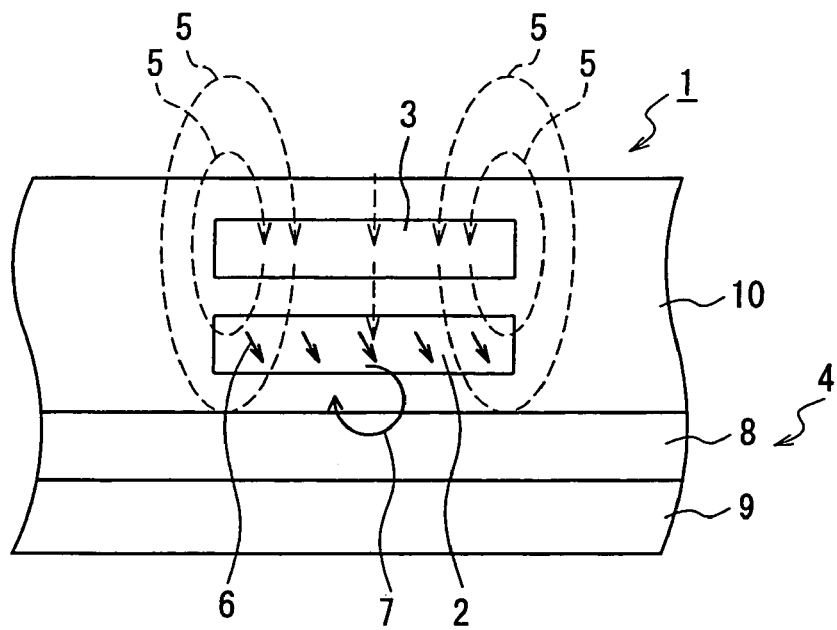
FIG. 3 is a schematic view showing another example of a memory cell of the present invention.

FIG. 3 shows another example of a memory cell of the present invention. A memory cell 1 as shown in FIG. 3 includes a magnetic device 2, a magnetic field generating part 3 that applies a magnetic field 5 to the magnetic device 2 so as to change the magnetization state (e.g., a magnetization direction 6 and magnetization intensity) of the magnetic device 2, and a magnetoelectric converting part 4 that is arranged in the vicinity of the magnetic device 2 and has electric characteristics varying in accordance with the magnetization state of the magnetic device 2. Here, the magnetoelectric converting part 4 includes a transistor 8 as a magnetoelectric converting element whose electric resistance varies in accordance with the state (i.e., information recorded in the memory medium 102) of the magnetic field to be detected. The transistor 8 is arranged in the vicinity of the magnetic field 2 so as to detect a magnetic flux 7 generated from the magnetic device 2. Since the transistor 8 as a semiconductor element can be formed on a surface of a semiconductor substrate 9 composed of Si or the like, such a memory cell 1 can be manufactured by using an ordinary process for semiconductor. Therefore, the thus obtained memory cell 1 has excellent volume-productivity and can be manufactured at a low cost. Moreover, by selecting the magnetic material of the magnetic device 2, the memory cell 1 can have excellent stability under a high/low temperature condition.

A distance between the transistor 8 as a magnetoelectric converting element and the magnetic device 2 is not limited particularly as long as the transistor 8 can detect the magnetic flux 7 generated from the magnetic device 2 in accordance with the magnetization state of the magnetic device 2. It can be set arbitrarily in accordance with the magnetic characteristics of the magnetic device 2, the type of the transistor 8 or the like. For example, the distance can be in a range of 1 nm to 10 μm, preferably a range of 4 nm to 500 nm. More specifically, in a case where the transistor 8 is a MOS transistor, for example, the range is from 1 nm to 100 μm, preferably, from 4 nm to 500 nm.

The type of the transistor 8 is not limited particularly, and for example, a field effect transistor, a bipolar transistor, a diode or the like can be used. Among them, when a MOS transistor is used for the field effect transistor, fine processing will be realized, and thus a more integrated memory cell can be provided. The MOS transistor denotes a transistor having a gate of a structure composed of at least three layers of "a layer made of a conductor or a semiconductor such as polysilicon with a small specific resistance", "an insulating layer" and "a semiconductor layer (a p-type or n-type semiconductor layer having conductivity, an intrinsic semiconductor layer or the like).

Specific configurations of the transistor 8 are not limited particularly, and a transistor of a configuration used in general can be used. For example, in a case of a MOS transistor, it can be a n-channel MOS transistor or a p-channel MOS transistor. In a case of a junction electric field effect transistor, it can be a n-channel transistor or a p-channel transistor.

The semiconductor substrate 9 is not limited particularly as long as the transistor 8 can be formed on the surface. For example, a semiconductor substrate made of a crystal silicon can be used. It can be a semiconductor substrate doped with impurities such as a group IIb element, a group IIIb element, a group Vb element, a group VIb element (respectively, a group 12, a group 13, a group 15 and a group 16, according to new IUPAC). Alternatively, for the semiconductor substrate, a substrate composed of a compound semiconductor containing, for example, a group IIIb element (group 13) such as GaN, GaP, GaAs and the like, and a group Vb (group 15) element can be used. Alternatively, a substrate composed of a compound semiconductor containing, for example, a group IIb (group 12) element such as ZnS, ZnSe and a group VIb (group 16) element can be used. Alternatively, it can be a SOI (silicon on insulator) substrate including an insulating layer.

In a case of using a semiconductor substrate composed of a crystal silicon, a large diameter silicon wafer is batch-processed by using an ordinary process for preparing a semiconductor, and thus a large amount of memory cells 1 can be formed at a time on a wafer. Thereby, the memory cell 1 can be further excellent in volume-productivity. Furthermore, in a case of using a SOI substrate, as it is suitable for suppressing a short-channel effect (described below) that occurs with the trend of fine processing of the cell, the magnetoelectric converting part 4 can be made small, and thus a smaller memory cell 1 can be obtained. The thickness of the semiconductor substrate 9 is not limited particularly.

In the example as shown in FIG. 3, insulators 10 are arranged between the magnetic device 2 and the transistor 8, between the magnetic device 2 and the magnetic field generating part 3, and on the magnetic field generating part 3 respectively. By arranging the insulators 10, electric insulation between the respective components can be maintained. The insulators 10 can be composed of, for example, $SiO_2$, SiN, SiF, ZnS, ZnS—$SiO_2$, alumina ($Al_2O_3$), O—N—O ($SiO_2$—$SiN_x$—$SiO_2$); chalcogenides; oxides such as $TaO_2$; nitrides such as AlN; organics; resins; and materials including these compounds.

The insulators 10 preferably have a small dielectric constant. Specifically, the specific dielectric constant should be in a range of 1 F/m to 3 F/m, for example. Thereby, in a case where the cell is fine-processed or highly-integrated, degradation of the recording speed and the reading speed, and/or increase in a wiring loss can be suppressed. As mentioned above, the insulators 10 are not essential components, but they can be arranged as required. Alternatively, the insulators 10 can be holes or the like.

The magnetoelectric converting element is not limited to the transistor 8. It can be any other element or it can be provided as a combination of a transistor and an element other than a transistor.

Figure 4:
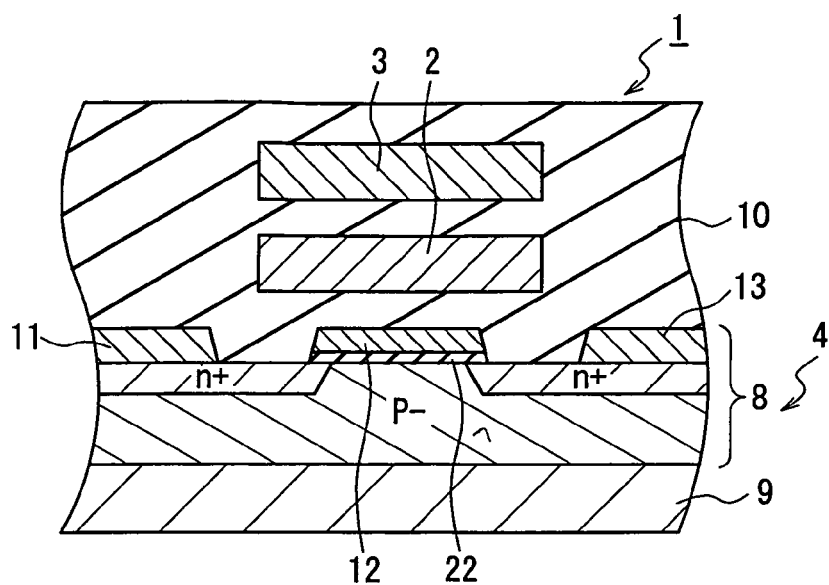
FIG. 4 is a schematic view showing a separate example of a memory cell of the present invention.

FIG. 4 shows a separate example of a memory cell of the present invention. A memory cell as shown in FIG. 4 includes a transistor as a magnetoelectric converting element. FIG. 4 shows the transistor 8 of the memory cell 1 in FIG. 3 more specifically. The transistor 8 in the memory cell 1 shown in FIG. 4 is a n-channel MOS transistor, and it includes a source electrode 11, a gate electrode 12, a drain electrode 13 and a gate insulating film 22.

In the memory cell 1 of the present invention, the transistor 8 can be a MOS transistor where the gate electrode 12 and the drain electrode 13 are equipotential. Since the wirings can be shared between the gate electrode and the drain electrode in such a memory cell, the memory cell can be smaller and further integrated. The structure for making the gate electrode 12 and the drain electrode 13 to be equipotential is not limited particularly as long as, for example, the gate electrode 12 and the drain electrode 13 are common in FIG. 4. This can be applied similarly to a case of using a p-channel MOS transistor for the transistor 8.

The gate electrode 12 in the transistor 8 is not limited particularly as long as it is an electric conductor. For example, it can be an electrode made of metal, polysilicon, conductive organics, resin or the like.

The gate insulating film 22 is not limited to a film made of $SiO_2$, but it can be a film made of, for example, $Al_2O_3$, nitrogen-added hafnium silicate (HfSiON), silicon nitride ($SiN_x$), SiF, O—N—O ($SiO_2$—$SiN_x$—$SiO_2$), insulating organics, resin or the like. Preferably, the gate insulating film 22 has a larger dielectric constant. Specifically, the specific dielectric constant should be, for example, about 3.5 F/m. In a case where the MOS transistor is finely processed, the film thickness of the gate insulating film 22 must be decreased. For this purpose, a gate insulating film having a larger dielectric constant can be thicker. Thereby, electric breakdown of the gate insulating film and leakage current caused by tunneling effect can be suppressed.

Moreover, when the transistor 8 is finely processed, a so-called short-channel effect, which is a phenomenon that a threshold voltage varies, may occur. By suppressing the short-channel effect, the transistor 8 can be processed further finely, i.e., the memory cell 1 can be made smaller. For suppressing the short-channel effect, for example, a plurality of gates can be arranged with respect to one channel in the transistor 8, the entire channels can be covered with a gate, or plural faces (not a single face) of the channel can be covered. Specific examples of the MOS transistor include a dual gate transistor (e.g., FinFEP), a tri-gate transistor or the like.

Figure 5A:
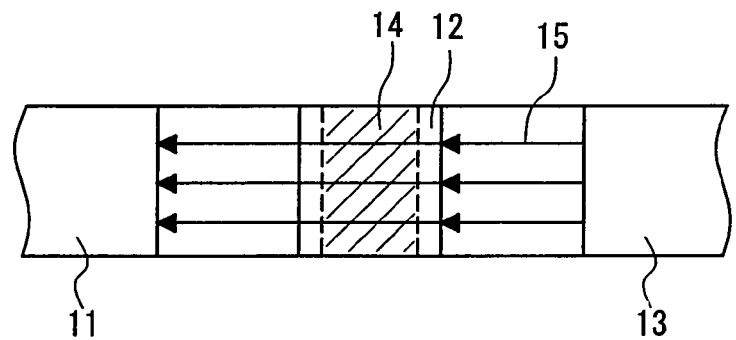
FIGS. 5A-5C are schematic views for illustrating an example of a change in electric output in a memory cell of the present invention.
Figure 5B:
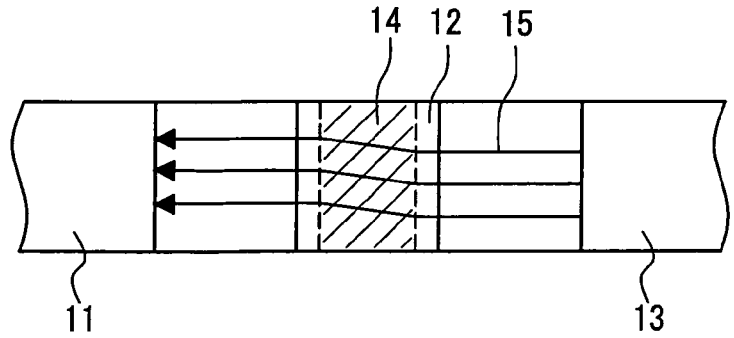
Figure 5C:
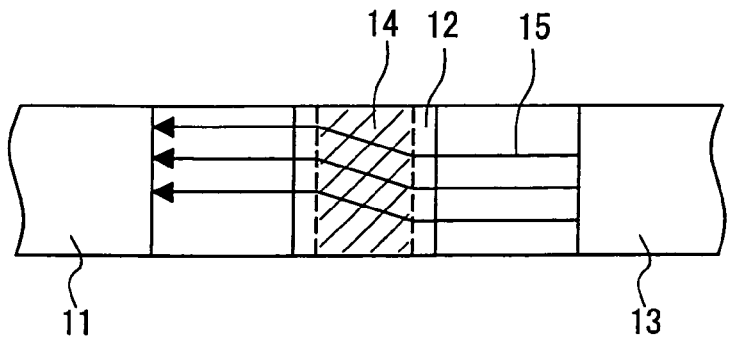

The explanation below is about a principle that when a transistor is used for a magnetoelectric converting element, the electric resistance of the transistor varies in accordance with the magnetic flux 7 generated from the magnetic device 2. FIGS. 5A-5C are schematic views showing the transistor 8 shown in FIG. 4, when viewed from the magnetic device 2 side. For a case of a normally-off transistor, when a voltage of at least a predetermined value is applied to the gate electrode 12 of the transistor 8, a channel 14 is formed in a $p^-$ layer (in general, it is called a bulk or a well) in the vicinity of the gate electrode 12. As a result of formation of the channel 14, a current 15 will flow from the drain electrode 13 side to the source electrode 11 side. Here, in a case where the magnetic flux generated from the magnetic device 2 is not applied to the transistor 8, as shown in FIG. 5A, the current 15 flows to the source electrode 11 substantially in a straight line via the channel 14. On the other hand, when the magnetic flux is applied to the transistor 8, as shown in FIG. 5B, the magnetic flux and the current interact with each other (Lorentz's force is applied to the current), thereby changing the direction of the current flow. The degree of the change varies in accordance with the state of the magnetic flux applied to the transistor 8. For example, when the degree of the magnetic flux becomes larger than the case as shown in FIG. 5B, the change in the direction of the current flow will be increased as well, as shown in FIG. 5C. At this time, as shown in FIGS. 5A-5C, the length of the current will be increased when the direction of the current flow changes further. That is, it can be considered that the length of the current is differentiated corresponding to the state of the magnetic flux applied to the transistor 8, thereby changing the electric resistance of the transistor 8. In the example as shown in FIGS. 5A-5C, a phenomenon that the direction of the current flow changes in the channel 14 is illustrated schematically. In the memory cell 1 of the present invention, the location of the transistor 8 in which the direction of the current-flow changes is not limited to the channel 14. Any location to which the magnetic flux from the magnetic device 2 is applied can cause a change in the direction of the current flow. For a case of a normally-on transistor, similar effects can be obtained by setting the voltage applied to the gate electrode 12 of the transistor 8 not to be higher than a predetermined value.

The degree of change in the electric resistance of the transistor 8 can be controlled by adjusting, for example, the magnetization state (magnetization direction 6, magnetization intensity, or the like) of the magnetic device 2, a distance between the magnetic device 2 and the transistor 8, the sizes of the magnetic device 2 and the transistor 8, and the positional relationship between the magnetic device 2 and the transistor 8. As clarified from the explanation regarding FIGS. 5A-5C, the positional relationship between the magnetic device 2 and the transistor 8 will not be limited particularly as long as the magnetic device 2 and the transistor 8 are arranged at positions to have interactions with each other. Here, the interaction denotes an action that can change the electric characteristics (e.g., electric output, more specifically, electric resistance or the like) of the transistor 8. Specifically, in a case where the transistor 8 is a MOS transistor as shown in FIG. 4, there is no particular limitation as long as the magnetic device 2 is arranged in the vicinity of the gate electrode 12, for example. At this time, it is preferable that the magnetic device 2 is arranged so that the magnetic flux generated from the magnetic device 2 is applied to the entire surface (entire the channel 14) of the gate electrode 12.

In the memory cell 1 of the present invention, the magnetoelectric converting element can be a transistor having a plurality of channels, alternatively, the magnetoelectric converting element can include a plurality of transistors. The specific examples will be described below.

Next, the magnetic field generating part will be explained.

In the memory cell 1 as shown in FIG. 2, the magnetic field generating part 3 is not limited particularly in the structure, configuration or the like, as long as the magnetization state (e.g., a magnetization direction 5 and magnetization intensity) of the magnetic device 2 can be changed by applying a magnetic field 5 to the magnetic device 2. It can be set arbitrarily in accordance with the magnetic property of the magnetic device 2, the size of the magnetic device 2, a distance from the magnetic device 2 or the like.

Figure 6:
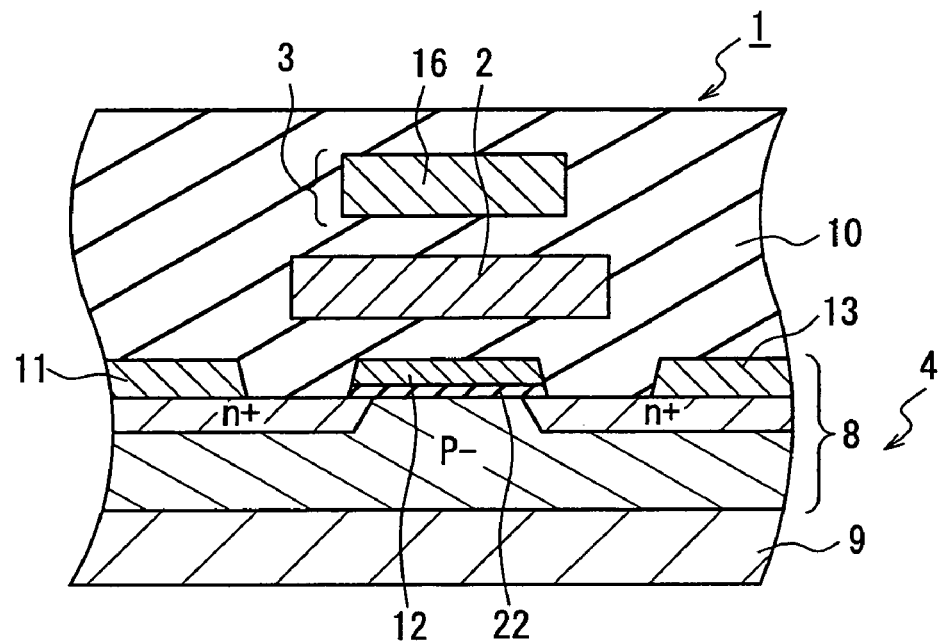
FIG. 6 is a schematic view showing a separate example of a memory cell of the present invention.

A separate example of the memory cell of the present invention is shown in FIG. 6. In the memory cell 1 as shown in FIG. 6, the magnetic field generating part 3 includes a wiring 16 for inducing a magnetic field. The wiring 16 is arranged so that the magnetic device 2 is interposed between the wiring 16 and a n-channel MOS transistor 8 as a magnetoelectric converting part 4. In such a memory cell, it is possible to generate a magnetic field by feeding a current into the wiring 16, thereby changing the magnetization state of the magnetic device 2. For example, by reversing the direction of a current fed into the wiring 16, the magnetization direction of the magnetic device 2 can be reversed easily. The current fed into the wiring 16 can be changed in an order of several dozens of nanoseconds to 10 psec, depending on the configuration of the circuit (that is, the magnetization state of the magnetic device 2 can be changed at a substantially equal rate). Therefore, the memory cell 1 can have excellent writing speed.

Materials used for the wiring 16 are not limited particularly as long as they are electroconductive. For example, metallic materials, alloys and metal oxides having a small specific resistance can be used. More specifically, for example, materials including Al or Cu, or W, Ti, Mn, TiW, Ag, Au, AlTi, Pt, silicide (general term of compounds of silicon and metals, such as SiPt), and alloy materials including at least one material selected from these materials can be used. There are no particular limitations for the thickness and shape of the wiring 16, and they can be set arbitrarily in accordance with the characteristics required for the memory cell 1. The thickness of the wiring 16 is, for example, in a range of 10 nm$^2$ to 1 mm$^2$ in the cross section. When it is smaller than 10 nm$^2$, in a case where a current is applied for changing the magnetization state of the magnetic device 2, heat is generated and a rupture may occur due to electro-migration or an electric short-circuit with the other wirings. With respect to miniaturization of the memory cell, a range of 20 nm$^2$ to 1 μm$^2$ is preferred particularly.

The shape of the wiring 16 is not limited particularly as long as the cross section is rectangular, circular, elliptical or trapezoidal, for example. More specifically, in a case where the cross section is substantially rectangular, for example, the long sides are in a range of 10 nm to 100 μm, the short sides are in a range of 1 nm to 50 μm, and preferably not shorter than 4 nm. When the long sides are shorter than 10 nm, the wiring resistance may be increased. A fine processing for making the short sides to be less than 4 nm may raise the cost considerably. For example, a threshold for fine processing for Si semiconductor is about 4 nm at present. In this case, any of the long sides and the short sides of the wiring 16 can face the magnetic device 2.

The distance between the wiring 16 and the magnetic device 2 is not limited particularly as long as the magnetization state of the magnetic device 2 can be changed. It can be determined arbitrarily depending on the characteristics required for the memory cell 1, for example, in a range not more than 100 μm, preferably not more than 0.1 μm. The wiring 16 and the magnetic device 2 can be in contact with each other, and in this case, the magnetic field generated at the wiring 16 can be applied more efficiently to the magnetic device 2. Therefore, a memory cell 1 with a higher writing speed can be provided. As mentioned above, in a case where problems such as an electric short-circuit occur due to the direct contact between the wiring 16 and the magnetic device 2, another material such as an insulator can be arranged between the wiring 16 and the magnetic device 2. Alternatively, an organic material, bubbles, spacing or the like can be provided between the wiring 16 and the magnetic device 2 in order to keep insulation. At this time, the insulation therebetween can be improved further by changing the bubbles to vacuum, or by filling the bubbles with air or an inert gas.

The position of the wiring 16 with respect to the magnetic device 2 is not limited particularly as long as the wiring 16 can apply the magnetic field 5 to the magnetic device 2 and the magnetic flux 7 generated from the magnetic device 2 is not prevented from reaching the magnetoelectric converting part 4. It can be arranged at a position so that the magnetic device 2 is interposed between the wiring 16 and the magnetoelectric converting part 4, alternatively, it can be arranged at the side of the magnetic device 2.

Figure 7:
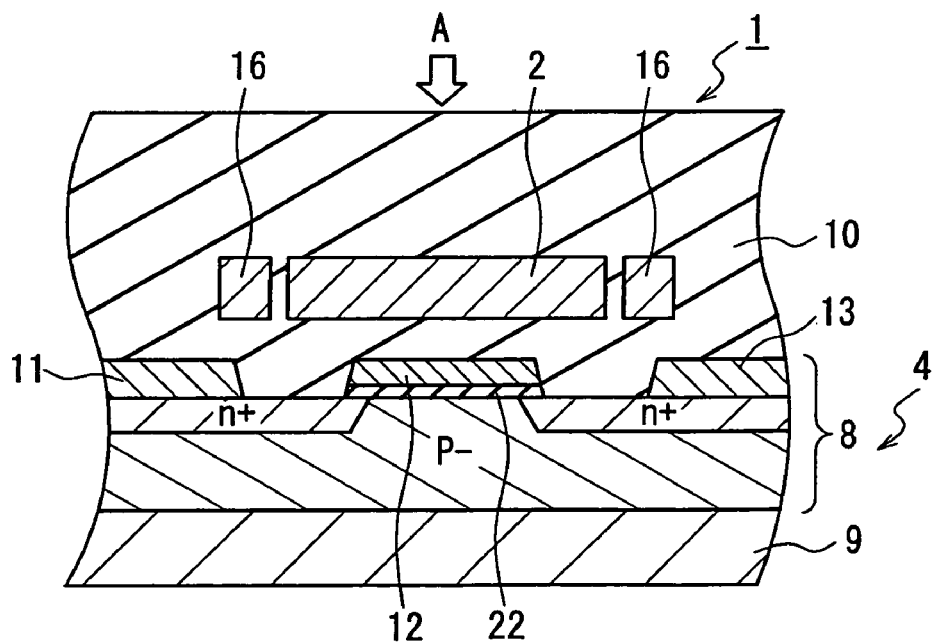
FIG. 7 is a schematic view showing a separate example of a memory cell of the present invention.

Another example of the memory cell of the present invention is shown in FIG. 7. In the memory cell 1 as shown in FIG. 7, the wiring 16 is arranged as a coil wound around the magnetic device 2. In such a memory cell, a magnetic field can be applied to the magnetic device 2 more efficiently. Therefore, the memory cell will be more excellent in the recording characteristic (writing characteristic).

Figure 8A:
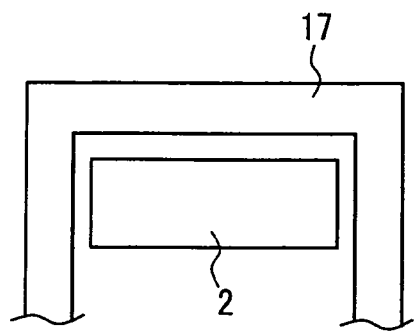
FIGS. 8A and 8B are schematic views showing one example of a relationship between a magnetic device and a magnetic field generating part in a memory cell of the present invention.
Figure 8B:
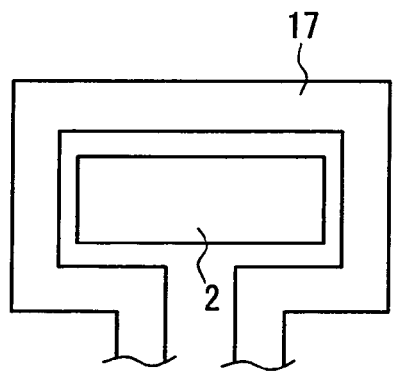

The shape of the wiring 16 wound as a coil is not limited particularly as long as it can apply a magnetic field to the magnetic device 2. For example, as shown in FIGS. 8A and 8B, it can be wound around the magnetic device 2. FIGS. 8A and 8B illustrate the memory cell 1 shown in FIG. 7 from above (the direction of arrow 'A' in FIG. 7), and thus components other than the magnetic device 2 and the wiring 16 are omitted in FIGS. 8A and 8B.

The wiring 16 shown in FIG. 7 can be a wiring formed by processing a thin film. For example, a thin film made of a material for composing the wiring 16 is formed and shaped as a coil by etching or the like, and thereby a coiled wiring 16 formed by processing a thin film can be obtained. Since such a coiled wiring 16 can be integrated easily and shaped more freely, it can apply a magnetic field to the magnetic device 2 more efficiently. Therefore, a memory cell that is further excellent in the writing characteristic can be provided. In this case, the thin film has a thickness in a range, for example, from 1 nm to 100 μm. When the coil is substantially rectangular, the thickness of the formed thin film can be determined as a length of one side of the cross section of the coil. In each of the following drawings, the wiring 16 wound like a coil is indicated as a wiring 17.

Next, the magnetic device is explained.

In the memory cell 1 shown in FIG. 2, the magnetic device 2 is not limited particularly as long as it includes at least one magnetic layer. Here, the magnetic layer denotes a layer containing a magnetic material. The thickness of the magnetic layer included in the magnetic device 2, the number of the magnetic layers or the like can be set arbitrarily in accordance with the characteristics required for the magnetic device 2. For example, it can be a magnetic device of a single layer structure made of a single magnetic material (in this case, a magnetic layer corresponds to a magnetic device), or a plurality of magnetic layers different from each other in the compositions can be laminated to form a magnetic device. By making a magnetic device including plural magnetic layers different from each other in the components, the obtained memory cell 1 can have characteristics controlled more minutely. Furthermore, as required, the magnetic device 2 can include a layer other than the magnetic layer and a material other than the magnetic material (e.g., a non-magnetic layer, a non-magnetic material, a paramagnetic layer, a paramagnetic material, an insulator or the like).

The shape of the magnetic device 2 is not limited particularly. The number of the magnetic devices 2 included in one memory cell 1 is not limited either. As mentioned below, they can be set arbitrarily in accordance with the degree of the multi-level of the memory cell 1, the shape of the transistor 8 or the like.

There is no particular limitation about the thickness of the magnetic device 2 in a direction perpendicular to a face facing the magnetoelectric converting part 4. For example, it can be in a range of 1 nm to 100 μm, and preferably in a range of 10 nm to 20 μm from an aspect of fine processing. There is no particular limitation about an area of the face of the magnetic device 2 facing the magnetoelectric converting part 4. For example, it can be 10 μm² or less, and preferably in a range of 20 nm² to 2 μm². It is considered that a threshold for fine processing of a Si-based semiconductor material is about (several nanometers)×(several nanometers). In a case of such a fine processing, preferably the thickness of the magnetic device is within the above mentioned range so that the magnetic flux generated from the magnetic device will be stable and act on the magnetoelectric converting part efficiently. As the above surface area is smaller, the memory cell 1 can be smaller. When the memory cell 1 is smaller, a memory that is denser and more integrated can be formed.

The magnetic material used for the magnetic device 2 is not limited particularly. For example, a magnetic material having ferrimagnetism (ferrimagnetic material) or a magnetic material having ferromagnetism (ferromagnetic material) can be used. When these magnetic materials are used, the magnetization state of the magnetic device 2 can be changed more easily by the magnetic field generating part 3, and thus the memory cell 1 can have more excellent writing characteristics. Particularly, in a case where a ferrimagnetic material is used, magnetic anisotropy can be provided in a direction perpendicular to a face of the magnetic device 2 facing the magnetoelectric converting part 4, and thus the magnetic flux 7, which is generated from the magnetic device 2 and acts on the magnetoelectric converting part 4, can be increased further. The thus obtained memory cell 1 can have more excellent characteristics. Moreover, by using a magnetic material having a proper coercive force (e.g., a material whose coercive force is in a range about 80 A/m to about 3000 A/m) for the magnetic device 2, the magnetization state can be maintained in a non-volatile manner even after the action of the magnetic field generating part 3 is exhausted. Thereby, a memory cell 1 with a more excellent non-volatile property can be obtained.

There is no particular limitation about the ferrimagnetic material, but for example, rare earth-transition metal-based magnetic materials, ferrite or the like can be used. There is no particular limitation about the ferromagnetic material, but for example, magnetic materials made of oxides containing transition metals can be used.

More specific examples include: rare earth-transition metal-based magnetic materials (for example, amorphous substances) such as GdFeCo, GdFeCoAl, GdFeCoCr, TbDyFeCoAl, TbDyFeCr, TbFeCoAl, ThHoFeCoAl, TbFeCo, ThHoFeCo, TbFeCoCr, ThHoFeCoCr, GdFe, TbFe, TbHoFe, ThCo, GdCo, GdTbFe, GdTbFeCo, GdThHoFeCo, DyFeCo, GdFeCoSi, and TbFeCoSi; Mn-based magnetic materials (for example, polycrystals) such as MnBi, MnCuBi, MnBiAl, and PtMnSn; platinum group-transition metal-based magnetic materials (for example, alloys) such as garnet, PtCo, and PdCo; gold and, platinum group-transition metal-based magnetic materials (for example, periodic structure alloys) such as Pt/Co and Pd/Co; and ferrites such as Fe ferrite, αFe, Co ferrite, NiZn ferrite and Co ferrite oxide. These materials can be used alone for forming the magnetic device 2, or plural magnetic layers made of the respective magnetic materials can be laminated to form the magnetic device 2. The component ratios of the magnetic materials mentioned above are not limited particularly. For some objects such as improving the corrosion resistance of the magnetic device 2, elements such as Cr, Al, Ti, Pt and Nb can be added to the magnetic device 2 independently of the above-mentioned magnetic materials.

In the memory cell 1 of the present invention, the magnetic device 2 can include a magnetic material of a multicomponent system (for example, rare earth-ferrite magnetic materials) containing plural components being different from each other in the coercive force. More specifically, for example, it can include SmCo, NdFeB, SmFeN or the like. In a case of using such a magnetic device 2, the magnetoelectric converting part 4 can be applied further with an offset magnetic field. As a result, a change in the electric characteristics of the magnetoelectric converting part 4 in accordance with the magnetization state of the magnetic device 2 can be increased further, thereby providing a memory cell 1 with a more excellent reading characteristic. The offset magnetic field and the effect will be described later.

In the memory cell 1 of the present invention, the temperature at which the value of the saturation magnetization of the magnetic device 2 is maximized can be in a range of 80° C. to 300° C. When such a magnetic device 2 is used, the thus obtained memory cell 1 will have excellent heat resistance, with less deterioration in the characteristics even at a high temperature of 80° C. or higher. The magnetic device 2 contains a magnetic material such as TbFeCo, DyFeCo, TbGdFeCo or the like.

Figure 9:
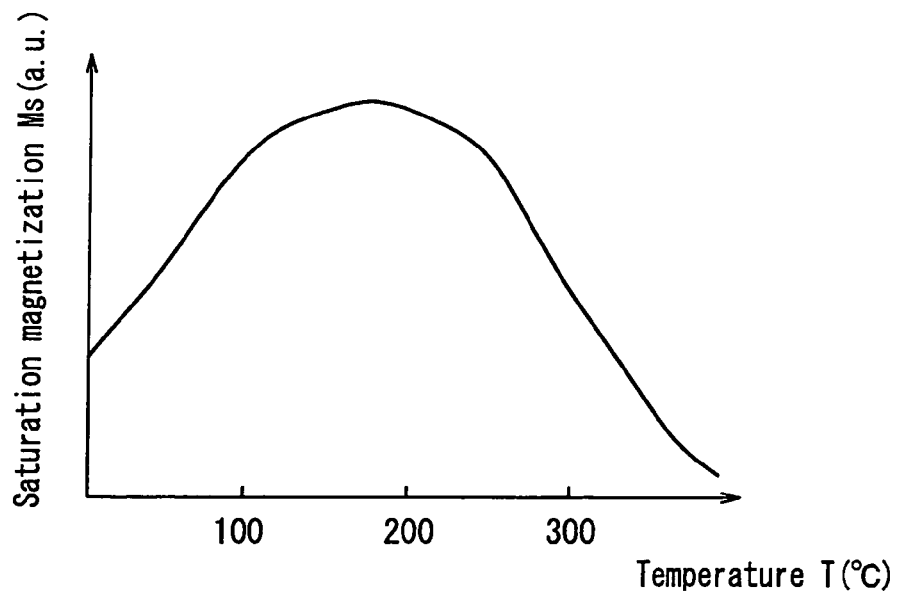
FIG. 9 is a graph showing an example of a relationship between temperature and a value of saturation magnetization in a magnetic device included in a memory cell of the present invention.

In general, a value of saturation magnetization ($M_s$) of a magnetic material changes depending on temperature, and particularly for a case of a ferrimagnetic material, it is maximized in an inherent temperature range. FIG. 9 shows an example of a change in values of saturation magnetization ($M_s$) of a magnetic material with respect to temperature T (° C.). According to the example shown in FIG. 9, the saturation magnetization value is maximized at about 180° C. It is considered that, for a magnetic device 2 having magnetization in a direction perpendicular to a face facing the magnetoelectric converting part 4, a magnetic flux 7 generated from the magnetic device 2 and acting on the magnetoelectric converting part 4 becomes bigger as the saturation magnetization value of the magnetic material included in the magnetic device 2 is increased. Therefore, in the magnetic device 2 containing the magnetic material as shown in FIG. 9, the magnetic flux 7 is considered to be maximized at about 180° C. That is, by providing a magnetic device including the magnetic material as shown in FIG. 9, the memory cell 1 having characteristics less degraded even at a high temperature of about 180° C. can be provided. In this manner, by selecting the magnetic material to be included in the magnetic device 2, the saturation magnetization value of the magnetic device with respect to temperature will be controlled, and thus a memory cell 1 having various temperature characteristics can be provided. For example, the temperature at which the value of saturation magnetization of the magnetic device is maximized can be 0° C. or lower. When such a magnetic device is used, the thus obtained memory cell 1 can have characteristics with less degradation, even at low temperature of 0° C. or lower, and have excellent environment-resistant characteristics.

Figure 10:
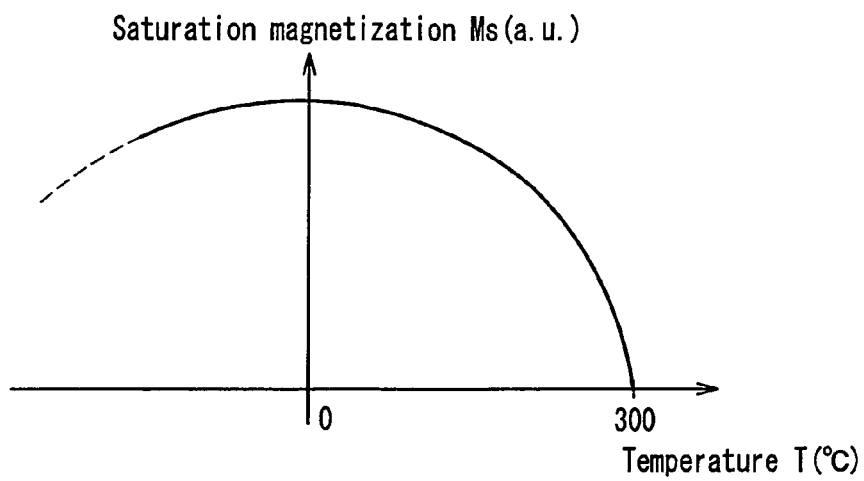
FIG. 10 is a graph showing another example of a relationship between temperature and a value of saturation magnetization in a magnetic device included in a memory cell of the present invention.
Figure 11:
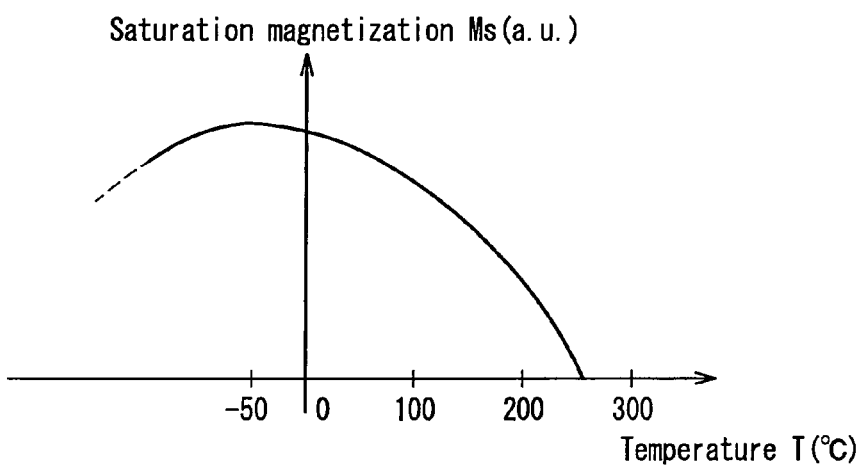
FIG. 11 is a graph showing a separate example of a relationship between temperature and a value of saturation magnetization in a magnetic device included in a memory cell of the present invention.
Figure 12:
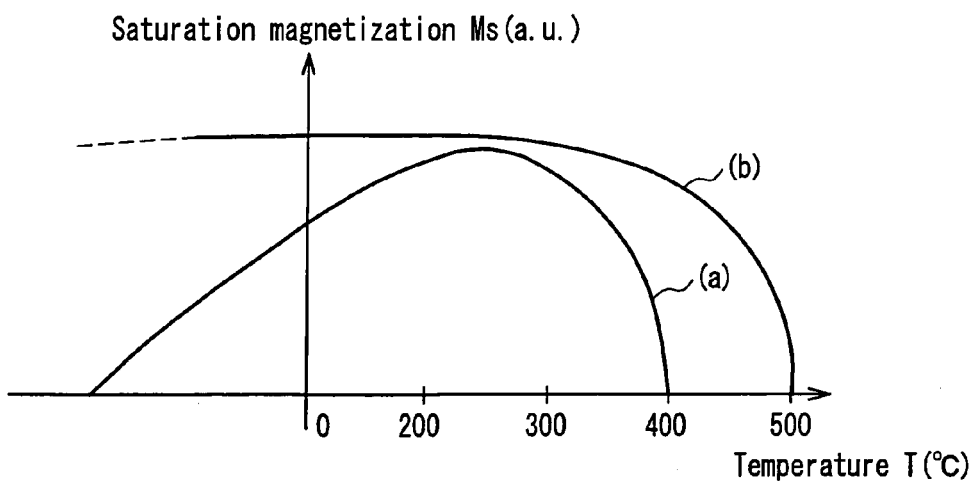
FIG. 12 is a graph showing a separate example of a relationship between temperature and a value of saturation magnetization in a magnetic device included in a memory cell of the present invention.

FIGS. 10-12 show a separate example regarding a change in the value of saturation magnetization ($M_s$) of a magnetic material with respect to temperature.

In the example as shown in FIG. 10, the saturation magnetization is maximized at about 0° C. In the example as shown in FIG. 11, the saturation magnetization is maximized at about −50° C. FIG. 12 shows also that an example (a) of a magnetic material whose saturation magnetization is maximized at about 120° C. and an example (b) of a magnetic material whose saturation magnetization is substantially constant until the temperature reaches about 250° C. and whose Curie point is 500° C. or higher. As mentioned above, in the example of magnetic materials as shown in FIG. 10, a magnetic flux that is generated from the magnetic device 2 at about 0° C. and acts on the magnetoelectric converting part 4 is considered as increased the most. Therefore, by providing the magnetic device 2 including the magnetic materials as shown in FIG. 10, the magnetoelectric converting part 4 will have a detection sensitivity that is best at about 0° C. and the degradation in the characteristics of the thus obtained memory cell 1 can be decreased. Similarly, when the magnetic device 2 includes the magnetic materials as shown in FIG. 11, the thus obtained memory cell 1 can have characteristics that are excellent at a low temperature of not higher than about −40° C. When the magnetic device 2 includes the magnetic material as shown in FIG. 12, the thus obtained memory cell can have characteristics that are excellent at a temperature of about 100° C. or higher.

Examples of the magnetic materials exhibiting changes in the saturation magnetization as shown in FIGS. 10 and 11 are TbFeCo, TbDyFeCo or the like having a transition metal rich composition. Examples of the magnetic materials exhibiting a change in the saturation magnetization as shown in FIG. 12 are TbFeCo, GdTbFeCo or the like having a rare-earth element rich composition. Alternatively, in the memory cell 1 of the present invention, the magnetic device 2 can be formed by combining plural magnetic materials different from each other in the temperature at which the saturation magnetization is maximized. The ratio for combining the different magnetic materials can be set arbitrarily in accordance with the characteristics required for the magnetic device 2.

For the memory cell 1 of the present invention, the Curie point of the magnetic device 2 can be 100° C. or higher, and preferably, it can be 300° C. or higher. When such a magnetic device 2 is used, the thus obtained memory cell can have excellent characteristics even when being used in a high-temperature circumstance of 80° C. or higher. Specifically for example, the magnetic device 2 can include magnetic materials such as TbFeCo and GdTbFeCo.

The memory cell 1 of the present invention can be capable of erasing recorded information by selecting the type of magnetic materials included in the magnetic device 2 and applying high temperature of not lower than the Curie point of the magnetic device 2. In this case, when the element is cooled again to a temperature of the Curie point or lower, the memory cell will be applicable again. For example, in a case where the Curie point of the magnetic device 2 is 100° C., information recorded in the element can be erased by applying a temperature of about 100° C. or higher. For the thus obtained memory cell 1, a batched erase of information can be carried out easily.

Figure 13:
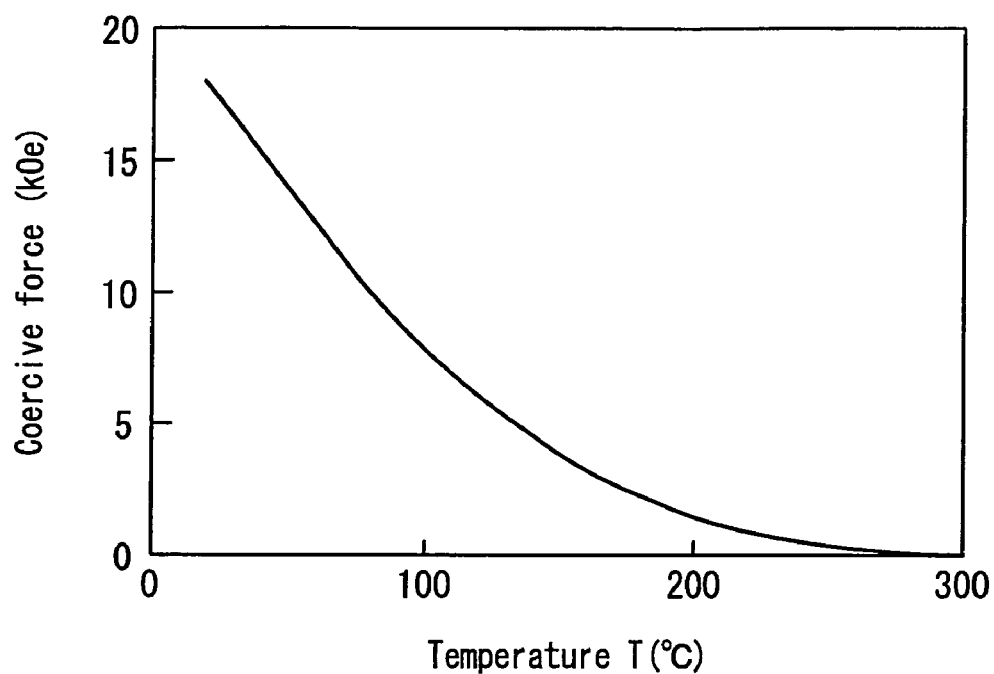
FIG. 13 is a graph showing an example of a relationship between temperature and a value of coercive force in a magnetic device included in a memory cell of the present invention.

In the memory cell 1 of the present invention, a magnetic device 2 whose coercive force is decreased with a temperature rise within a predetermined temperature range can be used. FIG. 13 shows an example of a change in the coercive force value of a magnetic device with respect to temperature T (° C.). The magnetic device shown in FIG. 13 exhibits a tendency for the coercive force to be decreased as the temperature rises from around a room temperature. At this time, the saturation magnetization $M_s$ of the magnetic device 2 exhibits a temperature characteristic as shown in FIG. 9. In such a memory cell 1, as the coercive force of the magnetic device 2 is decreased by raising the temperature of the magnetic device 2, the magnetization state of the magnetic device 2 can be changed with a smaller magnetic field. That is, by raising the temperature of the magnetic device 2, recording information in the memory cell further can be facilitated. In the case of lowering the temperature of the magnetic device 2 after recording information in the magnetic device 2, the coercive force of the magnetic device 2 is increased with the temperature lowering. Therefore, the magnetization state of the magnetic device 2 will not change easily with respect to the magnetic field from outside. That is, the memory cell 1 can be more stable and non-volatile. For these reasons, a memory cell 1 having excellent non-volatile property and recording characteristics and also saving power can be provided.

For such a magnetic device 2, there is no particular limitation about the change in the coercive force with respect to temperature. For example, as shown in FIG. 13, the coercive force of the magnetic device can be decreased continuously with the rise in the temperature. Alternatively, the coercive force of the magnetic device can be decreased stepwise (there are thresholds in decrease of the coercive force) with the rise in the temperature. When the coercive force is decreased with the rise in the temperature, the coercive force can be increased temporarily. The increase/decrease of the coercive force with the rise/fall of the temperature can exhibit hysteresis.

The decrease in the coercive force of the magnetic device 2 with the rise in temperature is not essential for all the temperature range, as long as the coercive force of the magnetic device 2 is decreased with a rise in temperature in a particular temperature range. In the example as shown in FIG. 13, the coercive force of the magnetic device 2 tends to decrease in a temperature range of not lower than a room temperature. Therefore, by raising the temperature of the magnetic device 2 from the room temperature to about 120° C. for example, recording of information by a magnetic field of at most about one-third in a comparison with a case of room temperature becomes possible, and for such a memory cell 1, recording of information will be easier. In other words, in a temperature range of about 120° C. or lower, the memory cell 1 can have a more excellent nonvolatile property. For example, by using a magnetic device 2 that exhibits a tendency that the coercive force is decreased in a temperature range of 100° C. or higher, a memory cell 1 having a more excellent non-volatile property in a temperature range of about 100° C. can be provided.

In the magnetic device 2, specific changes in the coercive force with respect to temperature and specific values of the coercive force or the like can be set arbitrarily in accordance with the characteristics required for the memory cell 1. In recording information, the coercive force of the magnetic device 2 is at most $2.4 \times 10^5$ A/m (at most 3 kOe) for example, preferably in a range of about $4 \times 10^3$ A/m to about $1.5 \times 10^4$ μm. When holding information in a non-volatile state, the coercive force of the magnetic device 2 is at least $4 \times 10^4$ A/m (at least 500 Oe) for example, preferably, in a range of about $1 \times 10^5$ A/m to about $2 \times 10^6$ A/m. When a difference in the coercive force in comparison between recording information and holding information is in a range of about $1 \times 10^4$ A/m to about $1 \times 10^6$ A/m for example, the memory cell 1 can have more excellent non-volatile property and recording characteristics.

The method for raising the temperature of the magnetic device 2 is not limited particularly. For example, a current can be applied to the magnetic device 2 for raising the temperature. Alternatively, the wiring 16 included in the magnetic field generating part 3 is applied with a current for raising the temperature of the wiring 16, and the thus generated heat is conducted to the magnetic device 2 so as to raise the temperature of the magnetic device 2. For this purpose, the magnetic device 2 and/or the wiring 16 should be composed of a material having electrical resistance of a certain level. The examples include Fe, Ni, Cr, Pt, Mo, Ta, Ti, W, C, SiC, or a compound containing any of the elements. Currents can be applied to both the magnetic device 2 and the wiring 16. Applying current to the wiring 16 is preferred since the structure of the magnetic field generating part 3 can be used (e.g., a current fed to the wiring 16 for the purpose of applying a magnetic field to the magnetic device 2 can be used directly for heating the wiring 16). From an aspect of thermal efficiency, the wiring 16 is preferably a coiled wiring 17 that is wound around the magnetic device 2.

In the memory cell 1 of the present invention, the magnetization direction of the magnetic device 2 can have an angle with respect to a face of the magnetic device 2 that faces the magnetoelectric converting part 4. Also it can have a magnetic flux component in a direction perpendicular to a face of the magnetic device 2 that faces the magnetoelectric converting part 4. In other words, in a case where the magnetoelectric converting part 4 includes a magnetoelectric converting element, the magnetic device 2 can have a magnetic flux component in a direction perpendicular to the direction of the current flowing in the magnetoelectric converting element. More specifically, the current flowing in the magnetoelectric converting element denotes, for example, a current flowing between the drain electrode 13 and the source electrode 11 in the MOS transistor as shown in FIG. 4. The direction perpendicular to the direction of the current flowing in the magnetoelectric converting element denotes, for example, a direction perpendicular to a face including the drain electrode 13 and the source electrode 11 in the MOS transistor as shown in FIG. 4.

As mentioned above, the electric characteristics of the magnetoelectric converting part change as a result of the interaction between the current flowing in the magnetoelectric converting part and the magnetic flux generated from the magnetic device. The interaction is maximized when the current-flowing direction and the magnetic flux direction cross at right angles. Therefore, by providing such a magnetic device 2, the memory cell 1 can have a magnetoelectric converting part with a greater change in the electric characteristics and also excellent reading characteristics.

In the memory cell 1 of the present invention, the magnetic device 2 can be coated with a film of metal such as TiN, Mn, TiAlN, Pt, W, Ti and TiW, an alloy film and a ceramic film. These films serve to protect the magnetic device 2, suppress reaction between the magnetic device 2 and materials arranged around the magnetic device 2, and also suppress contamination and degradation of the magnetic device 2. At the same time, contamination and degradation of the insulator, wiring, magnetoelectric converting part or the like being arranged around the magnetic device 2 can be suppressed as well. As a result, the memory cell 1 can have more stable characteristics. While the film preferably coats the entire surface of the magnetic device 2, it is allowed to coat only a required region of the surface of the magnetic device 2 from an aspect of the number of process steps in manufacturing. The above-mentioned film can be, for example, a so-called barrier metal.

Figure 14:
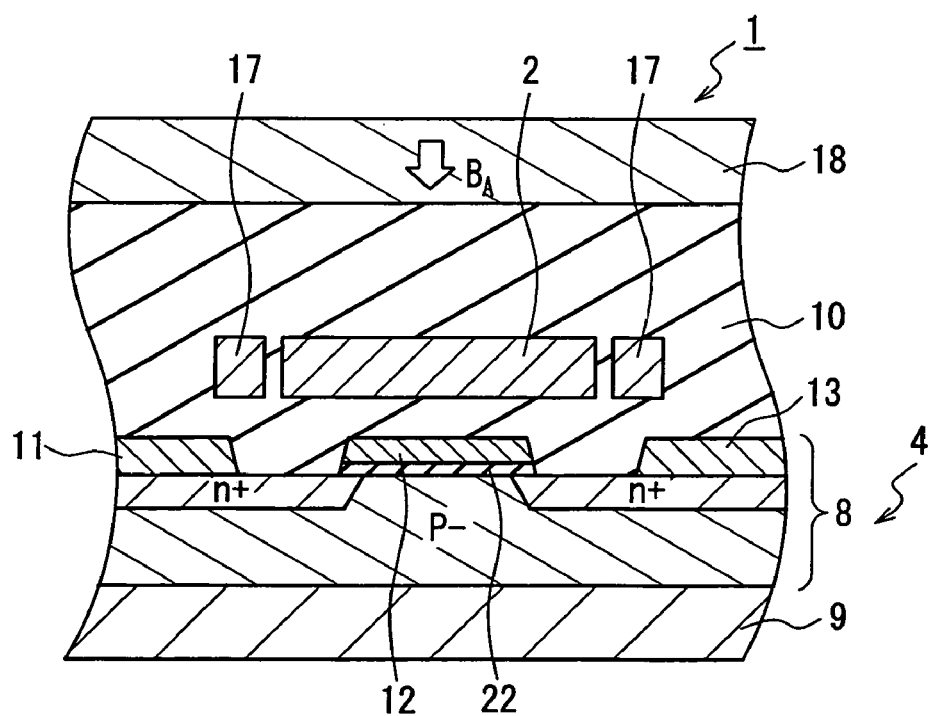
FIG. 14 is a schematic view showing a separate example of a memory cell of the present invention.

A separate example of the memory cell of the present invention is shown in FIG. 14. The memory cell 1 as shown in FIG. 14 further includes a magnetic field generating part 18 for applying an offset magnetic field to the magnetoelectric converting part 4 (hereinafter, this part will be referred to as an offset magnetic field generating part). Thereby, the magnetoelectric converting part 4 will have an improved change of the electric output, and the thus obtained memory cell 1 will have excellent reading characteristics. Here, the offset magnetic field and the effects will be described.

The offset magnetic field in the present invention denotes a magnetic field applied with a constant intensity and direction, to the magnetoelectric converting part 4. One example of the magnetic field is a magnetic flux $B_A$ as shown in FIG. 14. The magnetoelectric converting part 4 as shown in FIG. 14 includes a n-channel MOS transistor 8 for the magnetoelectric converting element. It is considered in general that when a magnetic flux is applied to a transistor, the electric resistance of the transistor changes corresponding to a quadratic curve. An example of the change in the electric resistance of the transistor is shown in FIGS. 15A and 15B.

Figure 15A:
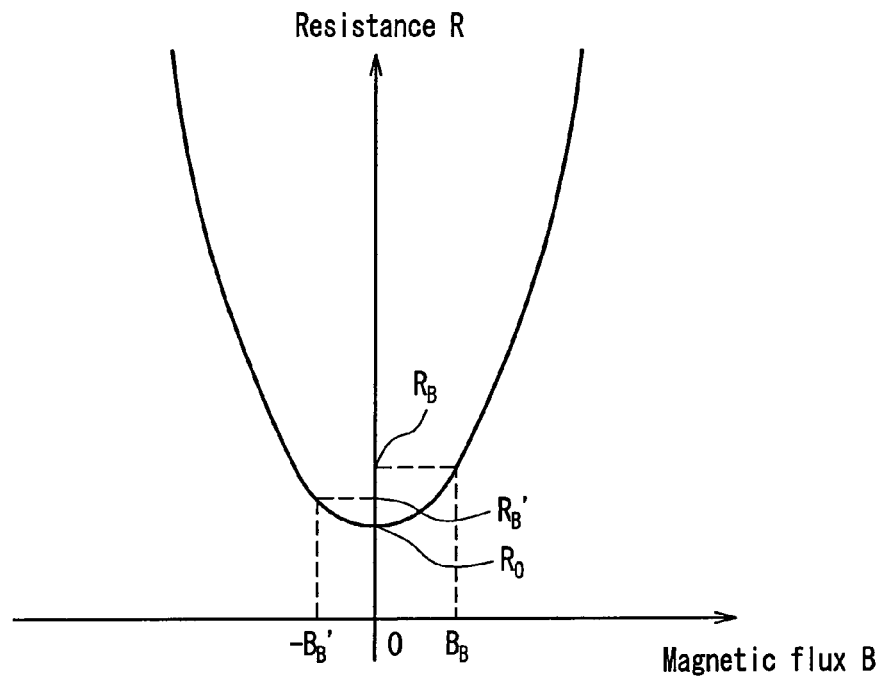
FIGS. 15A and 15B are graphs for illustrating an offset magnetic field.
Figure 15B:
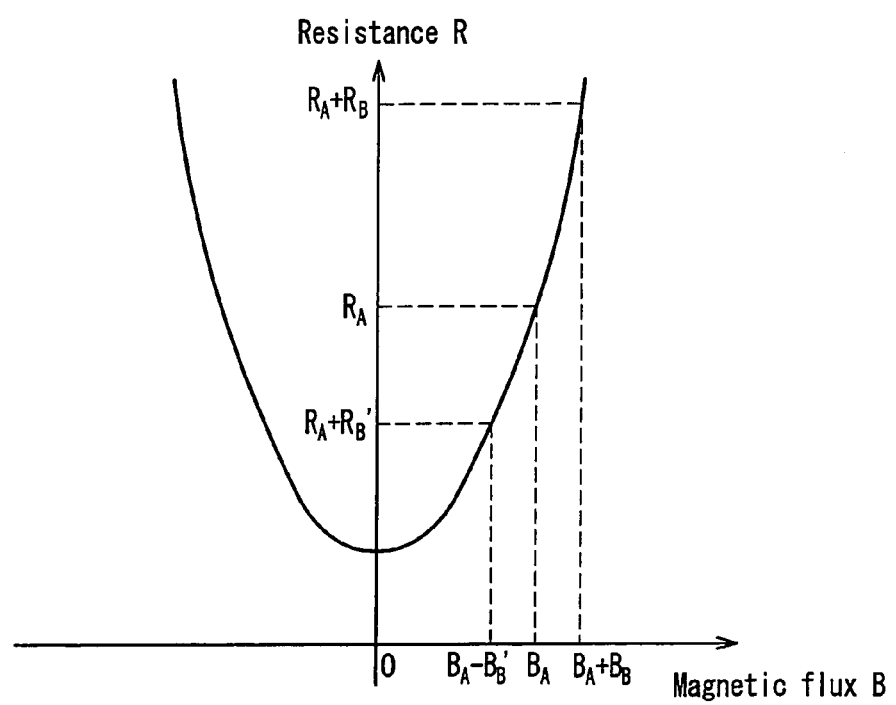

Here, when the magnetic flux applied from the magnetic device 2 to the transistor 8 is changed in a range from $B_B$ to $-B_{B'}$ (here, a direction of the magnetic flux $B_A$ is regarded as a normal direction, and the magnetic fluxes $B_A$, $B_B$ and $B_{B'}$ are applied in a direction perpendicular to a current flowing in the transistor), in a case where the offset magnetic field is not applied, a resistance change rate $\Delta R$ of the transistor will be obtained at around the original point of the quadratic curve as shown in FIG. 15A (i.e., $\Delta R=|R_B-R_{B'}|/R_0$). On the contrary, in a case where the magnetic flux $B_A$ as an offset magnetic field is applied to the transistor, as shown in FIG. 15B, a resistance change rate $\Delta R$ of the transistor is obtained radially from a point being offset from the original point of the quadratic curve by the magnetic flux of $B_A$ (i.e., $\Delta R=((R_A+R_B)-(R_A-R_{B'}))/R_A$). The change rate of the quadratic curve is increased as it is separated further from the original point. Therefore, even in a case where the change amount of the magnetic flux applied from the magnetic device 2 to the transistor 8 is the same, a larger resistance change rate can be obtained when the offset magnetic field is applied to the transistor 8.

The direction and intensity of the offset magnetic field $R_A$ are not limited particularly. They can be set arbitrarily in accordance with the magnetic characteristics of the magnetic device 2, the distance from the magnetoelectric converting part 4, or the like. For example, it can be a magnetic flux that has components in a direction perpendicular to a face of the magnetic device 2 facing the magnetoelectric converting part 4. That is, when the magnetoelectric converting part 4 includes a magnetoelectric converting element, the magnetic flux can have components in a direction perpendicular to a direction of a current flowing in the magnetoelectric converting element. The intensity of the components can be, for example, in a range of about 10 mT to about 10 T (tesla).

The position of the offset magnetic field generating part 18 is not limited particularly as long as it does not hinder the magnetic flux 7, which is generated from the magnetic device 2, from reaching the magnetoelectric converting part 4, and also it does not hinder the magnetic field applied from the magnetic field generating part 3 to the magnetic device 2. For example, as shown in FIG. 14, it can be arranged so that the magnetic device 2 is interposed between the offset magnetic field generating part 18 and the transistor 8 as the magnetoelectric converting part 4. In this case, the offset magnetic field can be applied to the magnetoelectric converting part 4 more efficiently, and thus the memory cell 1 can have excellent reading characteristics. Also in this case, the size (e.g., film thickness) of the offset magnetic field generating part 18 can be set arbitrarily, and thus a required offset magnetic field can be obtained easily.

The configuration and structure of the offset magnetic field generating part 18 are not limited particularly as long as an offset magnetic field of a constant intensity and direction can be applied to the magnetoelectric converting part 4. For example, the offset magnetic field generating part 18 can include a ferromagnetic device having a magnetic flux component in a direction perpendicular to a face of the magnetic device 2 facing the magnetoelectric converting part 4. That is, in a case where the magnetoelectric converting part 4 includes a magnetoelectric converting element, the offset magnetic field generating part 18 can include a ferromagnetic device having a magnetic flux component in a direction perpendicular to a direction of a current flowing in the magnetoelectric converting element. In this case, electric power for generating the offset magnetic field is not required, and the power consumption of the memory cell can be reduced. The ferromagnetic device is not limited particularly, and for example, NdFeB, SmFeN and NdFeAl or the like can be used.

Regarding the ferromagnetic device included in the offset magnetic field generating part 18, the magnetization direction can be polarized in one direction. In this case, the offset magnetic field is further stabilized, and thus the memory cell 1 can have more stable characteristics.

Figure 16:
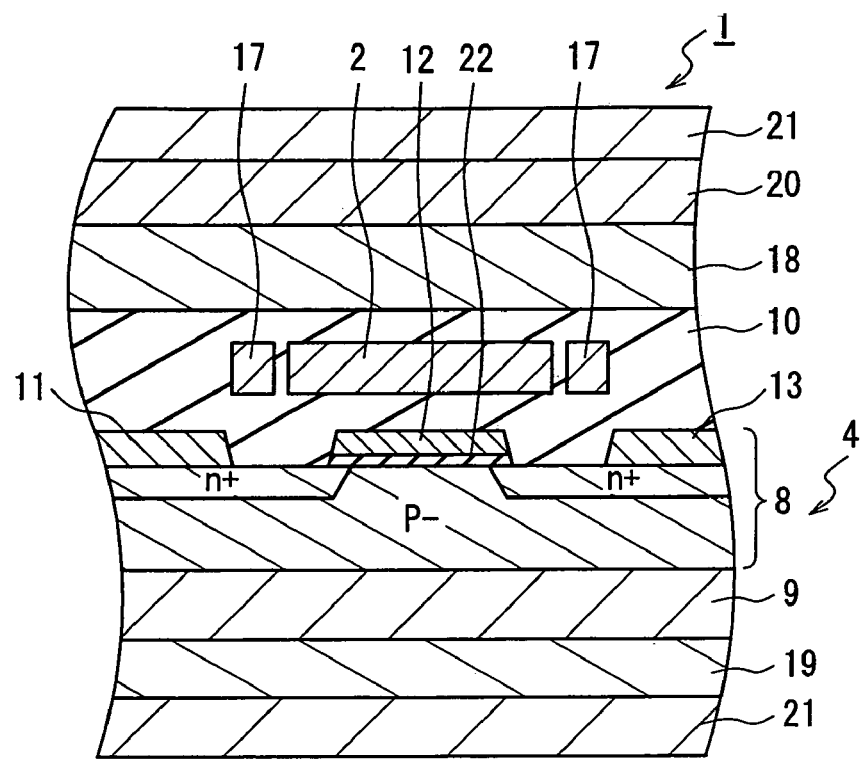
FIG. 16 is a schematic view showing a separate example of a memory cell of the present invention.

Another example of the memory cell of the present invention is shown in FIG. 16. The memory cell 1 as shown in FIG. 16 includes further a stem 19 made of a soft magnetic device and a shield 20 made of a soft magnetic device. The stem 19 is arranged on a face of a semiconductor substrate 9, opposing the magnetoelectric converting part 4 and the magnetic device 2, and the shield 20 is arranged in the offset magnetic field generating part 18, opposing the face facing the magnetoelectric converting part 4 and the magnetic device 2. In such a memory cell 1, a closed magnetic circuit including the shield 20 and the stem 19 can be formed, and thus a leakage flux to outside can be reduced. The thus obtained memory cell 1 has resistance to external noise or the like, and also has excellent characteristics.

The size of the region on which the stem 19 and the shield 20 are arranged is not limited particularly. It can be set arbitrarily as required. For example, the stem 19 and the shield 20 can be arranged to cover the memory cell 1 entirely, or the transistor 8 entirely. The stem 19 and the shield 20 are not always required to make a pair, but either of them can be provided alone.

The position for arranging the stem 19 is not limited particularly as long as the functions of the memory cell 1 can be maintained. For example, it can be arranged on a face of the magnetoelectric converting part 4, opposing the magnetic device 2. Similarly, the position for arranging the shield 20 is not limited particularly as long as the functions of the memory cell 1 can be maintained. For example, it can be arranged so that the magnetic device 2 is interposed between the shield 20 and the magnetoelectric converting part 4.

The thicknesses of the stem 19 and the shield 20 are not limited particularly. The thicknesses of regions in the vicinity of the magnetic device 2 can be made different from the thicknesses of the remaining regions.

The materials used for the stem 19 and the shield 20 are not limited particularly. The examples can include Fe, an alloy such as permalloy containing at least one ingredient selected from Fe, Co and Ni, and mixed materials.

In the memory cell 1 as shown in FIG. 16, a package 21 is arranged for surrounding the whole. By arranging the package 21, it will be possible, for example, to provide a shock resistance to the entire memory cell and suppress invasion of dust or the like into the memory cell. Materials for the package 21 are not limited particularly. For example, epoxy acrylate resin, urethane resin, ultraviolet-curable resin, thermosetting resin, and hot melt base adhesives can be used. These materials can be combined in use.

Figure 17:
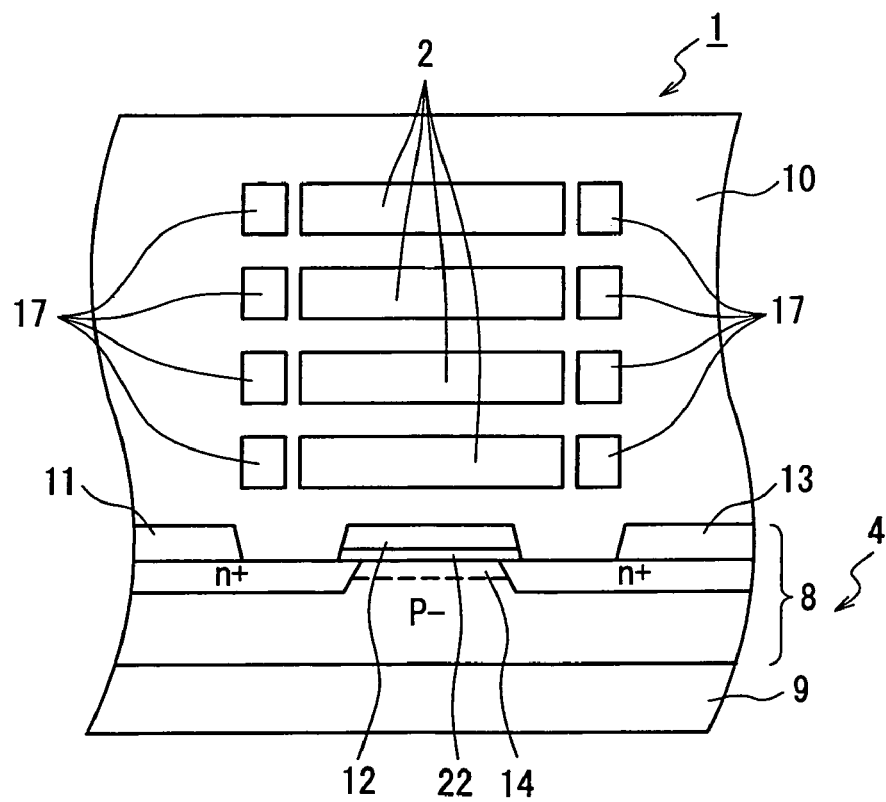
FIG. 17 is a schematic view showing a separate example of a memory cell of the present invention.

A separate example of the memory cell of the present invention is shown in FIG. 17. The memory cell 1 as shown in FIG. 17 includes a plurality of magnetic devices 2. The magnetoelectric converting part 4 includes a transistor 8 as a magnetoelectric converting element whose electric characteristics vary in accordance with the state of the magnetic field to be detected. The transistor 8 is arranged in the vicinity of the plural magnetic devices 2 in order to detect the magnetic fluxes generated from the magnetic devices 2. In other words, the magnetic devices 2 are laminated in a direction perpendicular to a face of the transistor 8 including the drain electrode 13 and the source electrode 11. Moreover, an insulator 10 is arranged between the respective magnetic devices 2. The memory cell 1 includes coiled wirings 17 as magnetic field generating parts corresponding to the respective magnetic devices 2. In the thus configured memory cell 1, the magnetization states of the respective magnetic devices 2 can be controlled individually by means of the wirings 17 corresponding to the respective magnetic devices 2. Also, each magnetic device can record information of at least 1 bit. Therefore, the memory cell 1 can correspond to a trend of multi-bits or multi-values.

In the memory cell 1 as shown in FIG. 17, the thickness of the magnetic device 2 (i.e., thickness in a direction perpendicular to the face facing the transistor 8) is, for example 1 nm to 100 μm. A distance between the magnetic devices 2 is, for example, 1 nm to 10 μm.

Arrangement of the plural magnetic devices 2 is not limited to the example as shown in FIG. 17, as long as the transistor 8 as a magnetoelectric converting element and the magnetic fluxes 7 generated from the magnetic devices 2 can interact with each other.

The magnetic field generating part is not limited particularly to the coiled wiring 17 as shown in FIG. 17, as long as it can change the magnetization states of the respective magnetic devices 2. For example, a simple wiring can be used. Alternatively, instead of arranging a wiring 17 corresponding to each of the magnetic devices 2, the magnetic devices 2 can be classified into some groups and wirings 17 corresponding to the respective groups can be arranged. Though the insulator 10 is arranged between the magnetic devices 2 according to the example shown in FIG. 17, a layer having a separate function can be arranged as required. The layer is not limited to a single layer, but a plurality of layers having different characteristics can be arranged.

In other words, the memory cell 1 as shown in FIG. 17 can be defined as a memory cell where the magnetoelectric converting element includes the transistor 8, and a plurality of magnetic devices 2 are arranged with respect to the channel 14 of the transistor 8. Here, the expression "the magnetic devices 2 and the channel 14 correspond to each other" denotes that the magnetic devices 2 and the channel 14 of the transistor 8 are positioned to interact with each other. At this time, the magnetic property of the magnetic devices 2 corresponding to the channel 14 can vary in accordance with the distance from the channel 14 (it can be also a distance from the magnetoelectric converting part 4, the magnetoelectric converting element or the transistor 8). As mentioned above, because of the interaction between the magnetic devices 2 (the magnetic fluxes 7 generated from the magnetic devices 2) and the channel 14 of the transistor 8, information recorded in the magnetic devices 2 can be read out in the memory cell 1 of the present invention. In a case where plural magnetic devices 2 are arranged as shown in FIG. 17, the interaction may be weakened as the distance from the channel 14 is increased. The memory cell 1 can have more excellent characteristics by arranging magnetic devices 2 having magnetic properties that vary in accordance with the distance from the channel 14, more specifically for example, by arranging magnetic devices 2 so that the magnetic devices 2 that generate more intensified magnetic fluxes 7 will be positioned farther from the channel 14.

Figure 18A:
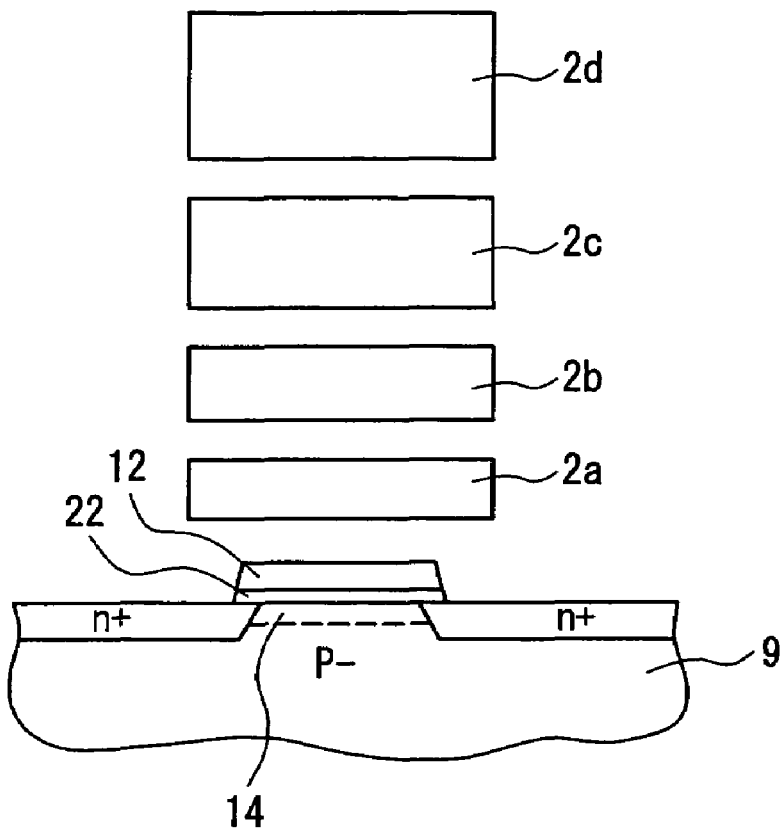
FIGS. 18A and 18B are schematic views showing a separate example of a memory cell of the present invention.
Figure 18B:
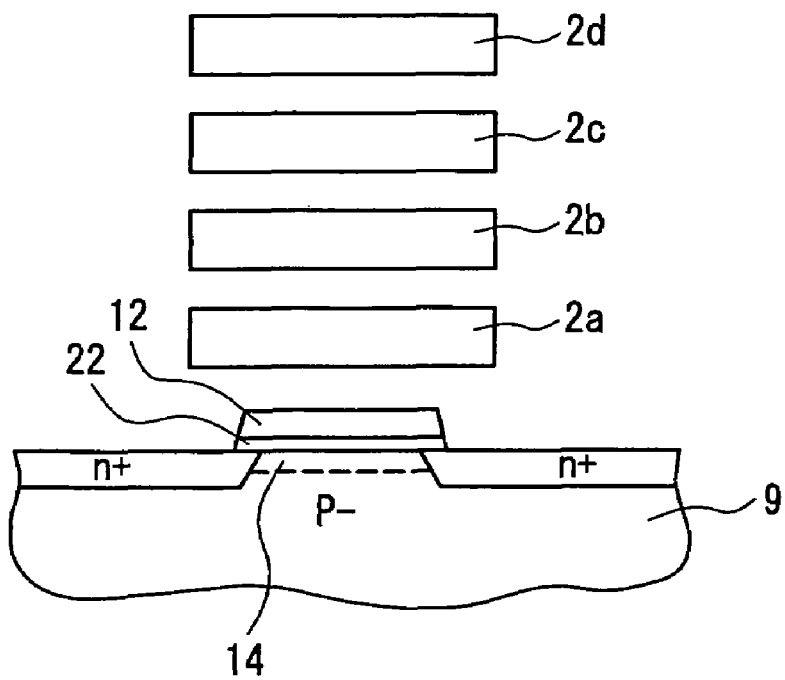

For example, as shown in FIG. 18A, magnetic devices 2a-2d whose thickness (or volume) varies in accordance with the distance from the channel 14 can be arranged. Alternatively, as shown in FIG. 18B, magnetic devices 2a-2d having varied saturation magnetizations can be arranged.

The trend for the change in the magnetic property is not limited particularly. For example, a plurality of magnetic devices 2 can be arranged so that the thickness of the magnetic devices 2 is decreased as the distance from the channel 14 is increased, and vice versa as shown in FIG. 18A. The setting can be carried out arbitrarily in accordance with the characteristics required for the memory cell 1. Members not shown in any of FIGS. 18A and 18B are same as those in FIG. 17.

Figure 19:
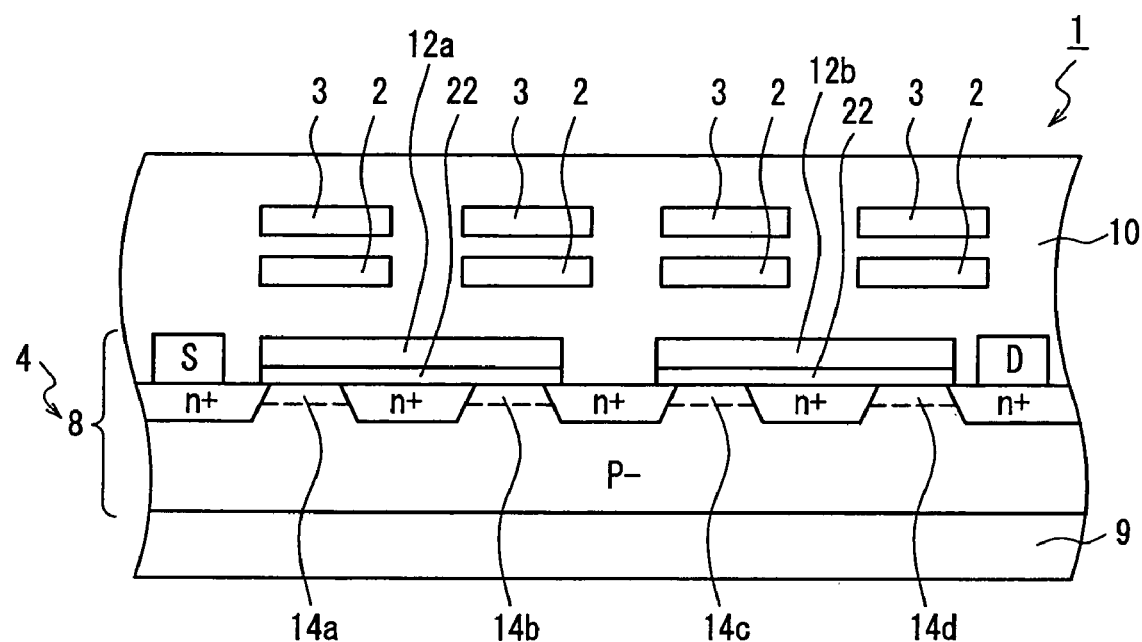
FIG. 19 is a schematic view showing a separate example of a memory cell of the present invention.

A separate example of the memory cell of the present invention is shown in FIG. 19. The memory cell as shown in FIG. 19 includes a plurality of magnetic devices 2. The magnetoelectric converting part 4 includes a transistor 8 as a magnetoelectric converting element whose electrical characteristics vary in accordance with the state of the magnetic field to be detected. The transistor 8 is arranged in the vicinity of the plural magnetic devices 2 in order to detect magnetic fluxes generated from the plural magnetic devices 2. Here, the transistor 8 is arranged above the plurality of channels 14a-14d that correspond to the plural magnetic devices 2 and at least two channels (the channels 14a and 14b correspond to the at least two channels, and so are for the channels 14c and 14d), and includes a gate electrode (a gate electrode 12a corresponding to the channels 14a and 14b, and similarly a gate electrode 12b corresponding to the channels 14c and 14d) for corresponding to the at least two channels. Furthermore, since the electric characteristics (e.g., electric resistance) of the channels 14a-14d vary in accordance with information recorded in the magnetic devices 2, the electric characteristics of the transistor 8 vary. The transistor 8 is formed on a surface of a semiconductor substrate 9. In FIG. 19, S denotes a source electrode and D denotes a drain electrode. These signs may be employed similarly in the subsequent drawings. In the case of a normally-off transistor 8, the channels 14a-14d are regions formed by applying a voltage of not less than a predetermined value to the gate electrode 14.

For a semiconductor memory as a typical memory for a conventional technique, it is required to provide at least one gate electrode per unit information (1 bit) (i.e., per channel), and thus sharing a gate electrode among plural channels has been difficult. In a SRAM, theoretically, four to six transistors are required for 1 bit of information. For these reasons, in a conventional memory, there is a limitation for further integration. Moreover, when a cell is fine-processed in Flash Memory, the number of electrons accumulated in the floating gate is decreased, and thereby environment-resistant characteristics such as the temperature characteristics of the cell are degraded. For this reason, there is a limitation for further fine-processed integration.

On the other hand, as shown in FIG. 19, since the magnetic device 2 for recording information and the magnetoelectric converting part 4 for reading information recorded in the magnetic device 2 are provided independently in the memory cell 1 of the present invention, the gate electrode 12 can be shared among the plural channels 14. Thereby, wirings to the gate electrode 12 can be decreased to simplify the wirings in the memory cell 1. That is, by using the memory cell 1 of the present invention, further integrated memory can be formed. Furthermore, in a case where the transistor 8 is a MOS transistor having a gate insulating film 22 arranged between the gate electrode 12 and the semiconductor substrate 9 as shown in FIG. 19, the area for removing the gate insulating film 22 by means of etching or the like in the manufacturing process can be decreased. The transistor 8 may be damaged to some degree during the etching of the gate insulating film 22 (e.g., due to the etching, the end face of the formed gate insulating film 22 may be degraded, and the end face of the gate electrode 12 may be degraded as well). Since the above-mentioned damage can be suppressed in the memory cell 1 as shown in FIG. 19, the memory cell 1 can have more stable characteristics.

Furthermore, since at least 1 bit of information can be recorded per magnetic device in the memory cell 1 as shown in FIG. 19, multi-bits of information can be detected with one transistor, and thereby a multi-valued memory cell can be provided. In the example as shown in FIG. 19, the memory cell can have 4-values with respect to one transistor and two gate electrodes, for example.

The number of the channels 14 included in one transistor 8 is not limited particularly, and it can be set arbitrarily in accordance with the characteristics required for the memory cell 1. Similarly, the number of the gate electrodes 12 included in one transistor 8 is not limited particularly, and it can be set arbitrarily in accordance with the characteristics required for the memory cell 1. Furthermore, the number of the channels 14 corresponding to one gate electrode 12 is not limited particularly as long as at least one gate electrode 12 corresponds to at least two channels 14.

Figure 20:
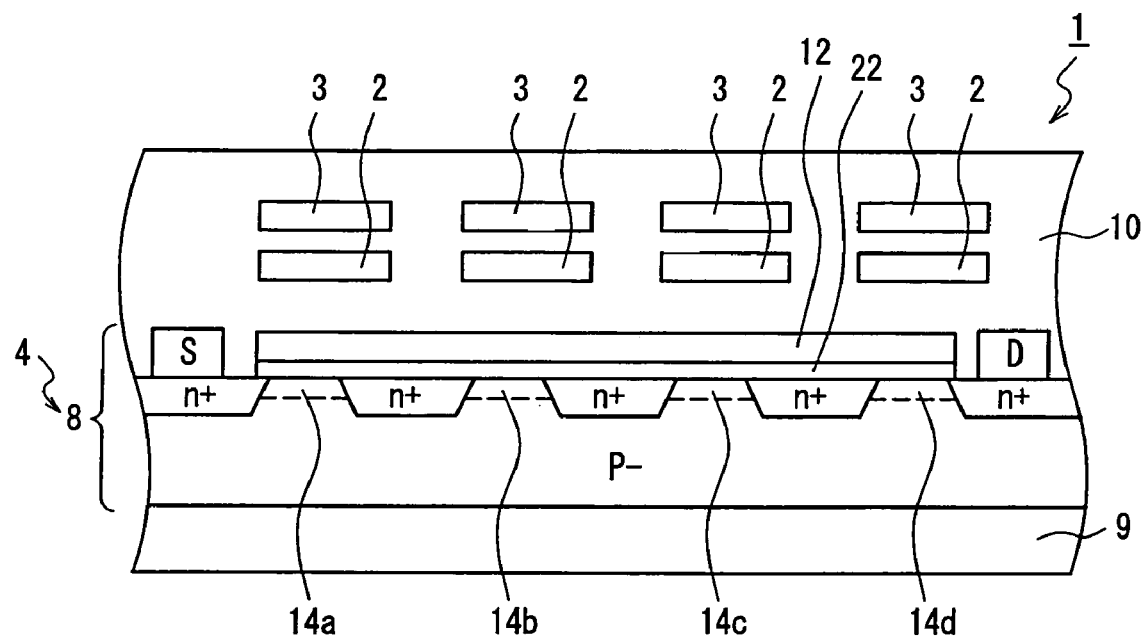
FIG. 20 is a schematic view showing a separate example of a memory cell of the present invention.

A separate example of the memory cell of the present invention is shown in FIG. 20. In the memory cell 1 as shown in FIG. 20, the transistor 8 has one gate electrode 12 that is arranged above a plurality of channels 14a-14d included in the transistor 8. Other than that, the configuration is similar to that of the memory cell 1 as shown in FIG. 19.

In the memory cell, the number of the gate electrodes 12 can be reduced further in comparison with the example as shown in FIG. 19. Therefore, the memory cell 1 can have more stable characteristics, and a further integrated memory can be formed. In the example as shown in FIG. 20, the memory cell can have 4-values for example, with respect to one transistor and one gate electrode.

Figure 21:
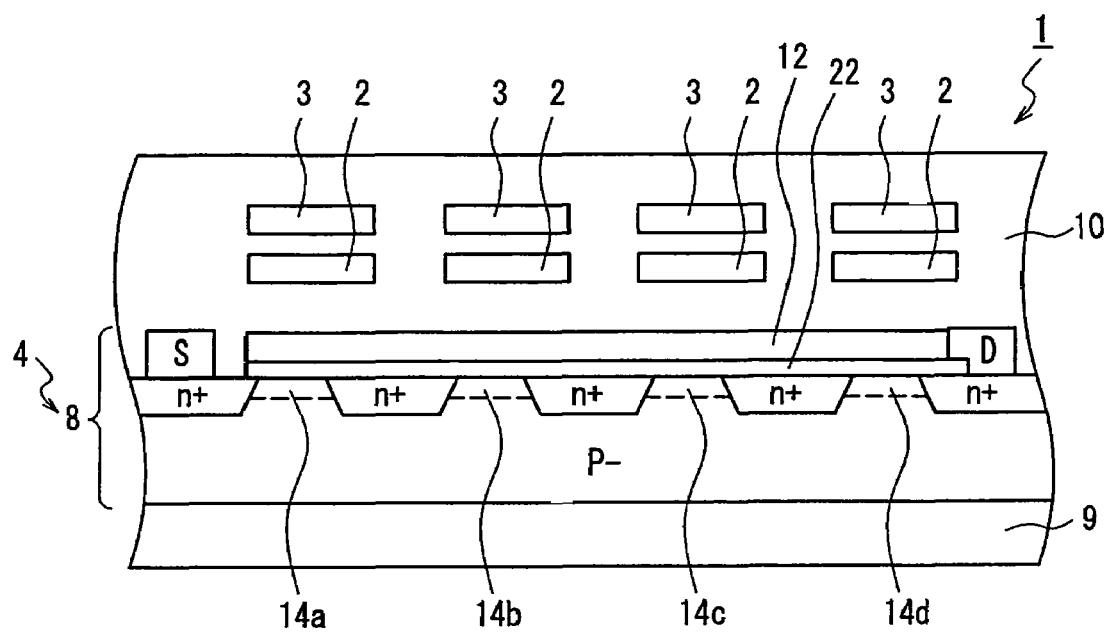
FIG. 21 is a schematic view showing a separate example of a memory cell of the present invention.

A separate example of the memory cell of the present invention is shown in FIG. 21. In the memory cell 1 as shown in FIG. 21, the gate electrode 12 and the drain electrode are common. By commonly using the gate electrode 12 and the drain electrode, the wirings for the memory cell 1 can be simplified further. Here, the gate electrode 12 and the drain electrode is not necessarily required to be integrated completely, as long as they are equipotential.

Figure 22:
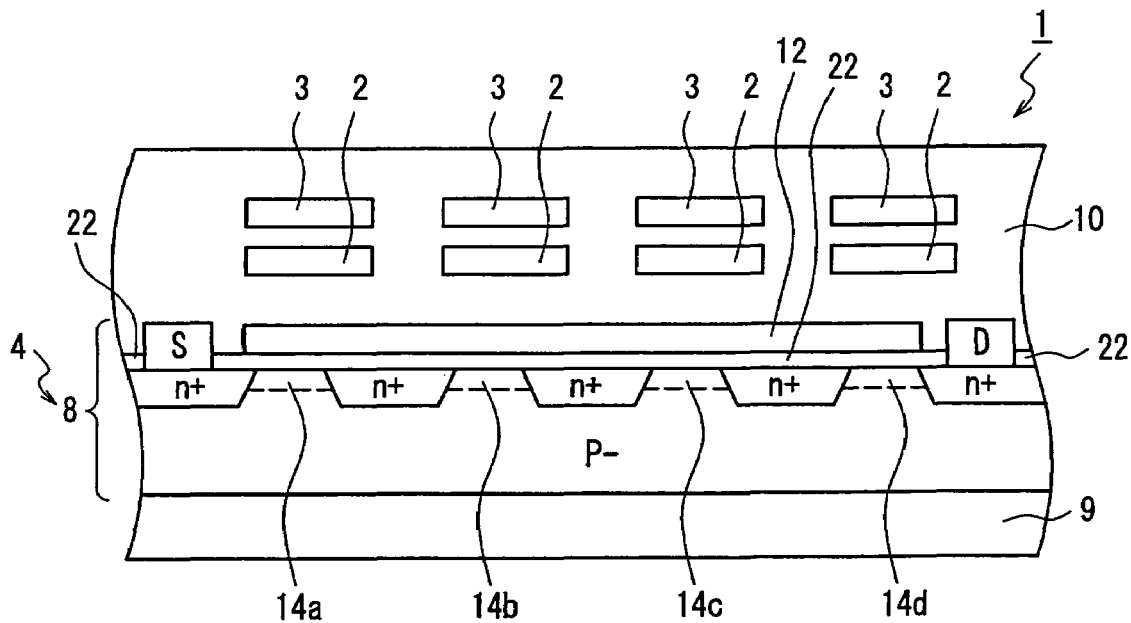
FIG. 22 is a schematic view showing a separate example of a memory cell of the present invention.

A separate example of the memory cell of the present invention is shown in FIG. 22. In the memory cell 1 as shown in FIG. 22, the area of the gate insulating film 22 arranged between the gate electrode 12 and the semiconductor substrate 9 (more specifically, arranged between the gate electrode 12 and the channels 14a-14d) is larger than the area of the gate electrode 12. By making the area of the gate insulating film 22 larger than the area of the gate electrode 12 in this manner, the area of the gate insulating film 22 to be etched in the manufacturing step can be reduced, and thus the memory cell 1 can have more stable characteristics.

In the example as shown in FIG. 22, the gate insulating film 22 is in contact with both the source electrode and the drain electrode. More specifically, the gate insulating film 22 is arranged on the entire surfaces of the p⁻ layer and the n⁺ layer of the transistor 8, excepting the region on which the source electrode and the drain electrode are arranged. The gate insulating film 22 is arranged also on the channels 14a-14d.

Figure 23:
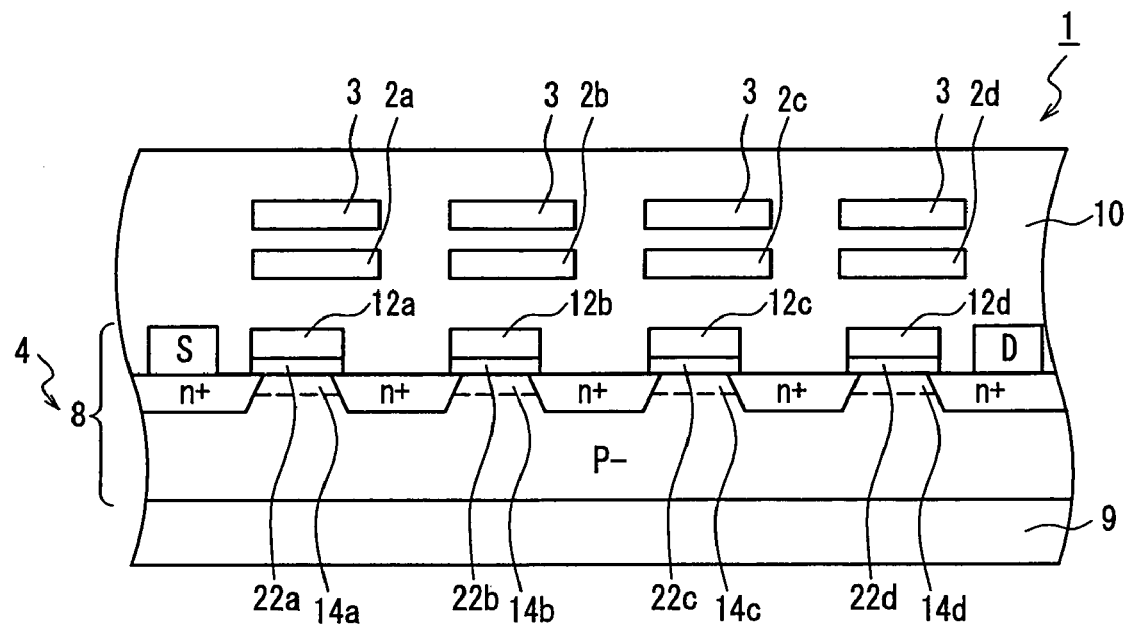
FIG. 23 is a schematic view showing a separate example of a memory cell of the present invention.

A separate example of the memory cell of the present invention is shown in FIG. 23. The memory cell 1 as shown in FIG. 23 includes a plurality of magnetic devices 2. The magnetoelectric converting part 4 includes a transistor 8 as a magnetoelectric converting element whose electric characteristics vary in accordance with the state of the magnetic field to be detected. The transistor 8 is arranged in the vicinity of the plural magnetic devices 2 in order to detect magnetic fluxes generated from the plural magnetic devices 2. Here, the transistor 8 includes a plurality of channels 14a-14d for corresponding to the plural magnetic devices 2 and a plurality of gate electrodes 12a-12d arranged above the respective channels 14a-14d in order to correspond to the respective channels 14a-14d. More specifically, one gate electrode 12 is arranged with respect to one channel 14.

This configuration having a plurality of independent gate electrodes between a pair of source electrode and drain electrode is called also a NAND type. By making the transistor 8 as a NAND type, a multi-bit memory cell 1 can be provided.

In the memory cell 1 as shown in FIG. 23, it is also possible to provide a memory cell 1 changing the valence of the respective magnetic devices 2a-2d by applying various gate voltages selectively to the respective gate electrodes 12a-12d. That is, the memory cell 1 can be provided with further multi-bits, and a further integrated memory can be formed. When applying various gate voltages to the respective gate electrodes 12a-12d, it is not always required to differentiate all the voltages applied to the gate electrodes 12, and there can be combinations of gate electrodes 12 applied with a same voltage. It can be set arbitrarily in accordance with the characteristics required for the memory cell 1.

In the memory cell 1 shown in FIG. 23, the gate insulating film 22 can be arranged on the entire surfaces of the p⁻ layer and the n⁺ layer of the transistor 8 excepting the region where the source electrode and the drain electrode are arranged, just like the memory cell 1 as shown in FIG. 22. In the memory cell 1 as shown in FIG. 23, since the magnetic device 2 includes one layer and the gate number is four, at least 4 bits of information can be recorded. When the magnetization state of the magnetic device 2 is not a simple reversal but a multi-value, the bit numbers can be increased further. For example, when the magnetization state of the magnetic device 2 is set to be four types of states, quadruple number of 16-bit information can be recorded/read.

Figure 24:
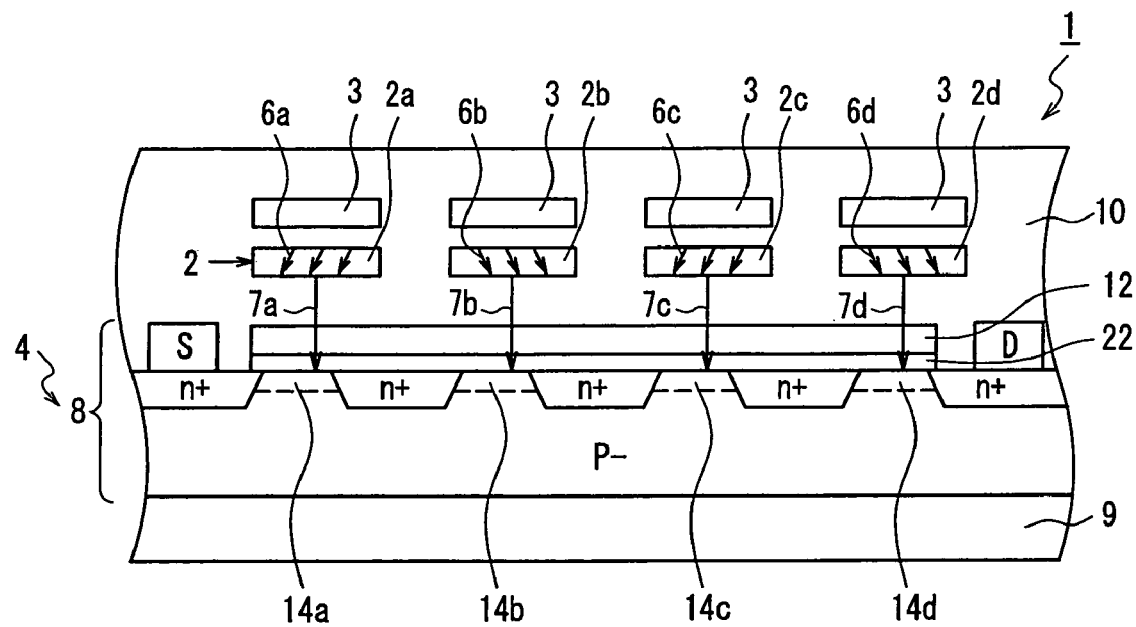
FIG. 24 is a schematic view for illustrating an example of a change in electric output in a memory cell of the present invention.
Figure 25A:
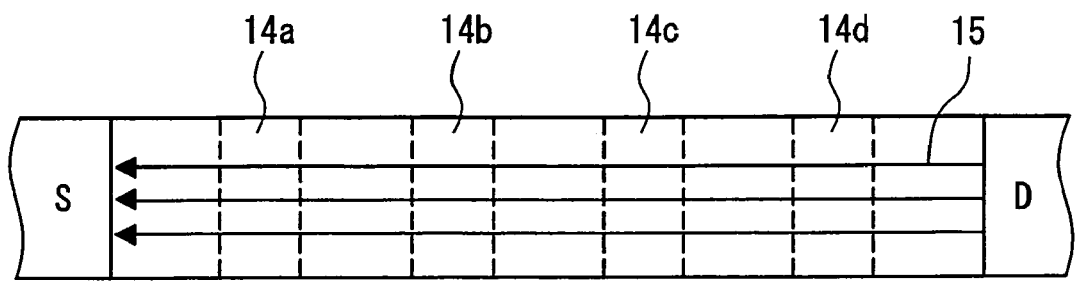
FIGS. 25A and 25B are schematic views for illustrating an example of a change in electric output in a memory cell of the present invention.
Figure 25B:
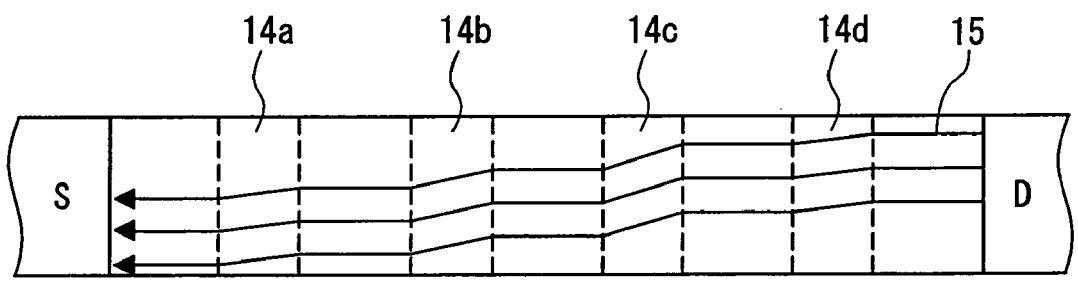

In the transistor 8 having plural channels 14 as shown in FIGS. 19-23, the principle that the transistor 8 has electric resistivity varied by means of the magnetic fluxes 7 generated from the magnetic devices 2 is similar to the principle explained by referring to FIGS. 5A-5C. The memory cell 1 shown in FIG. 24 has a similar configuration to the memory cell 1 shown in FIG. 1. FIGS. 25A and 25B are schematic views of the transistor 8 of FIG. 24 viewed from the side of the magnetic device 2. When a voltage of at least a predetermined value (threshold voltage $V_{th}$) is applied to the gate electrode 12, four channels 14a-14d are formed in the p⁻ region in the vicinity of the gate electrode 12. As in the case of FIG. 5A, when the magnetic fluxes 7a-7d generated from the magnetic devices 2a-2d are not applied to the channels 14a-14d, the current 15 flows toward the source electrode substantially straight via the channels 14a-14d, as shown in FIG. 25A. On the other hand, when the magnetic fluxes 7a-7d are applied to the transistor 8, the magnetic flux 7 and the current 15 interact with each other, thereby changing the direction of the current-flow, as shown in FIG. 25B. Therefore, in the memory cell 1 as shown in FIG. 24, when the magnetization states (e.g., the magnetization directions 6a-6d) of the magnetic devices 2a-2d corresponding to the channels 14a-14d vary respectively, the magnetic fluxes 7a-7d applied to the channels 14a-14d vary respectively corresponding to the variation of the magnetization states, and thus the electric resistance may be changed variously.

Figure 26:
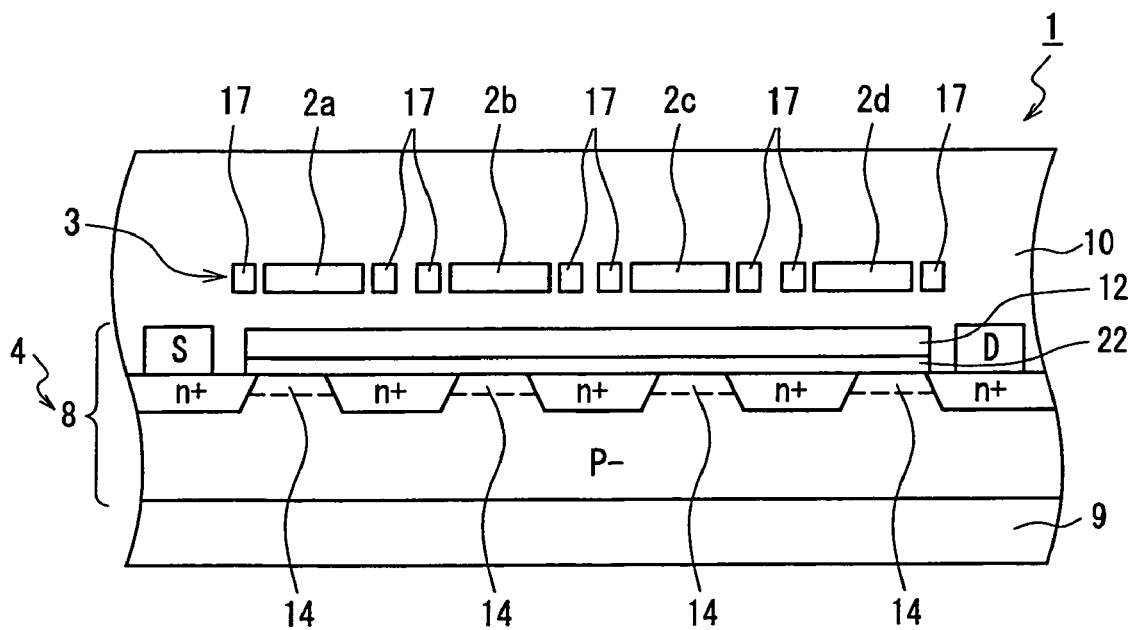
FIG. 26 is a schematic view showing a separate example of a memory cell of the present invention.
Figure 27:
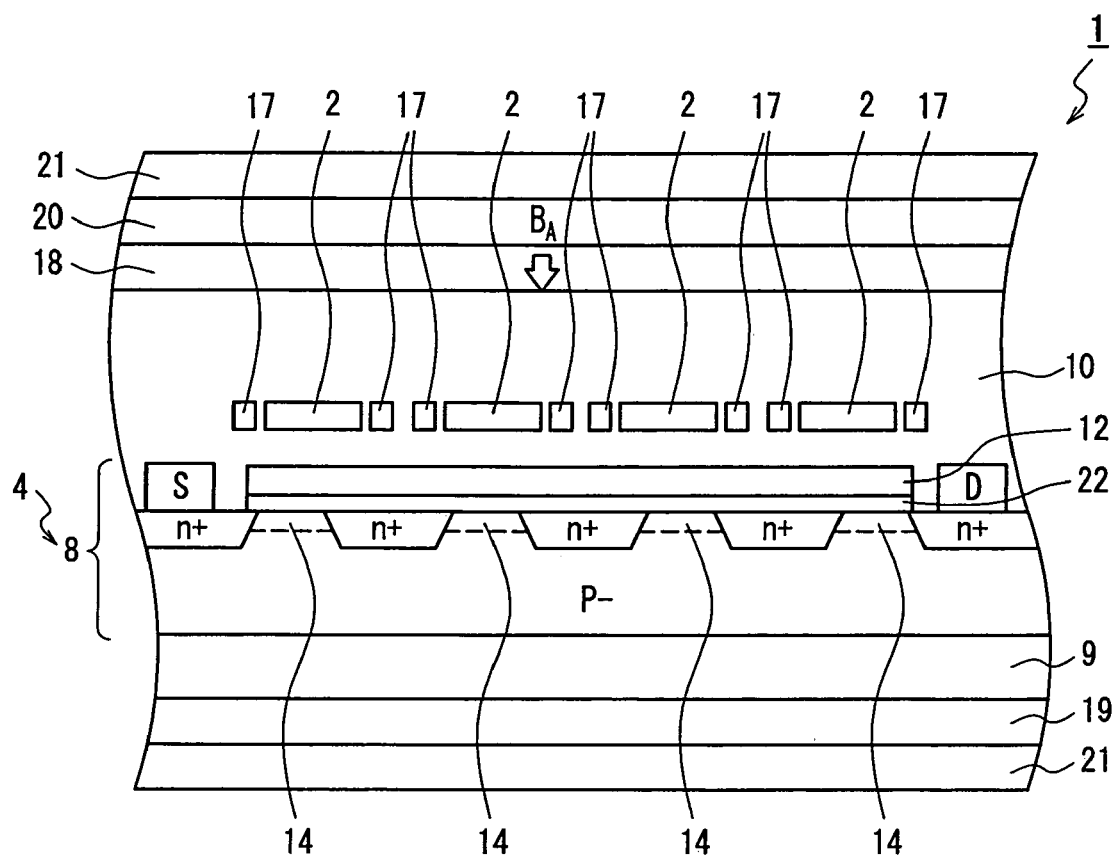
FIG. 27 is a schematic view showing a separate example of a memory cell of the present invention.
Figure 28:
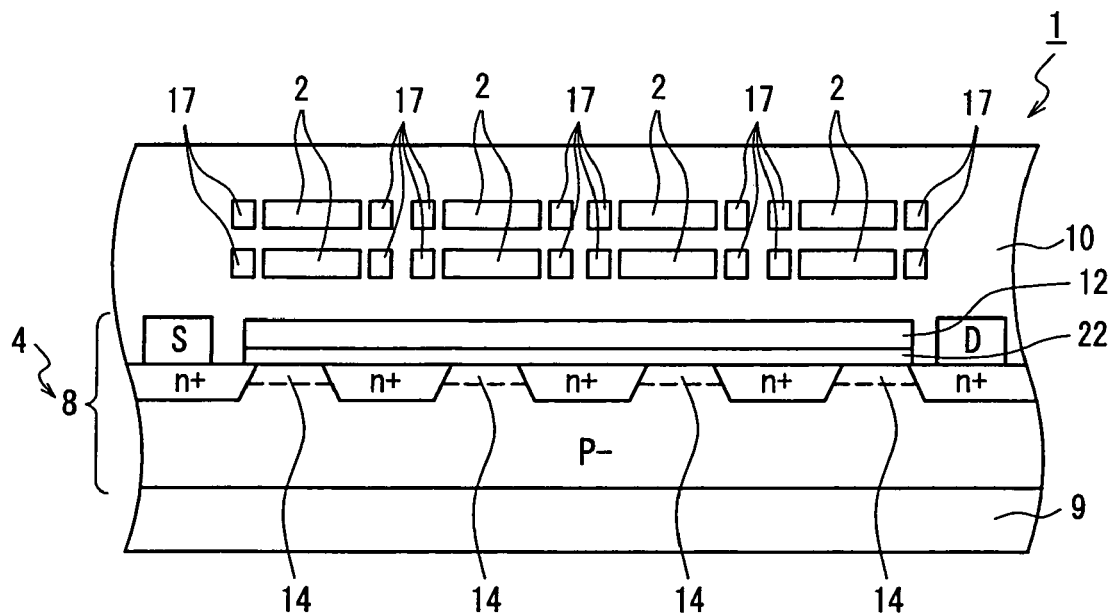
FIG. 28 is a schematic view showing a separate example of a memory cell of the present invention.

Another example of the memory cell of the present invention is shown in FIGS. 26-28. As shown in FIG. 26, even in a case where the transistor 8 has a plurality of channels 14, the magnetic field generating part 3 can include coiled wirings 17 as in the case of memory cell 1 shown in FIG. 7. Furthermore, as shown in FIG. 27, like the case of the memory cell 1 shown in FIG. 16, an offset magnetic field generating part 18 for applying a magnetic flux $B_A$ as an offset magnetic field to the magnetoelectric converting part 4, a stem 19, a shield 20, a package 21 or the like can be included. Furthermore, as shown in FIG. 28, a plurality of magnetic devices 2 can be arranged in the memory cell 1 with respect to one channel 14, as in the case of the memory cell 1 shown in FIG. 17. In this case, the memory cell 1 can be further multi-valued and have further multi-bit. The memory cell 1 referred to in FIGS. 26-28 includes a transistor 8 as shown in FIG. 20 where one gate electrode 12 corresponds to plural channels 14. This can be applied also to the memory cell 1 as shown in FIG. 23, which includes a transistor 8 where plural gate electrodes correspond to plural channels 14.

In the memory cell of the present invention, a magnetoelectric converting element can include a plurality of transistors. An example of such a memory cell is shown in FIG. 29.

Figure 29:
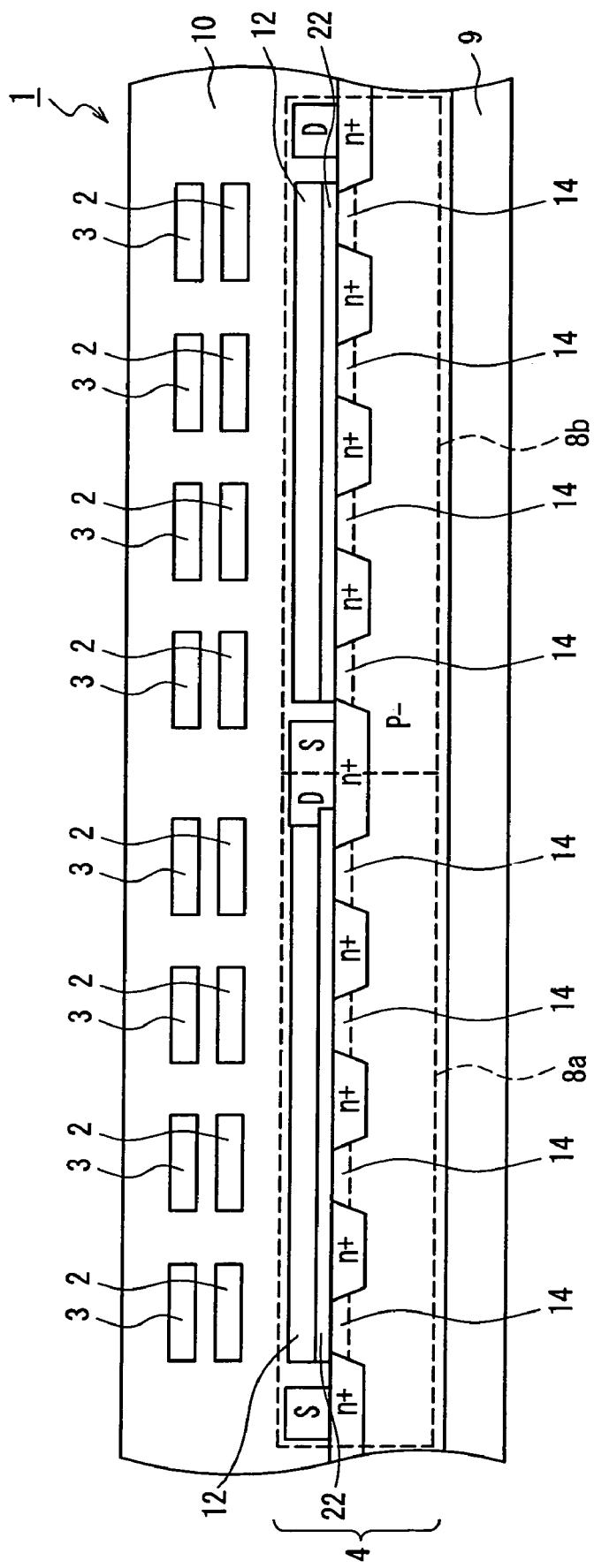
FIG. 29 is a schematic view showing a separate example of a memory cell of the present invention.

In the memory cell 1 as shown in FIG. 29, the magnetoelectric converting part 4 includes plural transistors 8a and 8b as a magnetoelectric converting element. In this manner, in the memory cell of the present invention, a magnetoelectric converting element can include plural transistors. The memory cell 1 can be multivalued (multi-bit) further. In a case where the magnetoelectric converting part 4 includes plural transistors, the number of the included transistors is not limited to two as shown in FIG. 29, but it can be set arbitrarily. In a case where the magnetoelectric converting part 4 includes plural transistors 8, the type, combination of the respective transistors 8, the structure of the wiring or the like are not limited particularly, but they can be set arbitrarily in accordance with the required characteristics for the memory cell 1.

In the memory cell 1 as shown in FIG. 29, the gate electrode 12 of the transistor 8a and the drain electrode are common. Moreover, in an adjacent pair of transistors 8a and 8b, the gate electrode 12 of the transistor 8a and the source electrode of the transistor 8b are common. In the thus obtained memory cell 1, in addition to the above-mentioned effects, wirings to the respective electrodes can be simplified further. As a result, further integrated memory can be formed. When the gate electrode 12 and the source electrode are common, the electrodes are not necessarily integrated and not limited particularly as long as the electrodes are configured to be equipotential.

Figure 30:
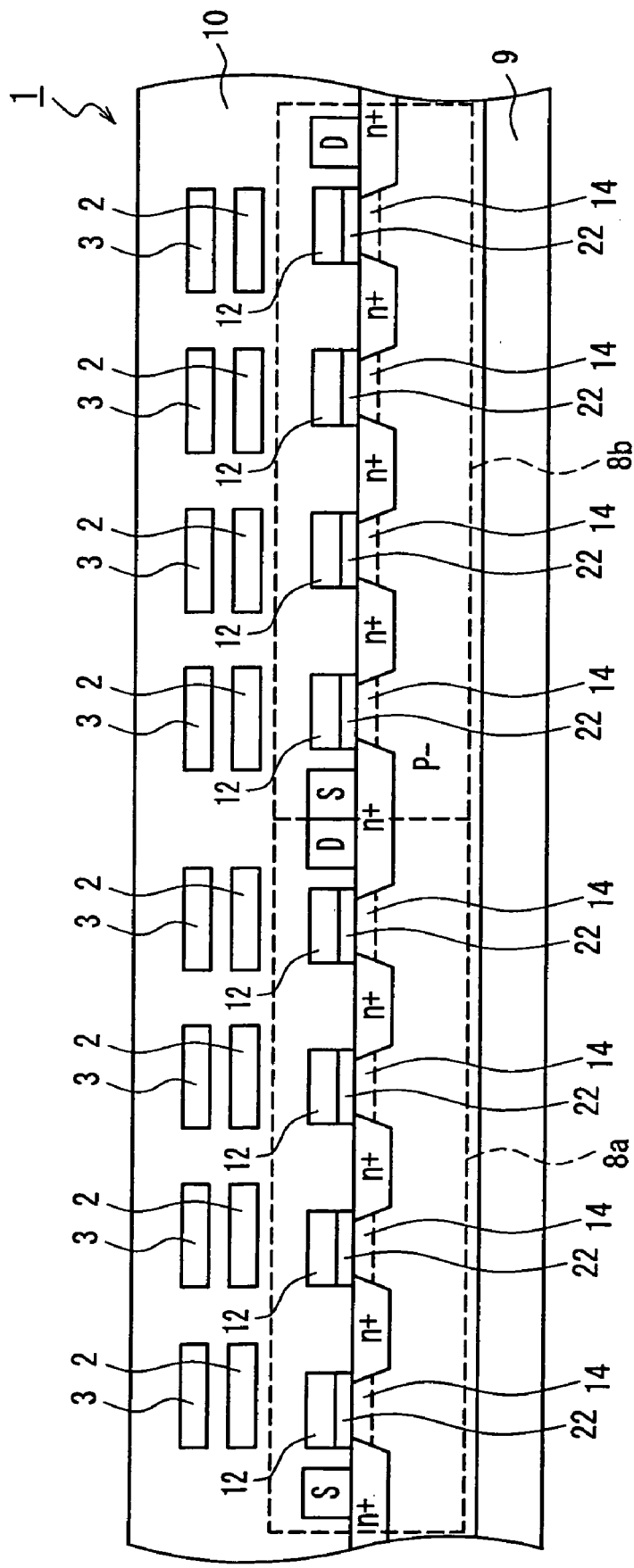
FIG. 30 is a schematic view showing a separate example of a memory cell of the present invention.

A separate example of the memory cell of the present invention is shown in FIG. 30. As shown in FIG. 30, the memory cell of the present invention can be a memory cell 1 that includes plural transistors (transistors as shown in FIG. 23) having plural channels and plural gate electrodes corresponding to the channels.

Figure 31:
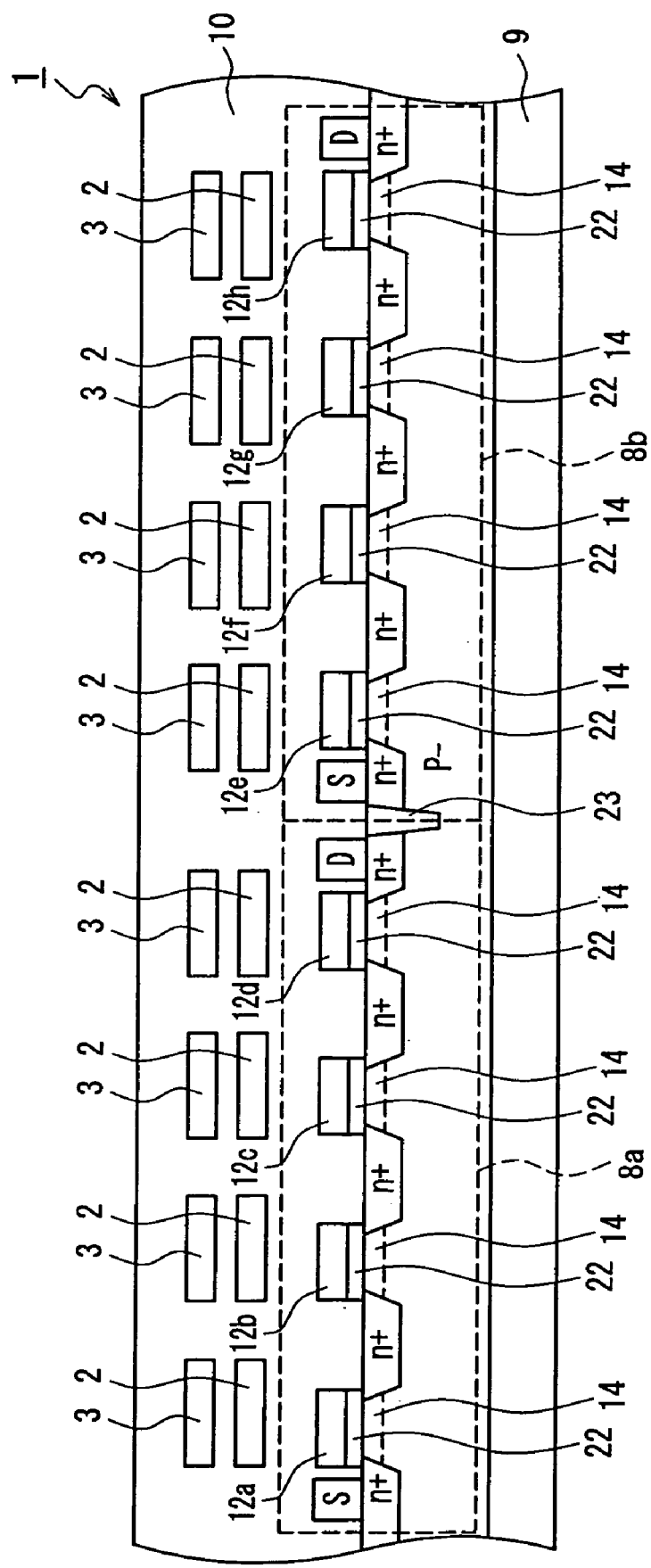
FIG. 31 is a schematic view showing a separate example of a memory cell of the present invention.

A separate example of the memory cell of the present invention is shown in FIG. 31. As shown in FIG. 31, the memory cell of the present invention can be a memory cell 1 including an adjacent pair of transistors 8a and 8b, in which an insulator 23 is arranged between a drain electrode of the transistor 8a and a source electrode of the transistor 8b. With the insulator 23, the transistors 8a and 8b are isolated. At this time, the method of arranging the insulator 23 is not limited particularly. For example, the insulator 23 can be arranged by an isolation method called shallow trench isolation because the insulating space (the distance between D and S interposing the insulator 23 in the example as shown in FIG. 31) can be reduced, which is suitable for miniaturization of the memory cell. Alternatively, the insulator 23 can be arranged by a method called LOCOS. Though this method is inferior a little to the shallow trench isolation from aspect of the insulating space, it can serve for cost reduction at a time of manufacturing, and the insulation is improved.

Figure 32:
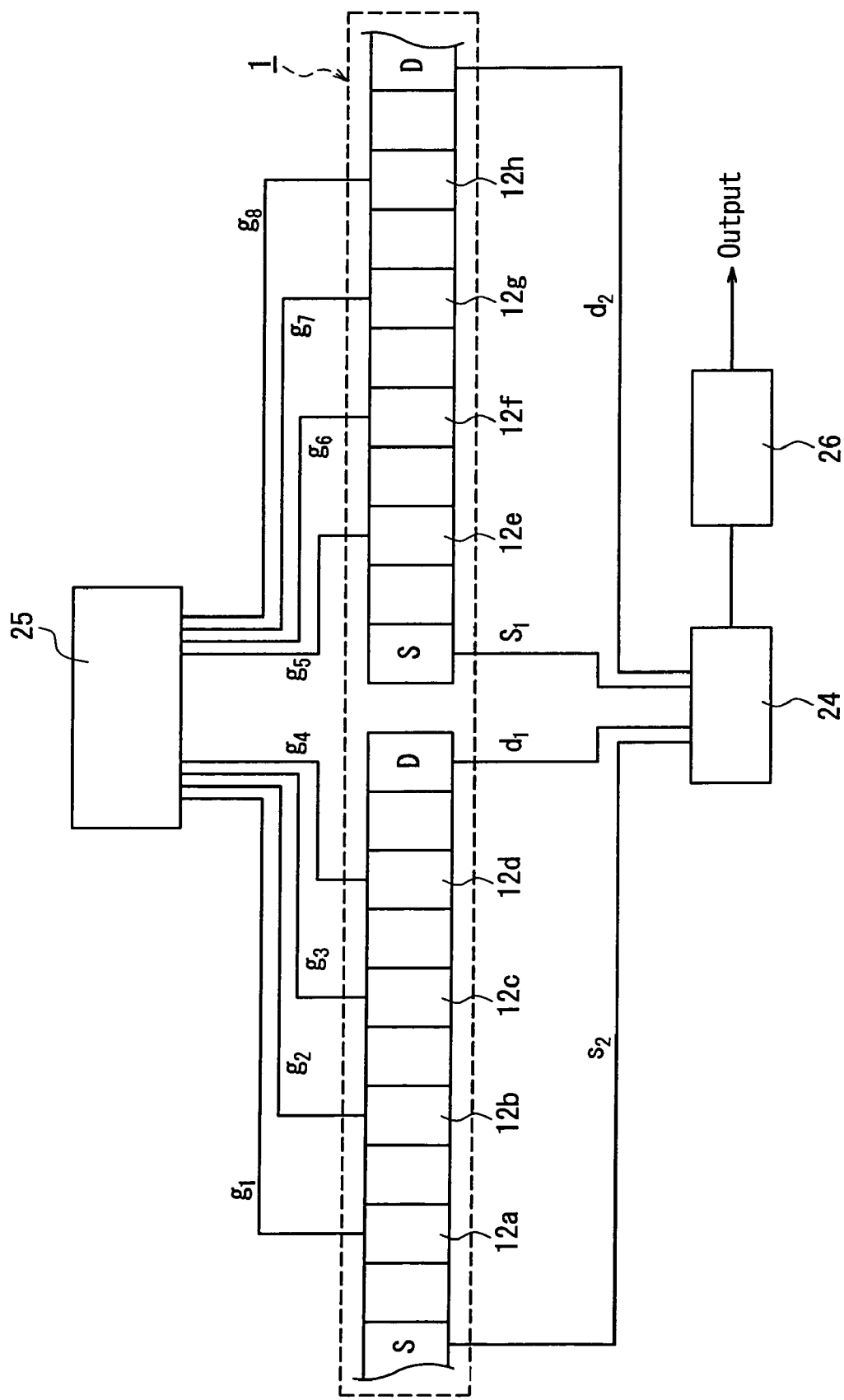
FIG. 32 is a schematic view showing an example of a method of controlling a memory cell of the present invention.

A method of controlling the memory cell of the present invention is shown in FIG. 32. The example is a method of reading information recorded in the magnetic devices 2 from the memory cell 1 as shown in FIG. 31. FIG. 32 is a schematic view showing the NAND type memory cell 1 as shown in FIG. 31, which is viewed from above (viewed from the side of the magnetic device 2 with respect to the semiconductor substrate 9). In this drawing, members other than the source electrode, drain electrode and the gate electrodes 12a-12h are omitted. For reading information from the thus configured memory cell 1, as shown in FIG. 32 for example, the gate electrodes 12a-12h can be connected to a gate controlling circuit 25 by wirings g1-g8, and the respective source electrodes and drain electrodes can be connected to a source-drain controlling circuit 24 by wirings s1, s2, d1 and d2. The source-drain controlling circuit 24 is connected to an impedance detecting circuit 26, and thus impedance between the source and drain can be detected. At this time, voltage is applied to the respective gate electrodes by the gate controlling circuit 25, and a current is fed to a space between the source electrode and the drain electrode by the source-drain controlling circuit 24, thereby impedance between the source electrode and the drain electrode is detected, and thus information recorded in the magnetic devices 2 can be read. There is no particular Imitation for the structures of the wirings.

In the memory cell 1 illustrated in the respective drawings, the surface of the source electrode 11 (or S) of the transistor 8, the surface of the gate electrode 12, and the surface of the drain electrode 13 (or D) are positioned at substantially the same level. Since such a memory cell 1 can be formed in the same manufacturing process (i.e., for example, the respective electrodes can be formed in the same step), both the number of process steps and the cost can be reduced. Here, 'substantially the same level' for a case of a n-channel transistor, for example, indicates that a difference in a distance between the surface of each of the electrode and the channel and the surface of the $n^+$ layer is in a range of about 10 nm to about 100 μm.

Next, a memory of the present invention will be described.

The memory of the present invention includes the above-mentioned memory cell 1 of the present invention, an information-recording conductive line for recording information in the memory cell 1, and an information-reading conductive line for reading the recorded information. Due to the configuration and due to selection of the memory cell 1, a memory with various effects as mentioned above can be provided.

Figure 33:
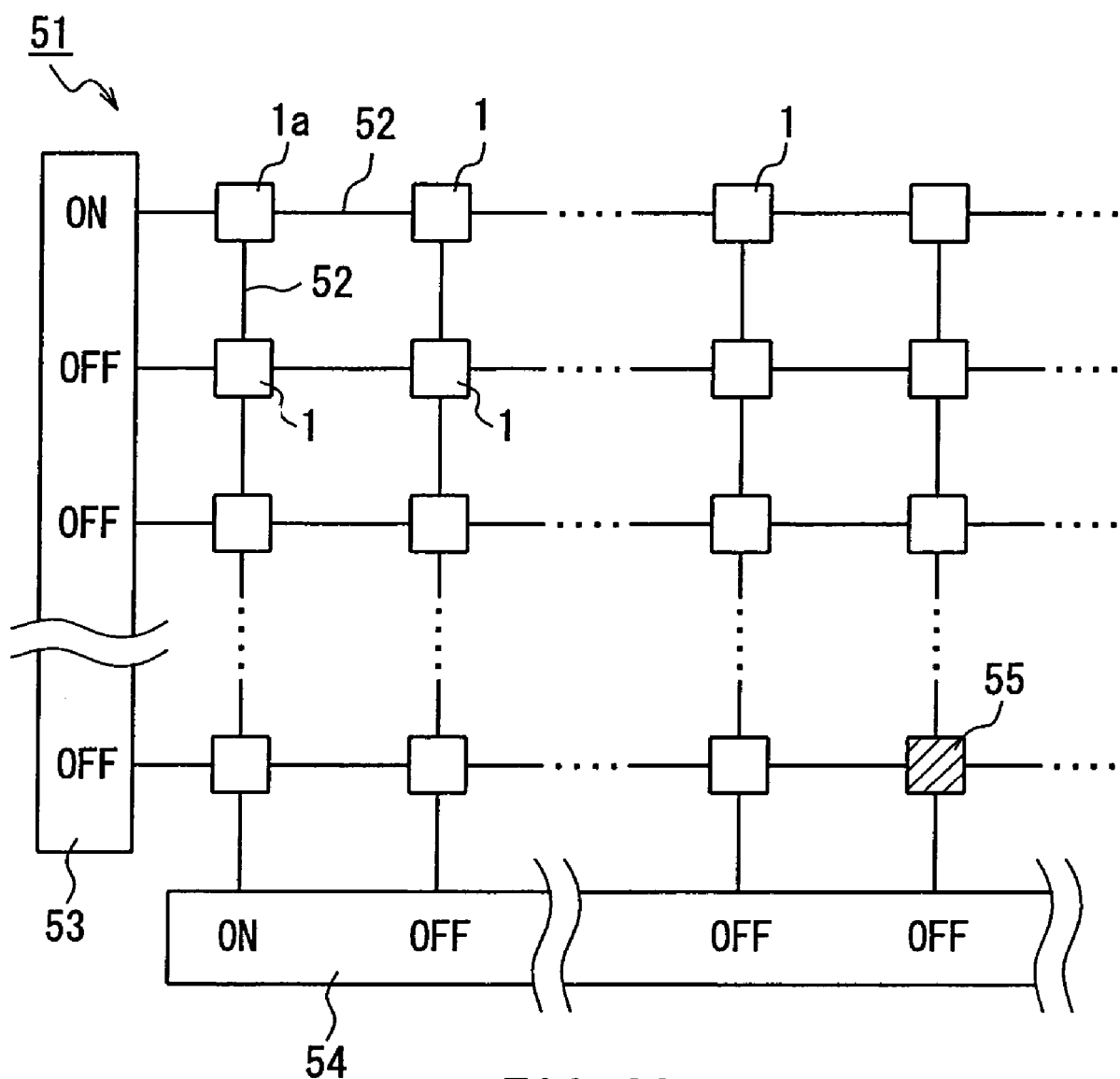
FIG. 33 is a schematic view showing an example of a memory of the present invention.

FIG. 33 shows an example of a memory using the memory cells of the present invention. In a memory 51 as shown in FIG. 33, the memory cells 1 are arranged in a matrix at an intersection of two bit lines 52 crossing each other at right angles. The bit lines 52 correspond to the information-reading conductive line, and by feeding a signal current to the two crossing bit lines 52, information can be read out from the memory cells 1. The information is read out from a memory cell (memory cell 1a in FIG. 33) arranged at a position where the bit lines 52 in ON-state cross at right angles. The ON and OFF of the signal can be controlled by means of decoders 53 and 54.

Though not shown in the drawing, in the memory 51 of FIG. 33, the memory cells 1 are arranged in a matrix also at intersections of two word lines crossing each other at right angles. The word lines correspond to the information-recording conductive lines, and information can be written in the memory cell by feeding a signal current to the two crossing word lines. The information is written in the memory cells arranged at positions where the ON-state word lines cross each other. Similarly to the case of reading, ON and OFF of the signal can be controlled by means of decoders.

In the memory 51 as shown in FIG. 33, at least one reference element 55 for referring to electric output of the memory cells 1 is arranged. The reference element 55 is an element for providing standards for the electric output of the memory cells 1. More specifically, for example, in a case where the memory cell 1 includes a transistor and reads information by detecting a change in the electric resistance, for example, an element including a transistor to provide a standard for the electric resistance can be used. Further specifically, in a case where it is an element including a magnetic device as a memory medium, a memory cell having the magnetic device in a degaussing state can be used for the reference element 55 (i.e., among the plural memory cells 1 including magnetic devices as the memory media, at least one of the memory cells 1 will be required to have a magnetic device in a degaussing state). By including at least one reference element 55, the memory 51 will have more excellent relative accuracy and a lower malfunction rate at the time of reading. The reference element 55 will be arranged as required, and there is no particular limitation about the number of the reference elements to be arranged.

Regarding the memory of the present invention, there is no particular limitation about the method of arranging the memory cell 1 or the like. For example, a method of arranging a memory cell, which is used for an ordinary memory such as a semiconductor memory, can be used. Similarly, for allocation of addresses to respective memory cells, methods used for general memories can be applied, for example. For example, bit lines and word lines are shared or sense lines can be arranged further.

Operations of the memory cell 1 of the present invention will be described by referring to FIGS. 34A and 34B. FIG. 34A shows a basic example of reading operations in the memory cell 1 of the present invention, and FIG. 34B shows a basic example of writing operations (recording operations) in the memory cell 1 of the present invention. As shown in FIG. 34A, at a time of reading from the memory cell 1, a current is fed from the drain electrode (D in FIGS. 34A and 34B) of the transistor through the bit line 52 to the source electrode (S in FIGS. 34A and 34B) and the impedance is detected so as to read information recorded in the magnetic device 2. In the transistor shown in FIGS. 34A and 34B, the drain electrode and the gate electrode (G in FIGS. 34A and 34B) are connected electrically. Also, as shown in 34B, at the time of writing in the memory cell 1, a current is fed to the magnetic field generating part 3 through a word line 56, and the thus generated magnetic field 5 is applied to the magnetic device 2 so that information is written in the magnetic device 2. For the memory in the present invention, methods for writing in and reading from the memory cell 1 are not limited to the example indicated in FIGS. 34A and 34B.

Operations of the memory cell 1 of the present invention will be explained further by referring to FIG. 35. The memory cell in FIG. 35 is considered the same as the memory cell 1 shown in FIG. 26.

As shown in FIG. 35, when reading information from the memory cell 1, a current is fed from the drain electrode (D in FIG. 35) of a transistor to the source electrode (S in FIG. 35) through a bit line 52, and resistance at that time is detected by the impedance detecting circuit 26 so as to read the information recorded in the magnetic devices 2a-2d. The current can be fed from the drain electrode to the source electrode by applying a voltage of not lower than a predetermined level to the gate electrode (G in FIG. 35). In the transistor as shown in FIG. 35, the drain electrode and the p⁻ layer (B in FIG. 35) that is called a bulk or a well are connected electrically to each other.

In a memory of the present invention, it is possible that respective memory cells arranged in a matrix include transistors, and between memory cells different from each other, at least one electrode selected from source electrodes and drain electrodes of transistors can be equipotential. Thereby, the wiring can be simplified and the memory can be further integrated. An example of such a memory is shown in FIG. 36.

Figure 36:
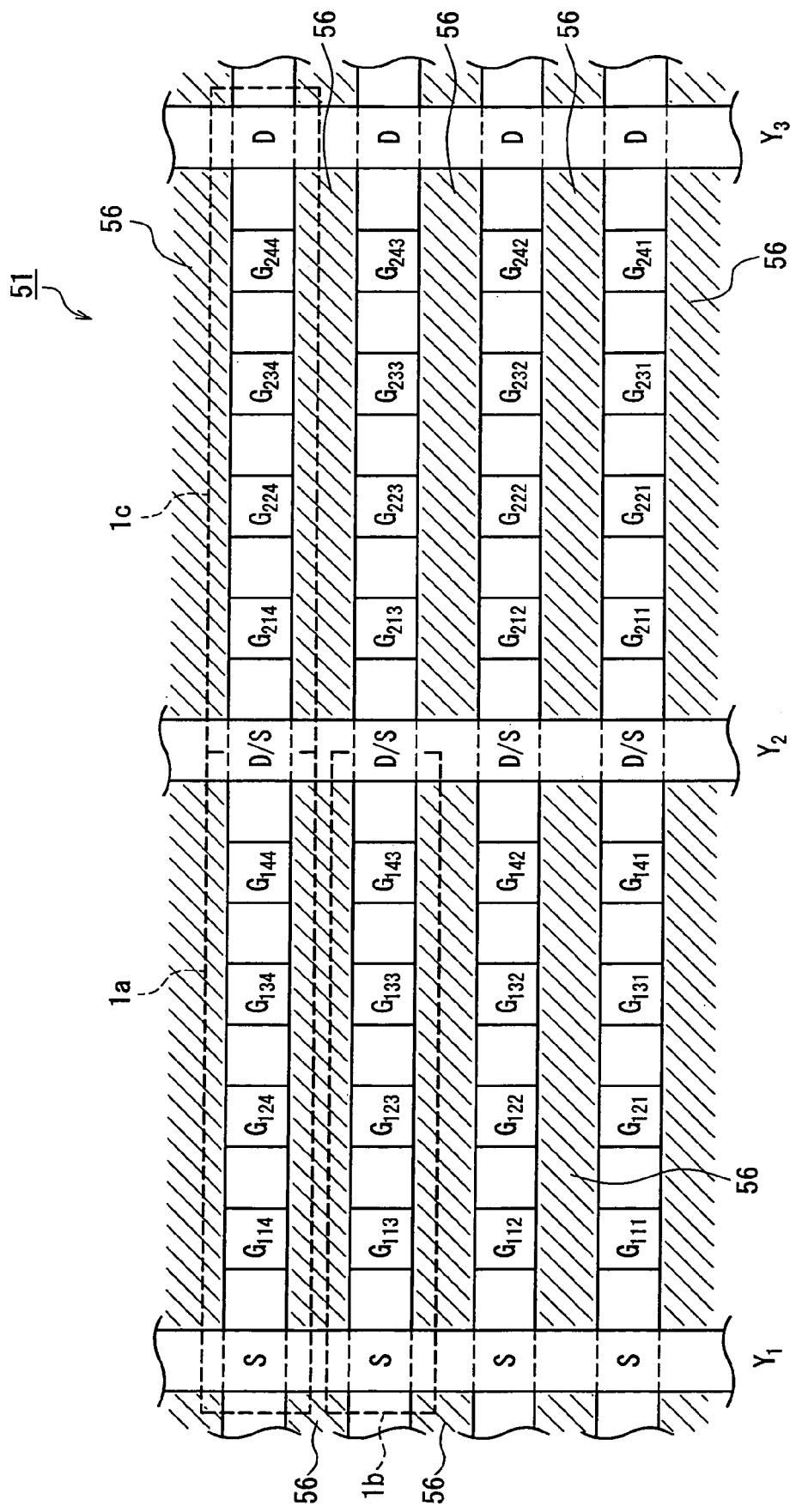
FIG. 36 is a schematic view showing another example of a memory of the present invention.

The memory as shown in FIG. 36 is a memory 51 having the memory cells 1 as shown in FIG. 23 arranged in a matrix. Since the memory cells 1 as shown in FIG. 23 are of a NAND type, the memory 51 can be called also a NAND type memory. In FIG. 36, members other than the source electrode, the drain electrode, and the gate electrode ($G_{111}$-$G_{244}$ in FIG. 36) are omitted. In the memory 51 as shown in FIG. 36, between memory cells 1 different from each other, at least one kind of electrodes selected from the source electrodes (S) and drain electrodes (D) included in the memory cells 1 are integrated. For example, between the memory cell 1a and the memory cell 1b, the source electrodes and the drain electrodes are integrated respectively. Between the memory cell 1a and the memory cell 1c, a source electrode of one of the memory cells and a drain electrode of the other memory cell are integrated. Memory cells 1 whose electrodes are integrated with each other are not necessarily disposed adjacent to each other. In addition, the electrodes are not necessarily integrated with each other. The configurations are not limited particularly as long as the electrodes are equipotential. In the memory 51 as shown in FIG. 36, four gate electrodes are provided to each memory cell 1. Therefore, as shown in FIG. 36, addresses ($G_{111}$-$G_{244}$) are allocated to each gate electrode so as to control as a memory of at least 32 bits. Furthermore, as shown in FIG. 36, an insulating element-isolating layer 56 can be arranged between the respective memory cells 1.

The memory as shown in FIG. 33 has a configuration called generally two-dimensional memory or two-dimensional memory array. The memory of the present invention can include a plurality of the two-dimensional memory arrays as shown in FIG. 33. More specifically, for example, it can be a memory that is packaged as one of the above-mentioned memory arrays or as plural integrated circuits. Also, the thus configured integrated circuits can be chip-laminated to form a memory, or the integrated circuits are housed in a thin film package and laminated. Alternatively, a so-called multi-chip module can be formed. The two-dimensional memory is not limited to the memory including plural memory cells arranged in a matrix as shown in FIG. 33. Besides the arrangement in a matrix, there is no particular limitation as long as the memory cells are arranged two-dimensionally. Furthermore, the memory cell as shown in FIG. 29 can be used for a memory of the present invention. That is, it can have a structure that is generally called a one-dimensional memory or a one-dimensional memory array.

Next, a method of manufacturing the memory cell of the present invention will be described.

The method for manufacturing a memory cell of the present invention is a method for manufacturing the above-mentioned memory cell, and it includes:

(i) a step of forming a magnetoelectric converting element on a surface of a semiconductor substrate, where the magnetoelectric converting element has electric characteristics that vary in accordance with a state of a magnetic field to be detected, (ii) a step of forming a magnetic device so that the magnetoelectric converting element is interposed between the magnetic device and the semiconductor substrate, and (iii) a step of forming, in the vicinity of the magnetic device, a magnetic field generating part for varying the magnetization state of the magnetic device. In the step (ii), the magnetic device is formed in the vicinity of the magnetoelectric converting element so that the magnetoelectric converting element detects a magnetic flux generated from the magnetic device. A memory cell with excellent characteristics can be obtained in the above-mentioned manufacturing processes.

An example for a method for manufacturing a memory cell of the present invention is shown in FIGS. 37A-37H.

Figure 37A:
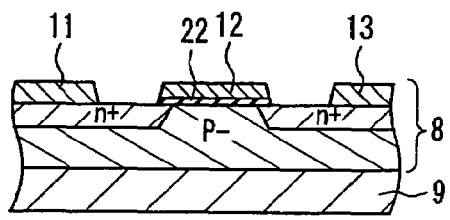
FIGS. 37A-37H are schematic process charts showing an example of a method for manufacturing a memory cell of the present invention.

First as shown in FIG. 37A, on a surface of the semiconductor substrate 9, a transistor 8 as an electromagnetic converting element whose electric characteristics vary in accordance with the state of the magnetic field to be detected is formed (step (i)). The method of forming the transistor 8 on the semiconductor substrate is not limited particularly, but a commonly applied method can be used.

Figure 37E:
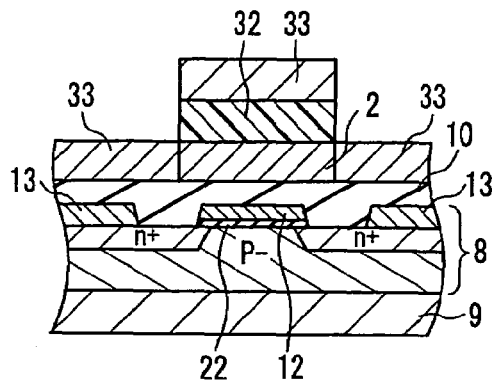
Figure 37B:
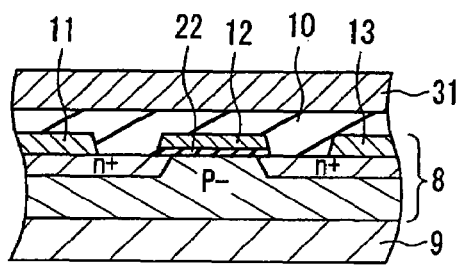

Next, as shown in FIG. 37B, an insulator 10 and a magnetic material 31 are laminated on the transistor 8. For the magnetic material 31, any magnetic material required for the magnetic device of a memory cell can be used. The magnetic material 31 can have a thickness of the magnetic device to be subsequently formed (a thickness in a direction perpendicular to a face of the magnetic device facing the magnet-electric converting element). The insulator 10 can be omitted if the electromagnetic converting element may not cause electric shorting or the like.

Figure 37F:
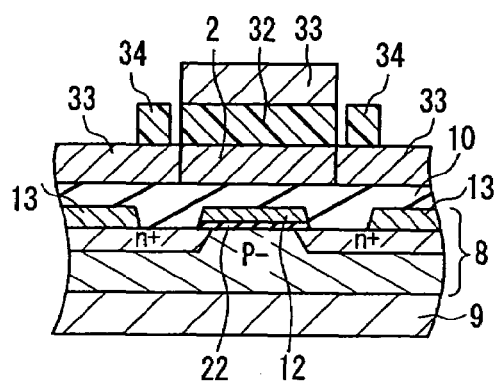
Figure 37C:
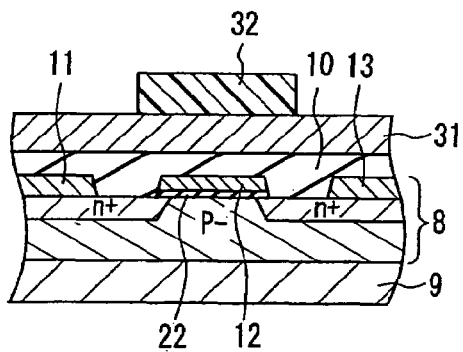

Next, as shown in FIG. 37C, a resistor 32 is arranged on the magnetic material 31. The resistor 32 can be arranged in a region required for a magnetic device of a memory cell. The type of the resistor 32 is not limited particularly, but a general resistor can be used. Similarly, there is no particular limitation about a method of arranging the resistor 32.

Figure 37G:
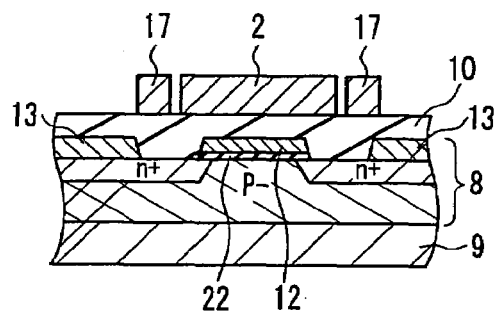
Figure 37D:
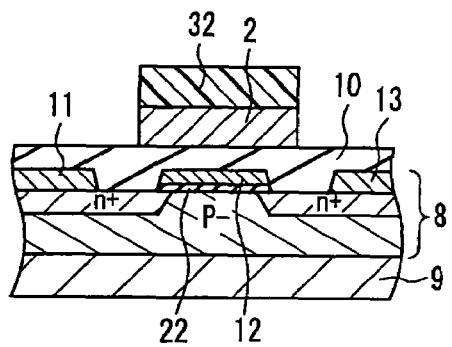

Next, as shown in FIG. 37D, the magnetic material is removed from the regions other than the region where the resistor 32 is arranged, thereby forming the magnetic device 2 on the transistor 8 (step (ii)). The magnetic device 2 is formed by interposing the transistor 8 as an electromagnetic converting element with the magnetic device 2 and the semiconductor substrate 9. The magnetic material can be removed by a general method such as ion-etching and ion-milling.

Next, as shown in FIG. 37E, a wiring material 33 is laminated on the insulator 10 and the resistor 32. For the wiring material 33, a conductive material required for wiring, coils or the like for a magnetic field generating part of a memory cell can be used.

Next, as shown in FIG. 37F, a resistor 34 is arranged on the wiring material 33. The resistor 34 can be arranged in any region as required for a wiring, coil or the like for a magnetic field generating part. The resistor 34 can be formed of a material similar to that of the resistor 32 and also arranged similarly to the resistor 32.

Next, as shown in FIG. 37G, the wiring material is removed from the regions other than the region where the resistor 34 is arranged, thereby forming on the insulator 10 a coiled wiring 17 as a magnetic field generating part (step (iii)). At this time, the wiring material can be removed by a general method such as ion-etching or ion-milling, and the resistor 32 and the wiring material 33 both arranged on the magnetic device 2 can be removed by means of lift-off or the like.

Figure 37H:
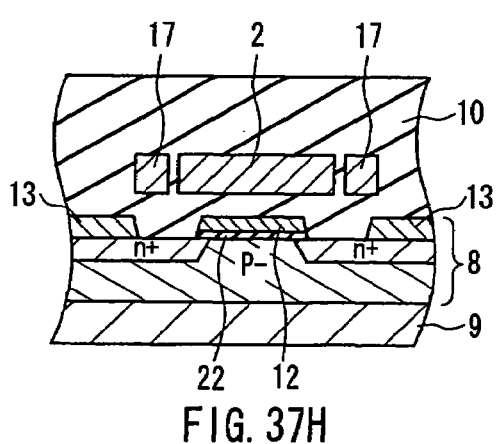

Finally, as shown in FIG. 37H, the entire member is covered with the insulator 10, thereby obtaining a memory cell 1 similar to the memory cell 1 shown in FIG. 7.

For laminating the magnetic materials and the wiring materials, general film-forming methods can be applied. For example, lamination can be performed by using processes such as sputtering and vacuum deposition.

In the method for forming a memory cell of the present invention, materials used for the respective parts and the positional relationship among the respective parts can correspond to the above-mentioned materials and the positional relationship. For example, the transistor 8 can have one gate electrode arranged above the plural channels. By using the manufacturing method, a memory cell 1 with excellent characteristics as shown in FIG. 20 can be provided.

In the method for manufacturing the memory cell of the present invention, the surface of the source electrode, the surface of the gate electrode and the surface of the drain electrode in a transistor can be located at the same level.

In the method for manufacturing the memory cell of the present invention, plural magnetic devices can be formed in the step (ii) mentioned above. Thereby, a memory cell 1 as shown in FIG. 17, FIG. 19 or the like can be obtained. For forming plural magnetic devices, for example, the steps as shown in FIGS. 37B-37D can be repeated for the number of the magnetic devices required.

In the method for manufacturing the memory cell of the present invention, the semiconductor substrate can be formed on a stem made of a soft magnetic device. According to the manufacturing method, a memory cell 1 with excellent characteristics as shown in FIG. 16 and FIG. 27 can be obtained.

The method for manufacturing the memory cell of the present invention further includes, subsequent to the above-mentioned step (iii), a step of (a) forming a layer of a ferromagnetic material, wherein the ferromagnetic material can have a flux component in a direction perpendicular to a face of the magnetic device facing the magnetoelectric converting element. According to the manufacturing method, a memory cell 1 with excellent characteristics as shown in FIGS. 14 and 27, having an offset magnetic field generating part, can be obtained. The method of forming the ferromagnetic material is not limited particularly. For example, a method similar to the method of laminating a magnetic material can be used, and processes such as etching can be carried out as required.

The method for manufacturing the memory cell of the present invention further includes, subsequent to the above-mentioned step (iii), a step of (b) forming a shield made of a soft magnetic material. According to the manufacturing method, a memory cell 1 with excellent characteristics as shown in FIGS. 16 and 27 can be obtained. The method of forming the shield is not limited particularly. For example, a method similar to the method of laminating a magnetic material can be used, and processes such as etching can be carried out as required.

Examples of systems, apparatuses and devices to which the memory of the present invention is actually applied will be explained below. The memory of the present invention can be applied as described below, for example.

Figure 38:
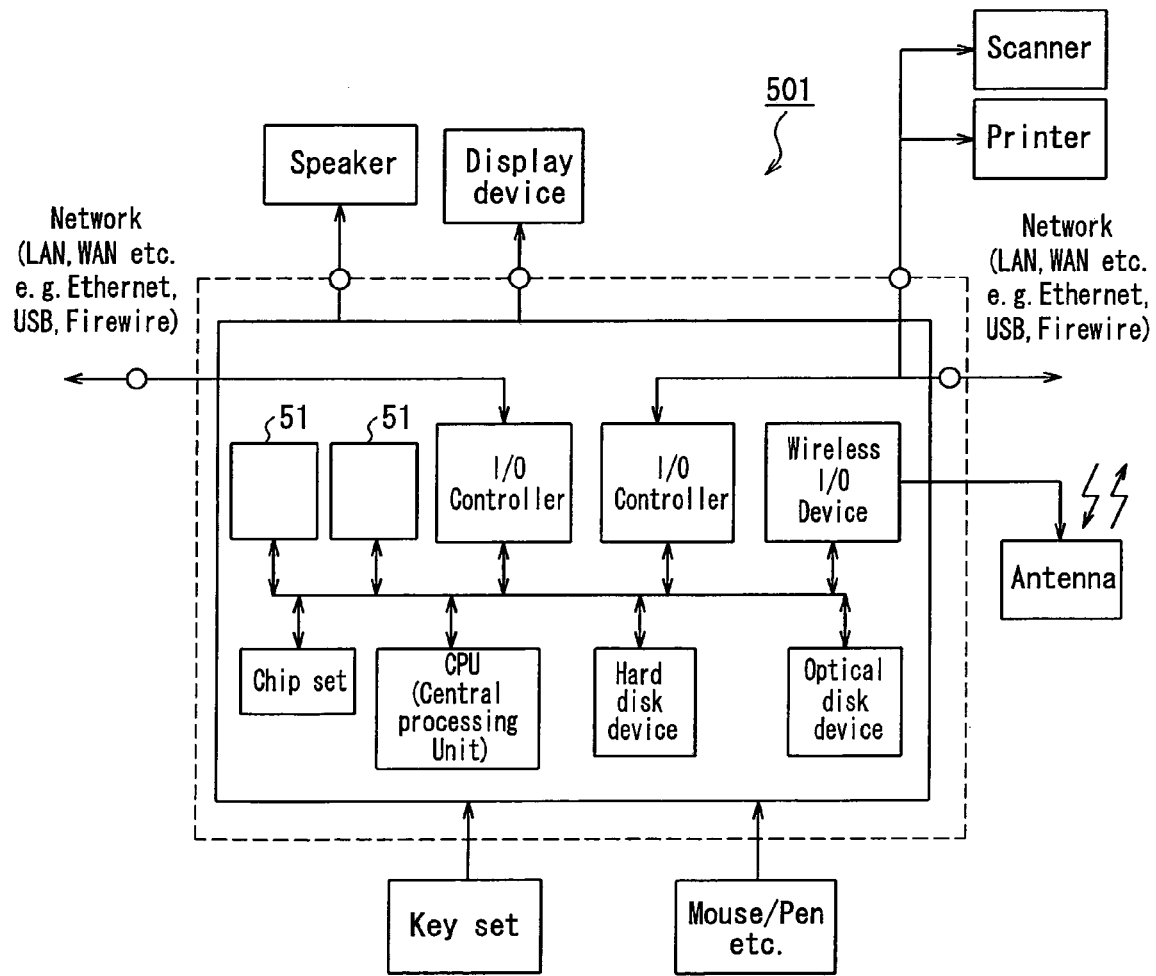
FIG. 38 is a schematic view showing an example of application of a memory of the present invention.

FIG. 38 is a schematic view showing an example of a configuration of a computer system including a memory of the present invention. The computer system 501 as shown in FIG. 38 includes the memory 51 of the present invention as a storage device.

As mentioned above, the memory 51 of the present invention can be provided as a memory having various characteristics by, for example, selecting a memory medium included in a memory cell that composes the memory or selecting a structure of a detecting element. For example, characteristics excellent in heat resistance, environmental resistance, an information non-volatile property, reading characteristics, writing characteristics or the like, can be selected. Therefore, by applying the memory of the present invention, a computer with more excellent reliability and performance can be obtained. The other devices of the computer as shown in FIG. 38 (including parts not shown in the drawing) can include the memory of the present invention. In such a case, similar effects can be obtained as well.

Figure 39:
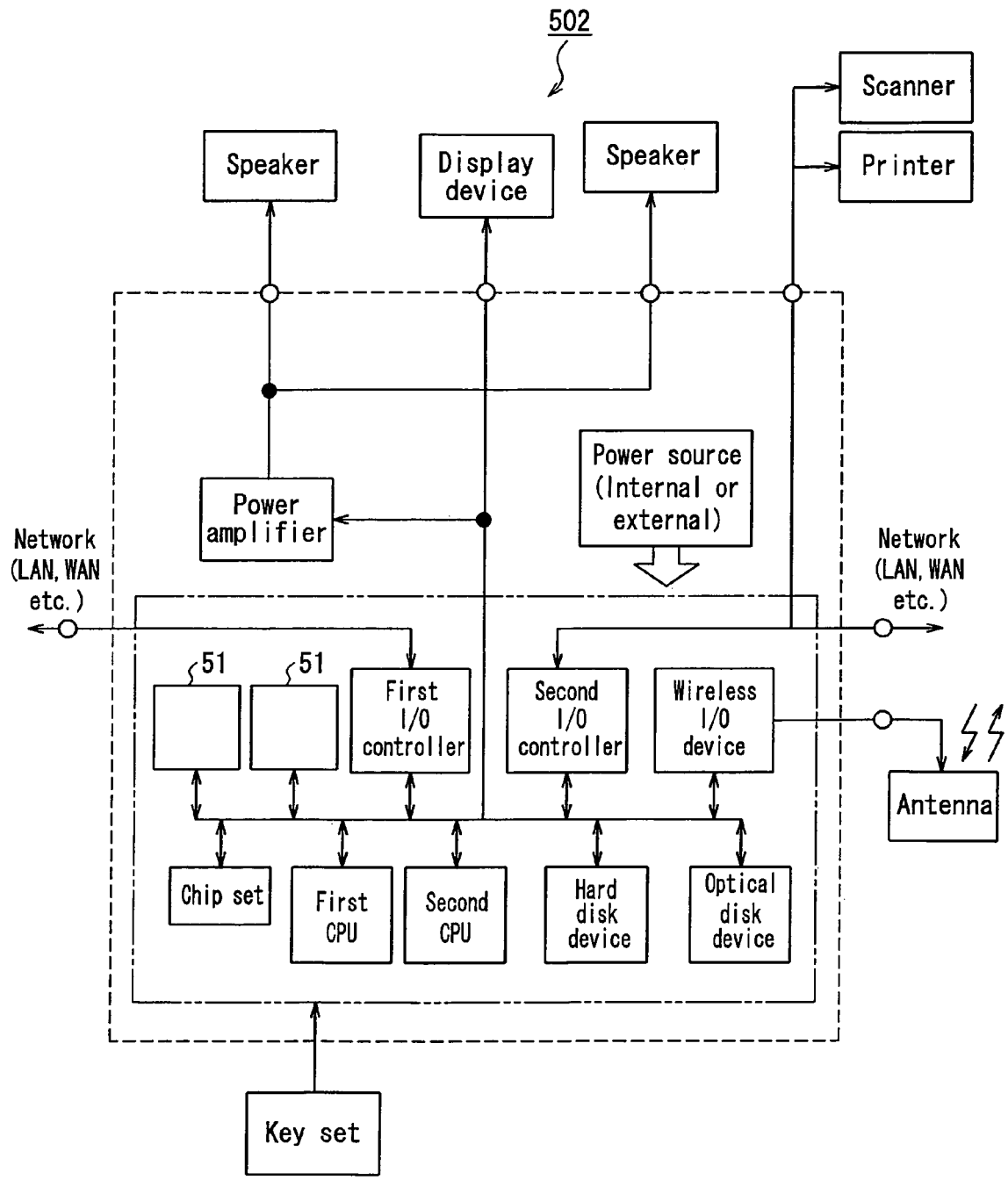
FIG. 39 is a schematic view showing an example of application of a memory of the present invention.

FIG. 39 is a schematic view showing an example of a configuration of a system or a work station (hereinafter referred to as a server system) including the memory of the present invention. The server system 502 as shown in FIG. 39 includes the memory 51 of the present invention as a storage device. Similarly to the example as shown in FIG. 38, by providing the memory of the present invention, a server system with further excellent reliability and performance can be provided. The other devices of the server system shown in FIG. 39 (including devices not shown) can include the memory of the present invention. In such a case, similar effects can be obtained.

Figure 40:
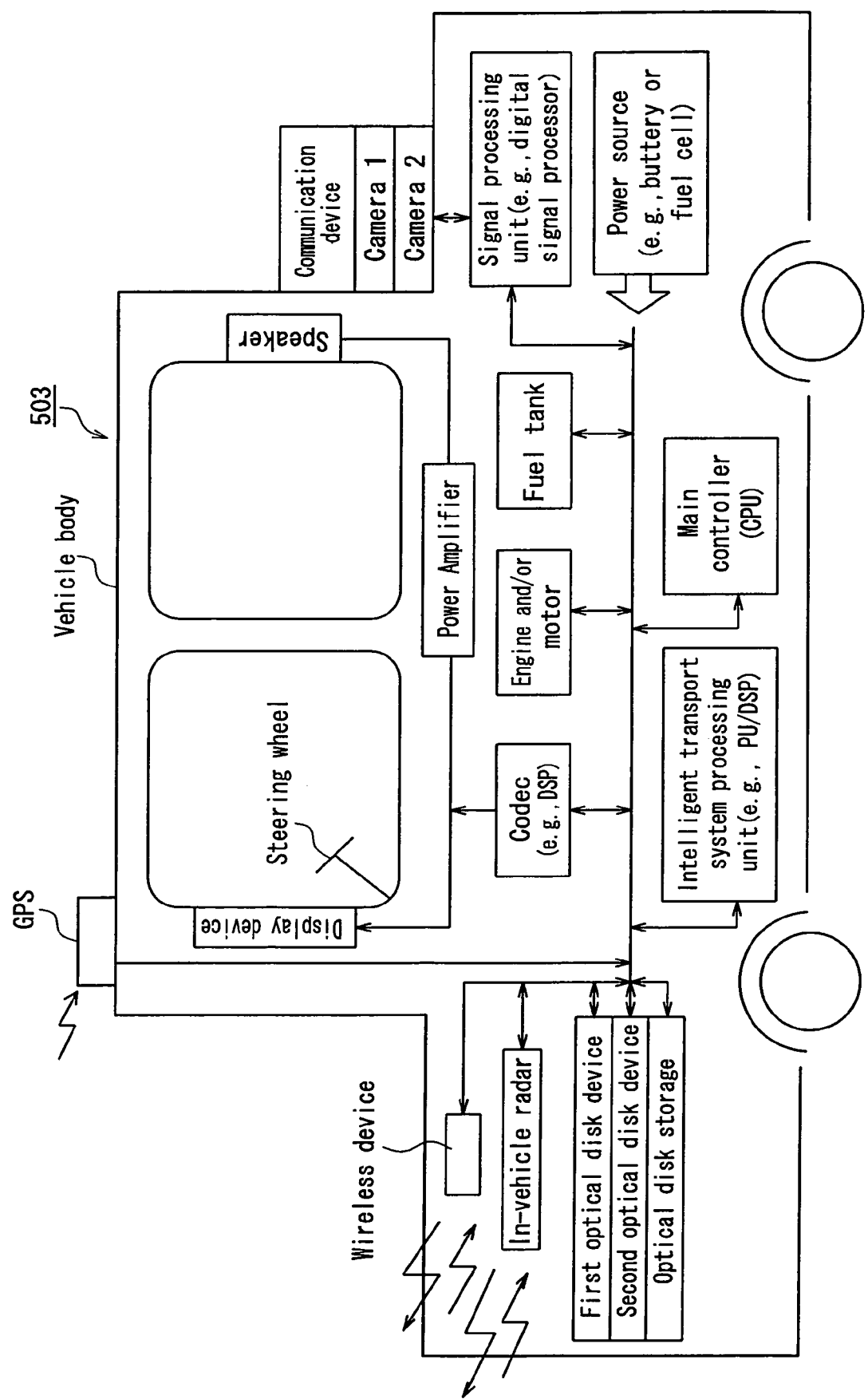
FIG. 40 is a schematic view showing an example of application of a memory of the present invention.

FIG. 40 is a schematic view showing an example of an in-vehicle system including the memory of the present invention. Though not shown, in the in-vehicle system 503 as shown in FIG. 40, various apparatuses and devices include the memories of the present invention. The memory of the present invention is included, for example, in a codec, an ITS (Intelligent Transport System) processing unit, a controller, a signal processing unit, a first optical disk device, a second optical disk device, a wireless device, cameras having transfer-mechanism, an in-vehicle radar, an in-vehicle navigation system, and a GPS (Global Positioning System) that is included in the navigation system in order to measure the position of the vehicle. Similarly to the example as shown in FIG. 38, by using the memory of the present invention, the in-vehicle system can have more excellent reliability and performance even when the application circumstance is under a severe condition with high temperature and vibration in a vehicle.

Figure 41:
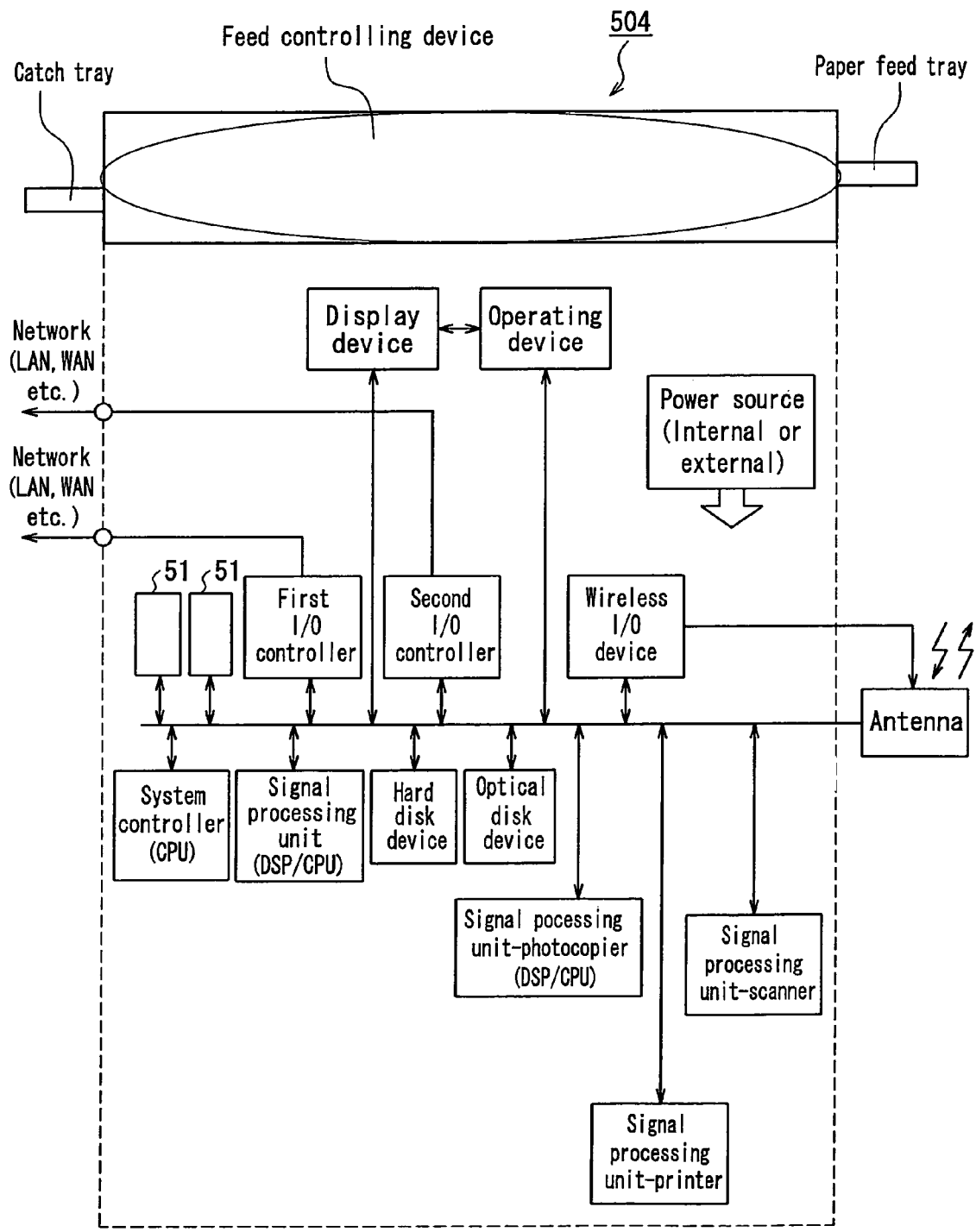
FIG. 41 is a schematic view showing an example of application of a memory of the present invention.

FIG. 41 is a schematic view showing an example of a configuration of a multifunctional information-processing system (for example, a system having a function as a copying machine, scanner, printer, a facsimile machine or the like) provided with the memory of the present invention. The information-processing system 504 as shown in FIG. 41 includes the memory 51 of the present invention as the storage device. As in the example shown in FIG. 38, by using the memory of the present invention, an information-processing system with more excellent reliability and performance can be obtained.

The other devices of the information-processing system shown in FIG. 41 can include the memory of the present invention. In this case, similar effects can be obtained. The information-processing system as shown in FIG. 41 can be contained in a computer.

Figure 42:
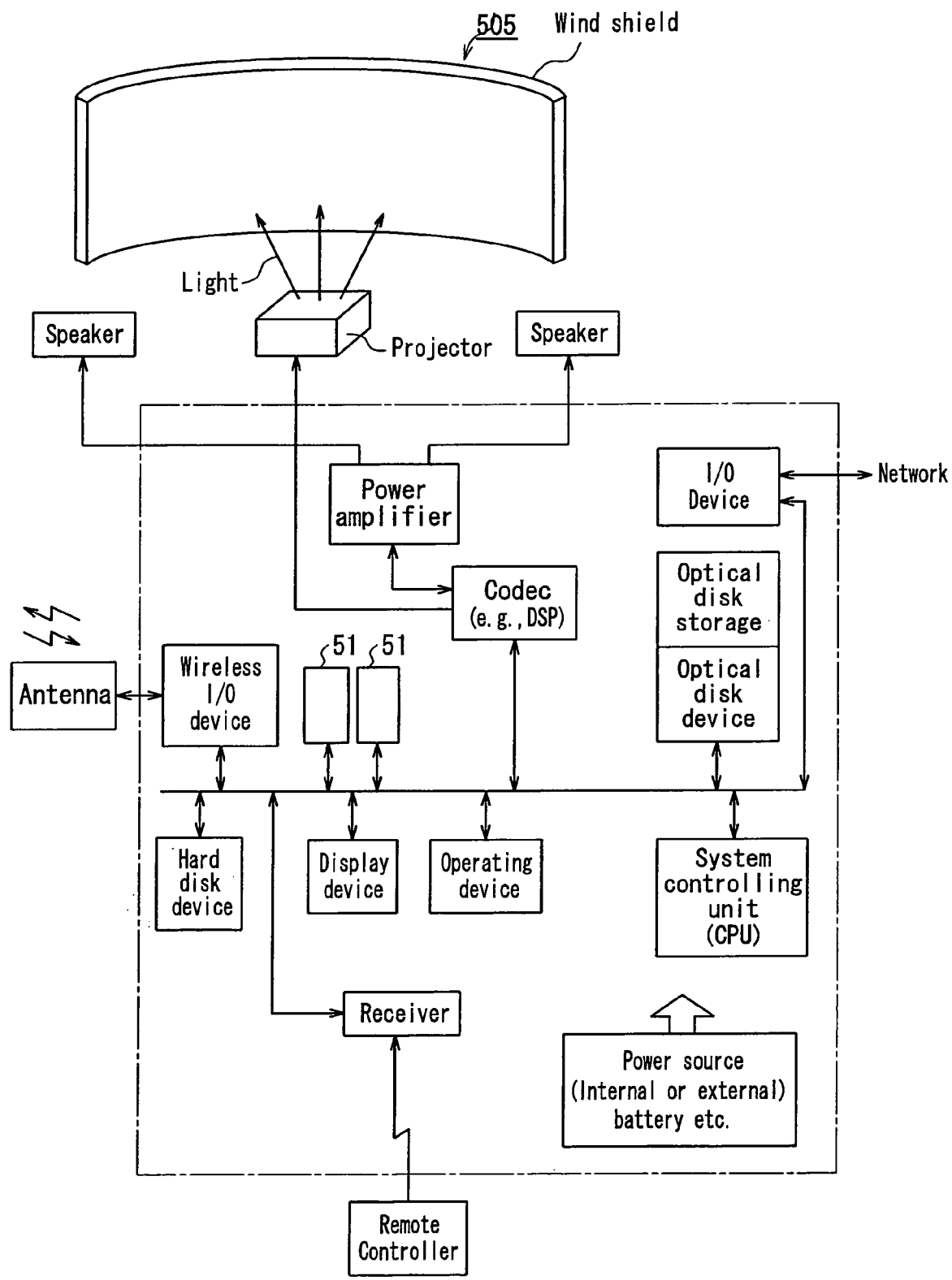
FIG. 42 is a schematic view showing an example of application of a memory of the present invention.

FIG. 42 is a schematic view showing another example of a cinematographic system having the memory of the present invention, such as projection type, reflection type, or back-projection type. The cinematographic system 505 as shown in FIG. 42 includes the memory 51 of the present invention as a storage device. Though not shown, other various devices include the memories of the present invention. For example, a codec, an optical disk device and the like in FIG. 42 include the memories of the present invention. As in the example shown in FIG. 38, by using the memory of the present invention, the cinematographic system can have more excellent reliability and performance even when the application circumstance is under a severe condition with high temperature and vibration in a vehicle.

Figure 43:
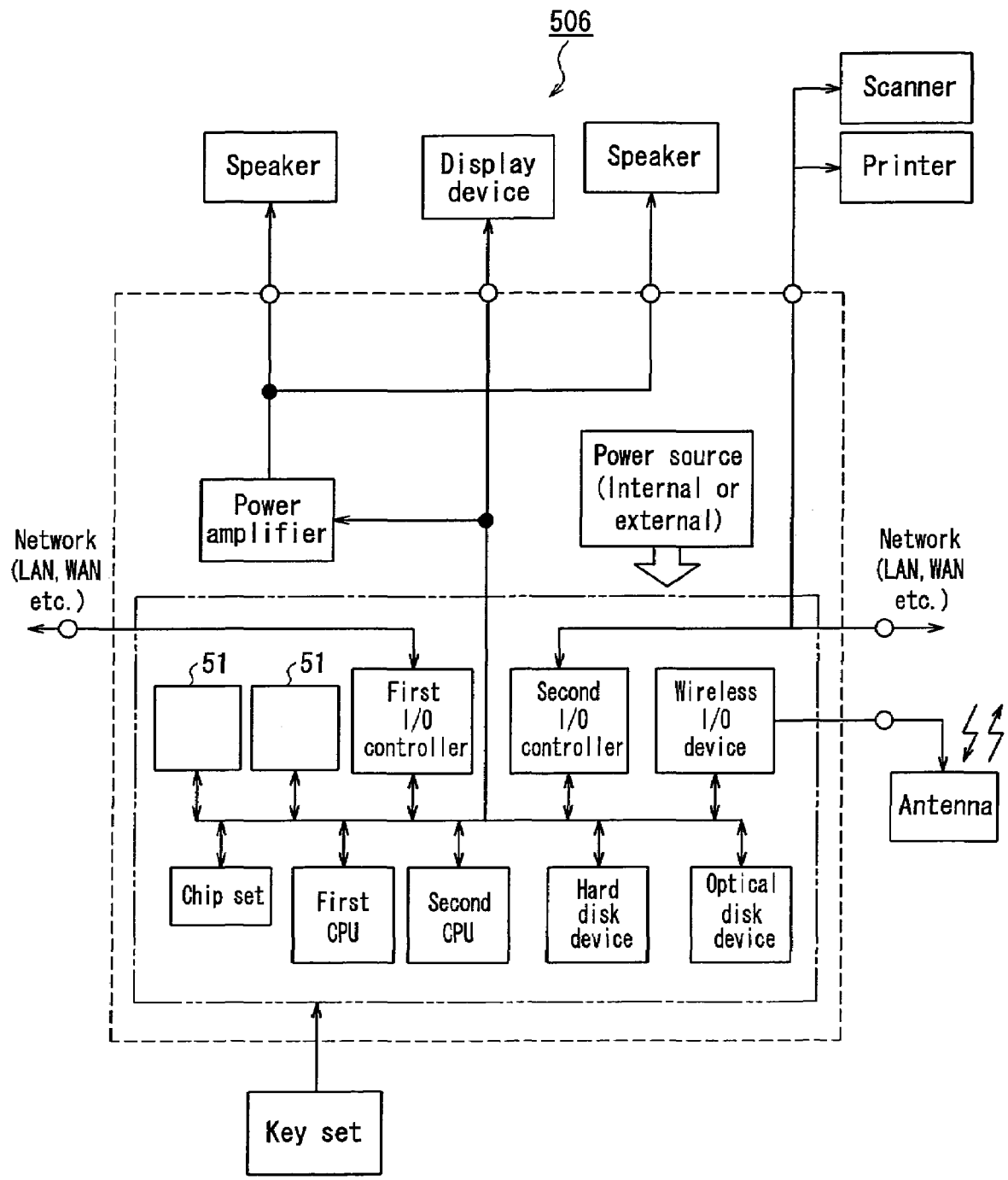
FIG. 43 is a schematic view showing an example of application of a memory of the present invention.

FIG. 43 is a schematic view showing an example of a portable terminal system including the memory of the present invention. In the portable terminal system 506 as shown in FIG. 43, the memory 51 of the present invention as a storage device is provided. As in the example shown in FIG. 38, by using the memory of the present invention, the portable terminal system can have more excellent reliability and performance. The other devices of the portable terminal as shown in FIG. 43 can include the memory of the present invention. In this case, similar effects can be obtained as well.

Figure 44:
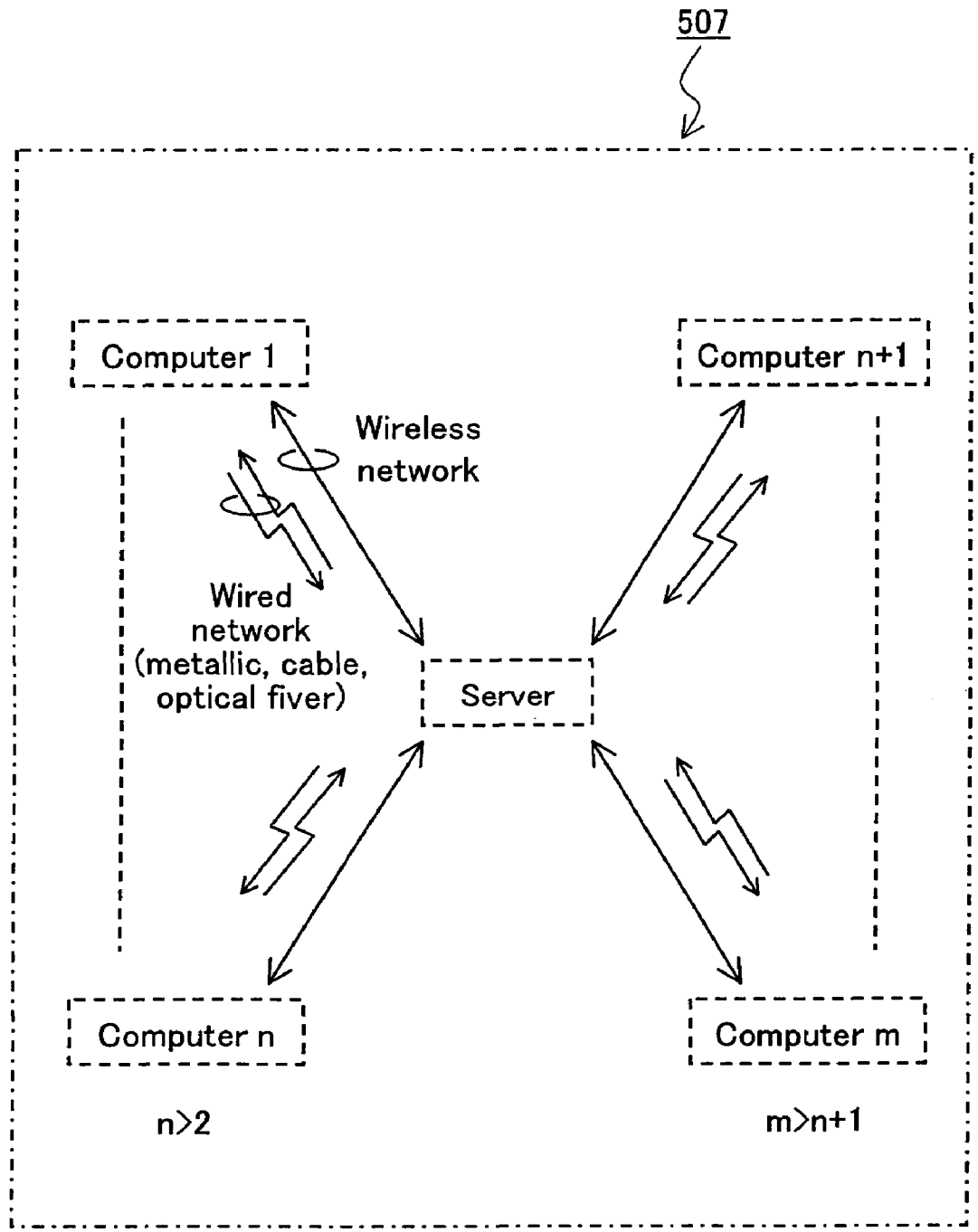
FIG. 44 is a schematic view showing an example of application of a memory of the present invention.

FIG. 44 is a schematic view showing an example of a server net including a computer and/or a server system including the memory of the present invention. The server net 507 as shown in FIG. 44 includes the memory of the present invention as a storage device for the computer and/or the server system composing the server net 507. As in the examples as shown in FIGS. 38 and 39, by using the memory of the present invention to the computer and/or the server system included in the server net, the server net can have more excellent reliability and performance.

Figure 45:
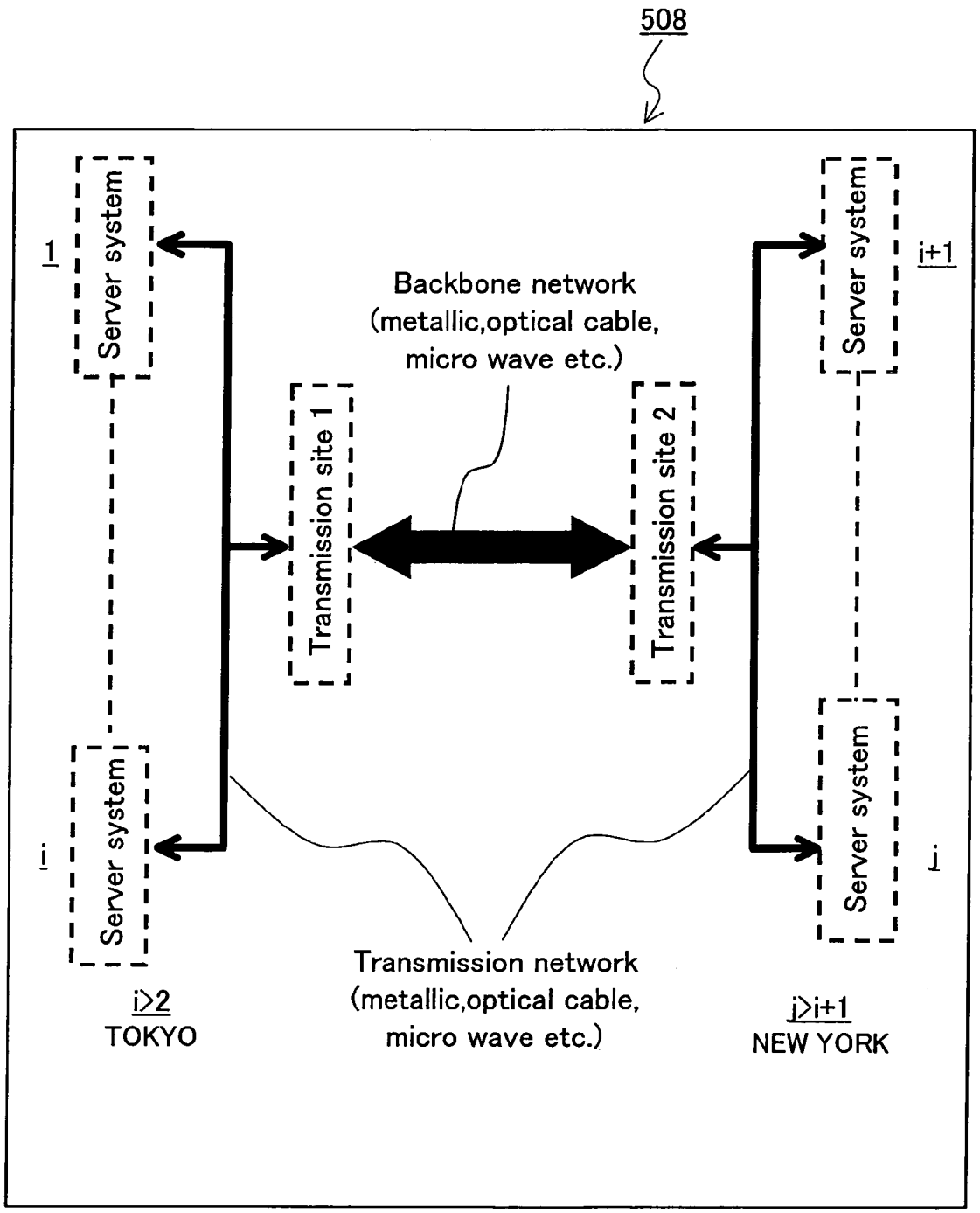
FIG. 45 is a schematic view showing an example of application of a memory of the present invention.

FIG. 45 shows a communications system including a server net including a computer and/or a server system including the memory of the present invention, for example, an internet 508. The communications system can be, for example, a communications system using a dedicated line, which is preferable from a viewpoint of security.

INDUSTRIAL APPLICABILITY

As mentioned above, the present invention can provide a memory cell that is completely different from that of conventional memory in the configuration and is excellent in various characteristics, and also a method for manufacturing the same. By using the memory cell, a memory excellent in various characteristics can be provided.

The memory cell of the present invention can be used in place of a conventional memory cell for a memory such as a SRAM, a DRAM, and Flash Memory. The specific use is not limited particularly, as long as the memory cell is used for a field to which conventional memory cells have been applied.

The invention claimed is:

1. A memory cell, comprising:
    a memory medium for holding information;
    a controlling part for recording information in the memory medium; and
    a detecting element for reading information from the memory medium, wherein
    the memory medium is a magnetic device;
    the controlling part comprises a first magnetic field generating part for applying a magnetic field to the magnetic device so as to change a magnetization state of the magnetic device; and
    the detecting element is provided independently of the memory medium and comprises:
    a second magnetic field generating part to apply an offset magnetic field to the magnetoelectric converting part arranged in the vicinity of the magnetic device, and
    a magnetoelectric converting part wherein electric characteristics vary in accordance with the magnetization state of the magnetic device.

2. The memory cell according to claim 1, wherein
    the magnetoelectric converting part comprises a magnetoelectric converting element whose electric characteristics vary in accordance with a state of a magnetic field to be detected; and
    the magnetoelectric converting element is arranged in the vicinity of the magnetic device so as to detect a magnetic flux generated from the magnetic device.

3. The memory cell according to claim 2, wherein the magnetoelectric converting element is an element whose electric resistance varies in accordance with the state of the magnetic field to be detected.

4. The memory cell according to claim 2, wherein the magnetoelectric converting element is a semiconductor element.

5. The memory cell according to claim 4, wherein the semiconductor element is a transistor.

6. The memory cell according to claim 1, wherein a magnetization direction of the magnetic device has an angle with respect to a face of the magnetic device facing the magnetoelectric converting part.

7. The memory cell according to claim 1, wherein the magnetic device has a magnetic flux component in a direction perpendicular to its face facing the magnetoelectric converting part.

8. The memory cell according to claim 1, wherein the magnetic device comprises at least one magnetic material selected from the group consisting of a ferrimagnetic material, a magnetic material based on rare earth-transition metal, ferrite, and a ferromagnetic material composed of an oxide containing a transition metal.

9. The memory cell according to claim 1, wherein the magnetic device is composed of a magnetic material of a multicomponent system containing a plurality of components different from each other in the coercive three.

10. The memory cell according to claim 1, wherein a temperature at which the saturation magnetization value of the magnetic device is maximized is in a range of 80° C. to 300° C.

11. The memory cell according to claim 1, wherein the magnetic device has Curie temperature of not lower than 100° C.

12. The memory cell according to claim 1, wherein a coercive force of the magnetic device has a tendency to decrease with a temperature rise within a predetermined temperature range.

13. The memory cell according to claim 1, wherein the first magnetic field generating part comprises a wiring that induces a magnetic field.

14. The memory cell according to claim 13, wherein the wiring is coiled.

15. The memory cell according to claim 1, further comprising a stem composed is of a soft magnetic device, the stem being arranged opposite to a side of the magnetoelectric converting part facing the magnetic device.

16. The memory cell according to claim 1, further comprising a shield composed of a soft magnetic device, the shield being arranged so that the magnetic device in interposed between the shield and the magnetoelectric converting part.

17. The memory cell according to claim 1, comprising a plurality of the magnetic devices.

18. The memory cell according to claim 17, wherein
the magnetoelectric converting part comprises a magnetoelectric converting element that varies its electric characteristics in accordance with the state of the magnetic field to be detected, and
the magnetoelectric converting element is arranged in the vicinity of the magnetic devices so as to detect magnetic fluxes generated from the magnetic devices.

19. The memory cell according to claim 18, wherein the magnetoelectric converting element comprises a transistor, and
the plural magnetic devices are arranged corresponding to one channel of the transistor.

20. The memory cell according to claim 19, wherein magnetic properties of the plural magnetic devices corresponding to the one channel vary in accordance with distances from the channel.

21. The memory cell according to claim 18, wherein
the magnetoelectric converting element comprises a transistor,
the transistor comprises a plurality of channels corresponding to the plural magnetic devices, and one gate electrode that is arranged above at least two of the channels and that corresponds to the at least two channels, and
the transistor has electric characteristics that vary due to the electric characteristics of the channel changing in accordance with the state of the magnetic field to be detected.

22. The memory cell according to claim 21, wherein the transistor has one gate electrode arranged above the plural channels.

23. The memory cell according to claim 18, wherein
the magnetoelectric converting element comprises a transistor,
the transistor comprises a plurality of channels corresponding to the plural magnetic devices, and a plurality of gate electrodes arranged above the respective channels so as to correspond to the respective channels, and
the transistor has electric characteristics that vary due to variation in electric characteristics of the channels in accordance with the state of the magnetic field to be detected.

24. The memory cell according to claim 5, wherein the magnetoelectric converting element comprises a plurality of transistors.

25. The memory cell according to claim 24, wherein a drain electrode of one of an adjacent pair of transistors and a source electrode of the other transistor are equipotential.

26. A memory comprising:
the memory cell according to claim 1, an information-recording conductive line for recording information in the memory cell, and
an information-reading conductive line for reading the information.

27. The memory according to claim 26, comprising a plurality of the memory cells, the memory cells being arranged in a matrix.

28. The memory according to claim 27, wherein
the magnetoelectric converting part in each of the memory cells arranged in a matrix comprises a transistor, and
at least one electrode selected from the group consisting of the source electrodes and the drain electrodes in the transistors of the memory cells different from each other are equipotential.

29. A method for manufacturing the memory cell according to claim 2, the method comprising
(i) forming, on a surface of a semiconductor, a magnetoelectric converting element that has electric characteristics varying in accordance with a state of a magnetic field to be detected,
(ii) forming a magnetic device so that the magnetoelectric converting element is interposed between the magnetic device and the semiconductor substrate, and
(iii) forming, in the vicinity of the magnetic device, a magnetic field generating part for changing the magnetization state of the magnetic device;
in the step (ii), the magnetic device is formed in the vicinity of the magnetoelectric converting element so that the magnetoelectric converting element detects a magnetic flux generated from the magnetic device.

30. The method for manufacturing a memory cell according to claim 29, wherein the magnetoelectric converting element is a transistor.

31. The method for manufacturing a memory cell according to claim 29, wherein a plurality of the magnetic devices are formed in the step (ii).

32. A method for recording/reading information in/from the memory according to claim 29, wherein
recording/reading of information is carried out by changing a current applied to at least one conductive line selected from the group consisting of an information-recording conductive line and an information-reading conductive line.

33. The method according to claim 32, the method comprising
changing a current applied to the information-recording conductive line so as to change the magnetic field generated at a first magnetic field generating part, thereby changing a magnetization state of the magnetic device by the changed magnetic field so as to record information in the memory, and
changing a current applied to the information-reading conductive line, thereby detecting electric characteristics of the magnetoelectric converting part so as to read information recorded in the memory.

* * * * *